US010950909B2

(12) United States Patent
Miura et al.

(10) Patent No.: US 10,950,909 B2
(45) Date of Patent: Mar. 16, 2021

(54) DEVICE TEMPERATURE REGULATOR

(71) Applicant: DENSO CORPORATION, Kariya (JP)

(72) Inventors: Koji Miura, Kariya (JP); Takashi Yamanaka, Kariya (JP); Yasumitsu Omi, Kariya (JP); Yoshiki Kato, Kariya (JP); Masayuki Takeuchi, Kariya (JP); Takeshi Yoshinori, Kariya (JP)

(73) Assignee: DENSO CORPORATION, Kariya (JP)

( * ) Notice: Subject to any disclaimer, the term of this patent is extended or adjusted under 35 U.S.C. 154(b) by 143 days.

(21) Appl. No.: 16/285,275

(22) Filed: Feb. 26, 2019

(65) Prior Publication Data
US 2019/0190102 A1 Jun. 20, 2019

Related U.S. Application Data

(63) Continuation of application No. PCT/JP2017/028055, filed on Aug. 2, 2017.

(30) Foreign Application Priority Data

Sep. 9, 2016 (JP) .............................. JP2016-176786

(51) Int. Cl.
*H01M 10/6569* (2014.01)
*H01M 10/625* (2014.01)
(Continued)

(52) U.S. Cl.
CPC ......... *H01M 10/6569* (2015.04); *B60L 58/26* (2019.02); *F28D 15/02* (2013.01);
(Continued)

(58) Field of Classification Search
CPC ......... H01M 10/6569; H01M 10/6556; H01M 10/6552; H01M 10/613; F28D 15/02; F28D 15/06
See application file for complete search history.

(56) References Cited

U.S. PATENT DOCUMENTS

| 2012/0003516 A1* | 1/2012 | Eisenhour ........... H01M 10/617 429/62 |
| 2014/0223925 A1 | 8/2014 | Kawakami et al. |
| 2016/0174417 A1 | 6/2016 | Hachiya et al. |
| 2016/0204488 A1 | 7/2016 | Arai et al. |

(Continued)

FOREIGN PATENT DOCUMENTS

| JP | 2012009646 A | 1/2012 |
| JP | 2013-61099 A | 4/2013 |

(Continued)

OTHER PUBLICATIONS

U.S. Appl. No. 16/330,440, filed Mar. 5, 2019, Yoshinori et al.

*Primary Examiner* — Maria Laios
(74) *Attorney, Agent, or Firm* — Harness, Dickey & Pierce, P.L.C.

(57) ABSTRACT

A device temperature regulator is provided with a gas passage part that guides a gaseous working fluid evaporated in a device heat exchanger to a condenser, and a liquid passage part that guides a liquid working fluid condensed in the condenser to the device heat exchanger. The device temperature regulator is provided with a supply amount regulator that increases or decreases a supply amount of the liquid working fluid supplied to the device heat exchanger. The supply amount regulator decreases the supply amount of the liquid working fluid to the device heat exchanger such that a liquid surface is formed in a state where the gaseous working fluid is positioned at a lower side lower than a heat exchanging portion exchanging heat with a temperature regulation target device in the device heat exchanger, when a condition for keeping the temperature regulation target device at a temperature is satisfied.

17 Claims, 27 Drawing Sheets

(51) Int. Cl.
*H01M 10/633* (2014.01)
*H01M 10/613* (2014.01)
*H01M 10/6556* (2014.01)
*H05K 7/20* (2006.01)
*H01M 10/6552* (2014.01)
*F28D 15/06* (2006.01)
*F28D 15/02* (2006.01)
*B60L 58/26* (2019.01)
*B60K 6/28* (2007.10)

(52) U.S. Cl.
CPC .......... *F28D 15/06* (2013.01); *H01M 10/613* (2015.04); *H01M 10/625* (2015.04); *H01M 10/633* (2015.04); *H01M 10/6552* (2015.04); *H01M 10/6556* (2015.04); *H05K 7/20* (2013.01); *B60K 6/28* (2013.01); *B60Y 2200/91* (2013.01); *B60Y 2200/92* (2013.01); *B60Y 2306/05* (2013.01); *B60Y 2400/112* (2013.01); *H01M 2220/20* (2013.01)

(56) References Cited

U.S. PATENT DOCUMENTS

| | | | |
|---|---|---|---|
| 2019/0184852 | A1 | 6/2019 | Takeuchi et al. |
| 2019/0186843 | A1 | 6/2019 | Takeuchi et al. |
| 2019/0193213 | A1 | 6/2019 | Omi et al. |
| 2019/0198954 | A1 | 6/2019 | Miura et al. |
| 2019/0204014 | A1 | 7/2019 | Yoshinori et al. |

FOREIGN PATENT DOCUMENTS

| | | |
|---|---|---|
| JP | 2015041418 A | 3/2015 |
| WO | WO-2018047528 A1 | 3/2018 |
| WO | WO-2018047529 A1 | 3/2018 |
| WO | WO-2018047530 A1 | 3/2018 |
| WO | WO-2018047532 A1 | 3/2018 |
| WO | WO-2018047533 A1 | 3/2018 |
| WO | WO-2018047534 A1 | 3/2018 |
| WO | WO-2018047535 A1 | 3/2018 |
| WO | WO-2018047536 A1 | 3/2018 |
| WO | WO-2018047537 A1 | 3/2018 |
| WO | WO-2018047538 A1 | 3/2018 |
| WO | WO-2018047539 A1 | 3/2018 |
| WO | WO-2018047540 A1 | 3/2018 |

* cited by examiner

DEVICE TEMPERATURE REGULATOR

CROSS REFERENCE TO RELATED APPLICATIONS

The present application is a continuation application of International Patent Application No. PCT/JP2017/028055 filed on Aug. 2, 2017, which designated the United States and claims the benefit of priority from Japanese Patent Application No. 2016-176786 filed on Sep. 9, 2016. The entire disclosures of all of the above applications are incorporated herein by reference.

TECHNICAL FIELD

The present disclosure relates to a device temperature regulator that can regulate a temperature of at least one temperature regulation target device.

BACKGROUND

In a cooling device of a loop type thermosiphon system, an opening/closing valve is provided in a liquid pipe between an evaporator and a condenser and is opened or closed based on a temperature of air passing through the evaporator.

According to an aspect of the present disclosure, a device temperature regulator includes a device heat exchanger configured to absorb heat from the temperature regulation target device and to evaporate a liquid working fluid, a condenser that is disposed above the device heat exchanger to condense a gaseous working fluid evaporated in the device heat exchanger, a gas passage part configured to guide the gaseous working fluid evaporated in the device heat exchanger to the condenser, a liquid passage part configured to guide the liquid working fluid condensed in the condenser to the device heat exchanger, and a supply amount regulator configured to increase or decrease a supply amount of the liquid working fluid supplied to the device heat exchanger.

The supply amount regulator is configured to decrease the supply amount of the liquid working fluid to the device heat exchanger, such that a liquid surface is formed in a state where the gaseous working fluid is positioned at a lower side lower than a heat exchanging portion exchanging heat with the temperature regulation target device in the device heat exchanger, when a condition for keeping the temperature regulation target device at a temperature is satisfied.

As a result, it can efficiently suppress the temperature regulation target device from being excessively cooled when the condition is satisfied.

DESCRIPTION OF EMBODIMENTS

Figure 1:
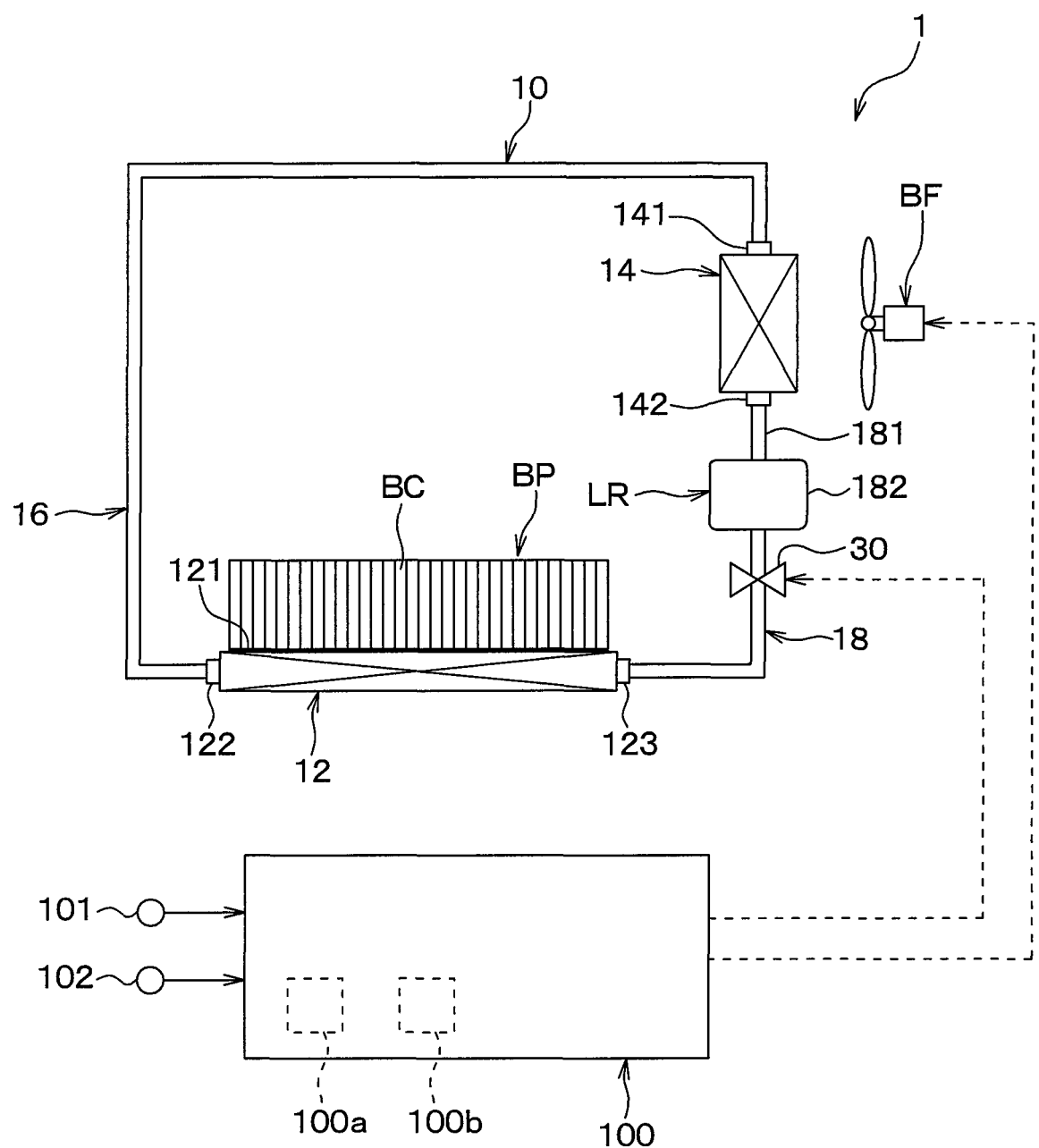
FIG. 1 is a schematic diagram of a device temperature regulator of a first embodiment.

According to detailed studies conducted by the present inventors, in a cooling device of a loop type thermosiphon system in which an opening/closing valve is provided in a liquid pipe between an evaporator and a condenser and is opened or closed according to a temperature of air passing through the evaporator, even if the liquid pipe between the evaporator and the condenser is closed by the opening/closing valve, the temperature regulation target is excessively cooled in some cases. In other words, even if the liquid pipe between the evaporator and the condenser is closed by the opening/closing valve, when the refrigerant is evaporated, a temperature regulation target will be excessively cooled.

In view of the above matters, an object of the present disclosure is to provide a device temperature regulator that can suppress a temperature regulation target device from being excessively cooled when a temperature regulation of the temperature regulation target device becomes unnecessary.

Hereinafter, embodiments of the present disclosure will be described with reference to the drawings. In the respective embodiments below, the same or equivalent parts will be denoted by the same reference characters, and their descriptions will be omitted in some cases. In a case where only a part of constituent elements is described in the embodiment, the constituent elements described in the preceding embodiment can be applied to other parts of the constituent elements. In the following embodiments, the respective embodiments can be combined with each other within a range in which a combination of them does not cause a matter especially, even if the combination of them is not especially clearly described.

First Embodiment

A first embodiment will be described on the basis of FIG. 1 to FIG. 10. The first embodiment will describe an example in which a device temperature regulator 1 of the present disclosure is applied to a device that regulates a battery temperature Tb of a battery pack BP mounted on a vehicle. An electric vehicle, a hybrid vehicle, or the like, which can travel by a travelling electric motor having the battery pack BP as an electric power supply, is assumed as a vehicle mounted with the device temperature regulator 1 shown in FIG. 1.

The battery pack BP is configured of a stack in which a plurality of battery cells BC are stacked, and the battery cell BC is formed in a shape of a rectangular parallelepiped. The plurality of battery cells BC to configure the battery pack BP are electrically connected to each other in series. Each battery cell BC to form the battery pack BP is configured of a secondary battery capable of charging or discharging (for example, a lithium-ion battery, a lead acid battery). A shape of the battery cell BC is not limited to the shape of rectangular parallelepiped but may be another shape such as a cylindrical shape. The battery pack BP may be configured so as to include the battery cells BC electrically connected to each other in parallel.

The battery pack BP is connected to a power converter and a motor generator (not shown in the figure). The power converter is, for example, a device that converts a direct current supplied from the battery pack BP to an alternating current and that supplies (that is, discharges) the converted alternating current to various kinds of electric loads such as the travelling electric motor. Further, the motor generator is a device that, when the vehicle is regenerated, inversely converts a travelling energy of the vehicle to an electric energy and supplies the inversely converted electric energy to the battery pack BP as a regenerative electric power via a power converter or the like.

Figure 2:
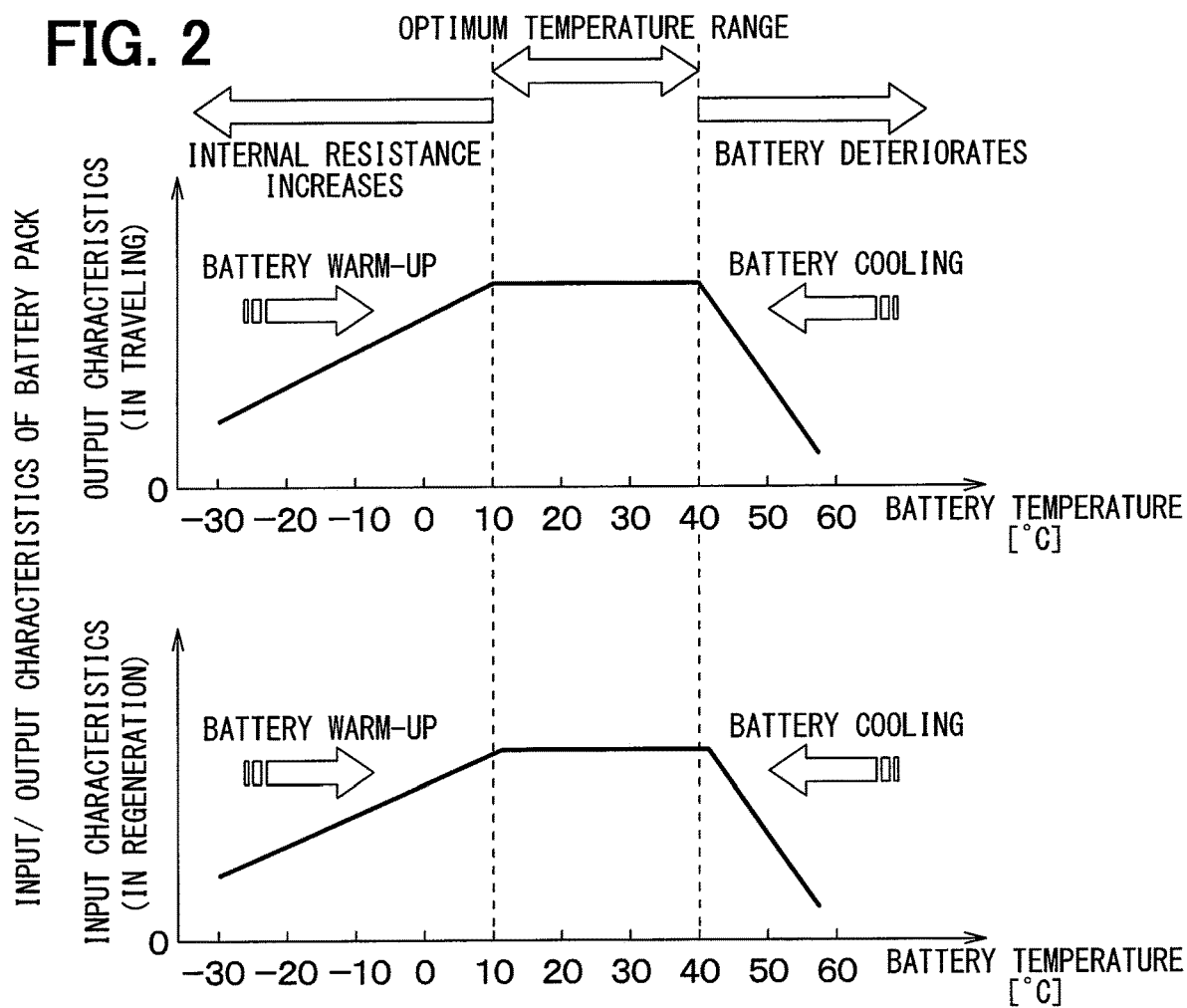
FIG. 2 is a graph to show input/output characteristics of a battery pack.

When the battery pack BP supplies the electric power or the like while the vehicle is travelling, the battery pack BP is self-heated and hence is brought into an excessively high temperature in some cases. When the battery pack BP is brought into the excessively high temperature, as shown in FIG. 2, a deterioration of the battery cells BC is advanced and hence an output and an input need to be limited so as to reduce a degree of self-heating. Thus, a cooling means for keeping the temperature of the battery pack BP at a specified temperature or less is required so as to ensure the output and the input of the battery cells BC.

Further, as to the battery pack BP, also while the vehicle is parking in the summer or the like, the battery temperature Tb of the battery pack BP becomes the excessively high temperature in some cases. In other words, an electrical storage device including the battery pack BP is disposed under a floor of the vehicle or on the lower side of a trunk room in many cases, so not only during the time when the vehicle is travelling but also during the time when the vehicle is parking in the summer, the battery temperature Tb of the battery pack BP is gradually increased and the battery pack BP is brought into an excessively high temperature in some cases. When the battery pack BP is left unattended under a high temperature environment, the deterioration of the battery cells BC is advanced to greatly reduce a battery lifetime. Thus, it is preferred that the battery temperature Tb of the battery pack BP is held at a specified temperature or less even while the vehicle is parking or the like.

Still further, the battery pack BP is configured of the plurality of battery cells BC, and if the respective battery cells BC are varied in their temperatures, the respective battery cells BC cause unevenness in a degree of progress of deterioration, which hence will reduce the input and output characteristics of the whole of the battery pack BP. This is because of the following reasons: that is, the battery pack BP includes a series connection body of the battery cells BC, so that the input and output characteristics of the whole of the battery pack BP are determined according to the battery characteristics of the battery cell BC which has the most advanced degree of progress of deterioration among the battery cells BC. For this reason, so as to cause the battery pack BP to exert a preferred performance for a long time, it is important to reduce variations in the temperatures of the respective battery cells BC, that is, to equalize the temperatures of the respective battery cells BC.

Here, a cooling means of an air-cooling type using a blower and a cooling means using a cold heat of a refrigeration cycle of a vapor compression type are generally used as a cooling means for cooling the battery pack BP.

However, the cooling means of an air-cooling type using a blower only sends air or the like in a vehicle compartment to the battery pack and hence cannot get a cooling capacity capable of sufficiently cooling the battery pack BP in some cases.

Further, the cooling means using a cold heat of a refrigeration cycle of a vapor compression type has a high cooling capacity of the battery pack BP but needs to drive a compressor or the like, which is high in a power consumption, while the vehicle is parking. This is not preferable because of causing an increase in the power consumption and an increase in noises.

Hence, the device temperature regulator 1 of the present embodiment employs a thermosiphon system which regulates the battery temperature of the battery pack BP not by a forced circulation of a refrigerant by a compressor but by a natural circulation of a working fluid.

The device temperature regulator 1 uses the battery pack BP mounted on the vehicle as a temperature regulation target device, and regulates the battery temperature Tb of the battery pack BP. As shown in FIG. 1, the device temperature regulator 1 is provided with a device fluid circuit 10, in which a working fluid circulates, and a control device 100. A refrigerant used in a refrigeration cycle of a vapor compression type (for example, R134a, R1234yf) can be employed as the working fluid circulating in the device fluid circuit 10.

The device fluid circuit 10 is a heat pipe which transfers heat by the evaporation and the condensation of the working fluid and is configured so as to form a thermosiphon of a loop type in which a flow passage in which a gaseous working fluid flows is separated from a flow passage in which a liquid working fluid flows.

Figure 3:
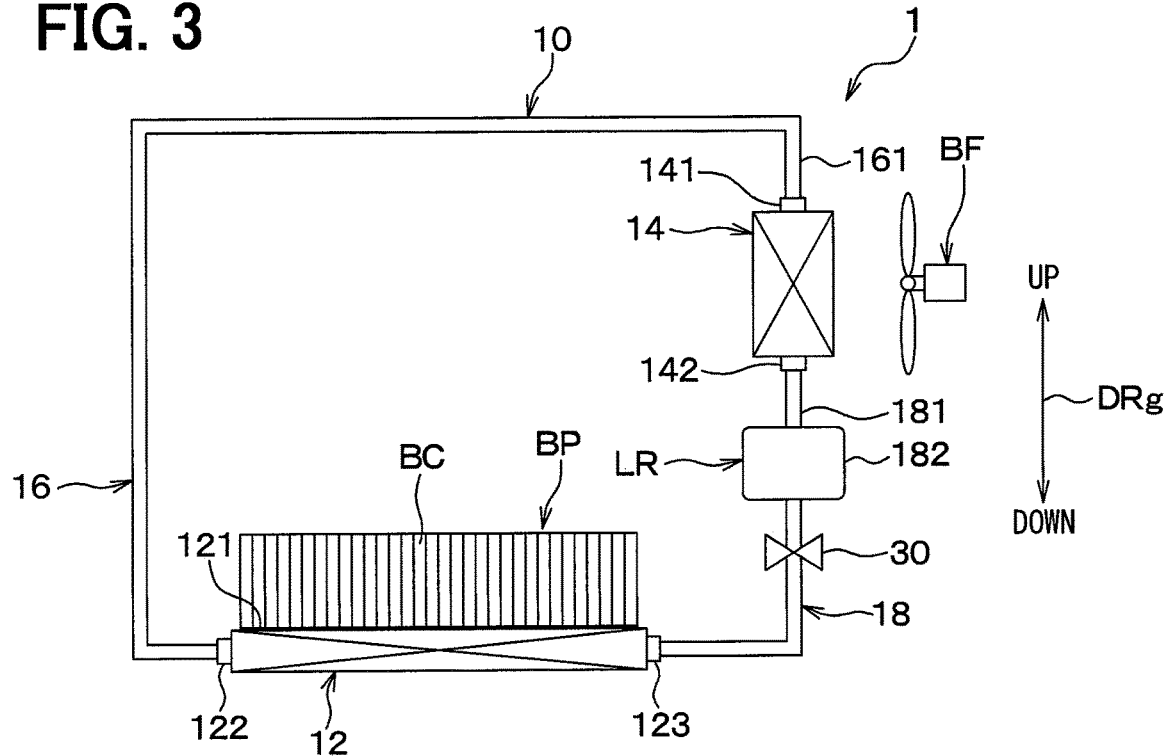
FIG. 3 is a schematic diagram of the device temperature regulator of the first embodiment.

As shown in FIG. 3, the device fluid circuit 10 is configured of a device heat exchanger 12, a condenser 14, a gas passage part 16, and a liquid passage part 18. An arrow DRg shown in FIG. 3 shows a direction in which a vertical line extends, that is, a vertical direction.

The device fluid circuit 10 of the present embodiment has the device heat exchanger 12, the condenser 14, the gas passage part 16, and the liquid passage part 18 connected to each other, thereby being configured as a fluid circuit shaped like a closed ring. The device fluid circuit 10 is filled with a specified amount of working fluid with its interior evacuated.

The device heat exchanger 12 is a heat exchanger which functions as an evaporator to absorb heat from the battery pack BP to thereby evaporate the liquid working fluid at the time of cooling the battery pack BP of the temperature regulation target device. The device heat exchanger 12 is arranged at a position opposite to a bottom surface portion side of the battery pack BP. The device heat exchanger 12 has a shape of a thin and flat rectangular parallelepiped.

In the device heat exchanger 12, a device proximity part 121 proximate to a bottom surface portion of the battery pack BP configures a heat transfer part to transfer heat between the battery pack BP and the device heat exchanger 12. In the present embodiment, the device proximity part 121 configures a part to exchange heat with the battery pack BP in the device heat exchanger 12. The device proximity part 121 has a size to cover the whole of the bottom surface portion of the battery pack BP so as to prevent a temperature distribution from being caused in the respective battery cells BC to configure the battery pack BP.

In the device heat exchanger 12, the device proximity part 121 is in contact with the bottom surface portion of the battery pack BP so as to be able to transfer heat between the device heat exchanger 12 and the battery pack BP. In the device heat exchanger 12, the device proximity part 121 may be configured so as to be arranged separately from the bottom surface portion of the battery pack BP if the device proximity part 121 can transfer heat between the device heat exchanger 12 and the battery pack BP.

In a case where a liquid surface of the working fluid in the device heat exchanger 12 is separate from the device proximity part 121 of the device heat exchanger 12, the heat of the battery pack BP is not easily transferred to the liquid working fluid in the device heat exchanger 12. In other words, in the case where the liquid surface of the working fluid in the device heat exchanger 12 is separate from the device proximity part 121 of the device heat exchanger 12, the liquid working fluid collecting in the device heat exchanger 12 is suppressed from evaporating.

For this reason, the device fluid circuit 10 of the present embodiment is configured such that the liquid surface of the working fluid is in contact with the device proximity part 121 so as to transfer the heat of the battery pack BP to the liquid working fluid collecting in the device heat exchanger 12. In other words, the device fluid circuit 10 of the present embodiment is configured such that an internal space of the device heat exchanger 12 is filled with the liquid working fluid to contain bubbles at the time of cooling the battery pack BP.

Figure 4:
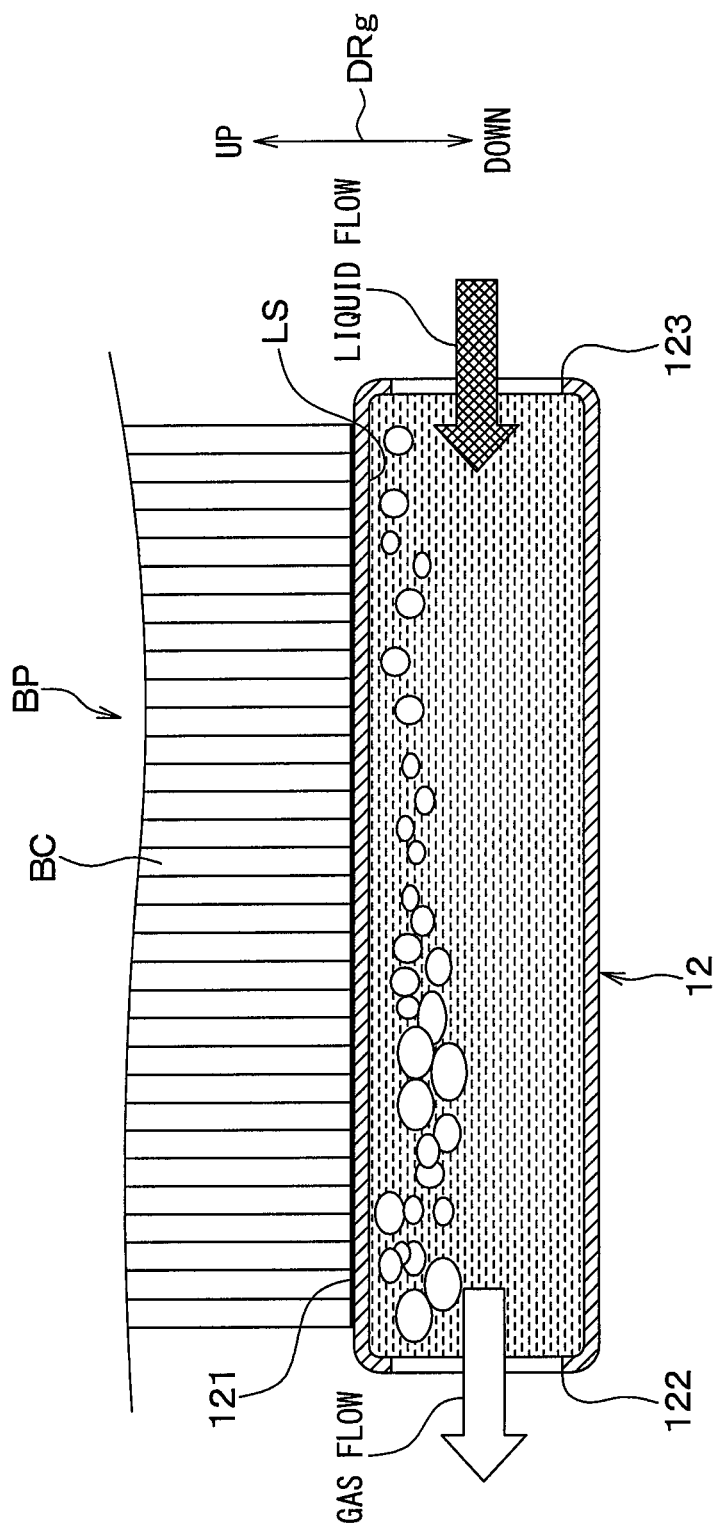
FIG. 4 is a schematic diagram to show an interior of a device heat exchanger of the device temperature regulator of the first embodiment.
Figure 5:
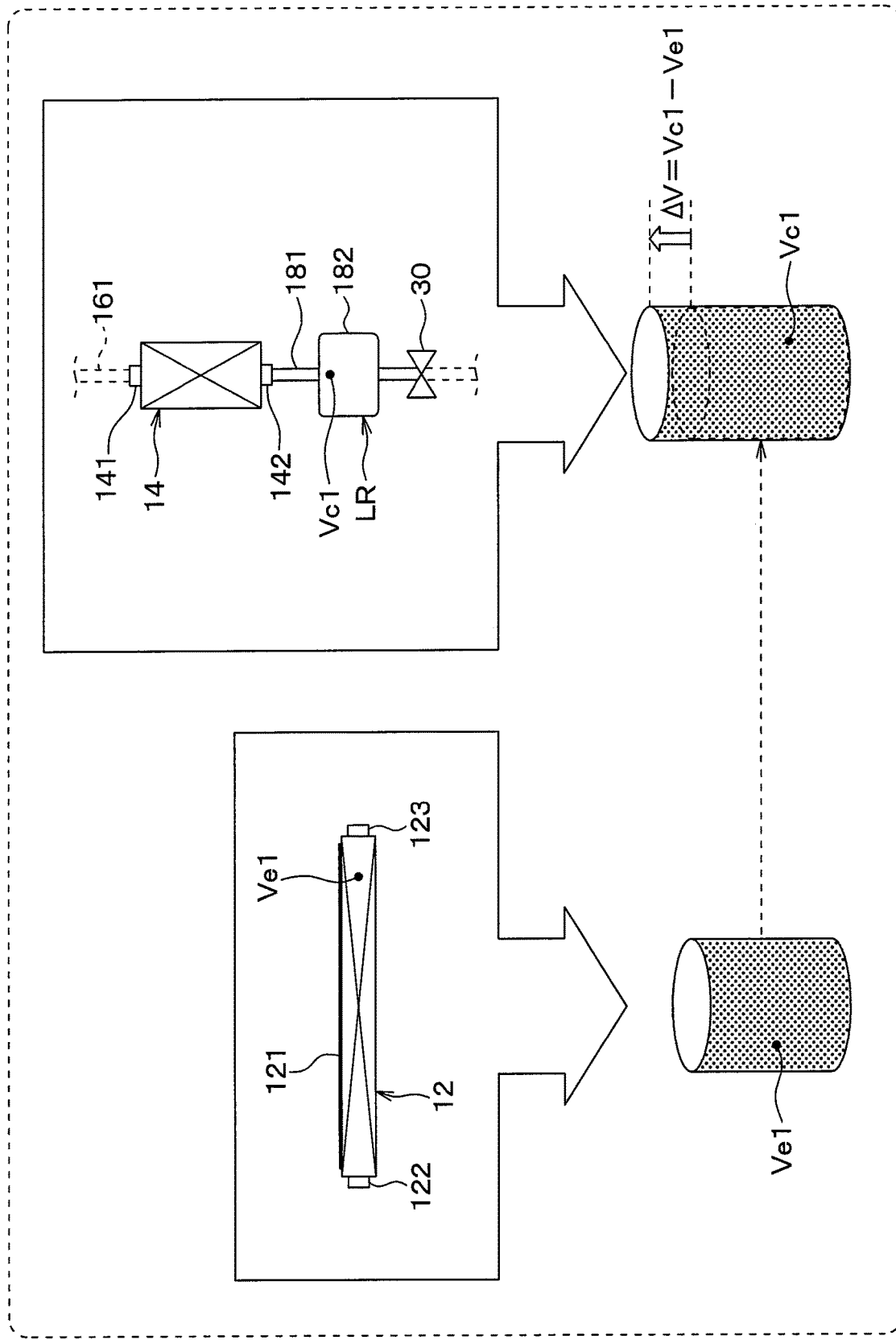
FIG. 5 is an illustration to illustrate an internal volume of a liquid reservoir of the first embodiment.

For example, as shown in FIG. 4, in a case where the device heat exchanger 12 is configured of a hollow container, a liquid surface LS of the working fluid collecting in the device heat exchanger 12 is proximate to the device proximity part 121 at the time of cooling the battery pack BP. The device heat exchanger 12 is not limited to the hollow container but may be configured so as to have a plurality of flow passages formed by heat exchange tubes or the like.

Returning to FIG. 3, the device heat exchanger 12 includes a gas outlet part 122, to which an end portion on a lower side of the gas passage part 16 is connected, and a liquid inlet part 123, to which an end portion on a lower side of the liquid passage part 18 is connected. The device heat exchanger 12 of the present embodiment has the gas outlet part 122 and the liquid inlet part 123 provided on its side parts opposite to each other. Further, the device heat exchanger 12 of the present embodiment has the gas outlet part 122 and the liquid inlet part 123 provided at positions of the same level in the vertical direction DRg.

The device heat exchanger 12 is configured of metal or alloy having an excellent thermal conductivity such as aluminum and copper. The device heat exchanger 12 can be configured of a material other than the metal but at least the device proximity part 121 to configure a heat transfer part is preferred to be configured of a material having an excellent thermal conductivity.

The condenser 14 is a heat exchanger which condenses the gaseous working fluid evaporated in the device heat exchanger 12. The condenser 14 is configured of an air-cooling type heat exchanger which exchanges heat between the air sent from the blower fan BF and the gaseous working fluid to thereby condense the gaseous working fluid.

The condenser 14 is arranged on an upper side of the device heat exchanger 12 in the vertical direction DRg such that the liquid working fluid condensed in the condenser 14 moves to the device heat exchanger 12 by its own weight.

The condenser 14 includes a gas inlet part 141, to which an end portion on an upper side of the gas passage part 16 is connected, and a liquid outlet part 142, to which an end portion on an upper side of the liquid passage part 18 is connected. In the condenser 14 of the present embodiment, the gas inlet part 141 and the liquid outlet part 142 are provided on portions opposed to the each other in the vertical direction DRg.

Further, in the condenser 14 of the present embodiment, the gas inlet part 141 is arranged on an upper side of the liquid outlet part 142 in the vertical direction DRg. Specifically, in the condenser 14 of the present embodiment, the gas inlet part 141 is provided on an upper end part in the condenser 14 and the liquid outlet part 142 is provided on a lower end part in the condenser 14.

The condenser 14 is configured of metal or alloy having an excellent thermal conductivity such as aluminum and copper. The condenser 14 may be configured so as to include a material other than the metal, but at least a portion to exchange heat with air is preferred to be configured of a material having an excellent thermal conductivity.

The blower fan BF is a device to blow off air inside the vehicle compartment or air outside the vehicle compartment toward the device heat exchanger 12. The blower fan BF functions as a heat radiation amount regulator for regulating a heat radiation amount of the working fluid collecting in the condenser 14. The blower fan BF is configured of an electric fan operated when energized. The blower fan is connected to the control device 100 and has its blowing capacity controlled on the basis of a control signal from the control device 100.

The gas passage part 16 guides the gaseous working fluid evaporated in the device heat exchanger 12 to the condenser 14. The gas passage part 16 has its lower end portion connected to the gas outlet part 122 of the device heat exchanger 12 and has its upper end portion connected to the gas inlet part 141 of the condenser 14. The gas passage part 16 of the present embodiment is configured of a pipe having a flow passage formed therein, the flow passage causing the working fluid to flow in itself.

The gas passage part 16 of the present embodiment is configured so as to include an upper gas passage part 161 extending upward from the gas inlet part 141 of the condenser 14. In other words, the gas passage part 16 of the present embodiment is configured so as to include a passage part in which a portion on the condenser 14 side extends toward the gas inlet part 141 of the condenser 14.

The upper gas passage part 161 of the present embodiment extends upward along the vertical direction DRg. The gas passage part 16 shown in the figure is only one example. The gas passage part 16 can be changed as appropriate in consideration of an ease of mounting on the vehicle.

The liquid passage part 18 guides the liquid working fluid condensed in the condenser 14 to the device heat exchanger 12. The liquid passage part 18 has its lower end portion connected to the liquid inlet part 123 of the device heat exchanger 12 and has its upper end portion connected to the liquid outlet part 142 of the condenser 14. The liquid passage part 18 of the present embodiment is configured of a pipe having a flow passage formed therein, the flow passage causing the working fluid to flow in itself.

In the liquid passage part 18 of the present embodiment, a portion on the condenser 14 side is located above a portion on the device heat exchanger 12 side. Further, the liquid passage part 18 of the present embodiment is configured such that a portion on the device heat exchanger 12 side is located at the same level or on an upper side of a portion on a lowermost side of the device heat exchanger 12. The liquid passage part 18 shown in the figure is only one example. The liquid passage part 18 can be changed as appropriate in consideration of an ease of mounting on the vehicle.

In the device temperature regulator 1 of the thermosiphon system, when the temperature of the working fluid collecting on the condenser 14 side is higher than the battery temperature Tb of the battery pack BP, the working fluid in the condenser 14 is hardly condensed and the working fluid in the device heat exchanger 12 is hardly evaporated. In other words, in the device temperature regulator 1, in a case where the temperature of the working fluid on the condenser 14 side in the device fluid circuit 10 is higher than the battery temperature Tb of the battery pack BP, the cooling of the battery pack BP is substantially stopped.

On the other hand, in the device temperature regulator 1 of the thermosiphon system, when the temperature of the working fluid collecting on the condenser 14 side is lower than the battery temperature Tb of the battery pack BP, the working fluid is evaporated in the device heat exchanger 12 and the working fluid is condensed in the condenser 14. In other words, in the device temperature regulator 1, in a case where the temperature of the working fluid on the condenser 14 side in the device fluid circuit 10 is lower than the battery temperature Tb of the battery pack BP, the cooling of the battery pack BP is continued even if the battery temperature Tb of the battery pack BP is within an optimum temperature range.

For this reason, in the device temperature regulator 1 of the thermosiphon system, in a case where the temperature of the working fluid in the condenser 14 is lower than the battery temperature Tb of the battery pack BP, the battery temperature Tb of the battery pack BP is decreased to a level equal to or lower than the optimum temperature range in some cases.

As shown in FIG. 2, when the battery temperature Tb of the battery pack BP is decreased excessively, an internal resistance of the battery pack BP is increased to thereby reduce the input/output characteristics of the battery pack BP. For this reason, it is necessary to take measures to prevent the battery pack BP from being excessively cooled.

The present inventors earnestly studied a cause of excessively cooling the battery pack BP. As a result, the present inventors found that in a case where the battery temperature Tb of the battery pack BP becomes equal to or lower than the optimum temperature range, the excessive cooling of the battery pack BP is caused by the fact that the liquid working fluid is evaporated in the device proximity part 121 of the device heat exchanger 12.

The present inventors considered that the battery pack BP could be suppressed from being excessively cooled by suppressing the liquid working fluid in the device proximity part 121 of the device heat exchanger 12 from being evaporated and invented a configuration capable of regulating the working fluid of the device heat exchanger 12 to an amount of liquid so as to suppress the battery pack BP from being excessively cooled.

As shown in FIG. 1 and FIG. 3, in the device temperature regulator 1, the liquid passage part 18 is provided with a liquid passage opening/closing valve 30 to open/close the liquid passage part 18 so as to regulate an amount of liquid of the working fluid of the device heat exchanger 12. The liquid passage opening/closing valve 30 is configured of an electric valve mechanism controlled by the control device 100. Specifically, the liquid passage opening/closing valve 30 of the present embodiment is configured of an electromagnetic valve of a normal open type which is closed when energized and which is opened when not energized.

When the liquid passage part 18 is opened by the liquid passage opening/closing valve 30, the device heat exchanger 12 is supplied with the liquid working fluid condensed in the condenser 14. Further, when the liquid passage part 18 is closed by the liquid passage opening/closing valve 30, the device heat exchanger 12 is stopped being supplied with the liquid working fluid condensed in the condenser 14.

For this reason, the liquid passage opening/closing valve 30 functions as a supply amount regulator for increasing or decreasing a supply amount of the liquid working fluid to the device heat exchanger 12. Then, the liquid passage opening/closing valve 30 is configured so as to decrease the supply amount of the liquid working fluid to the device heat exchanger 12 such that when a condition for eliminating the need for a temperature regulation of the battery pack BP is satisfied, the liquid surface of the working fluid in the device heat exchanger 12 is located on a lower side of the device proximity part 121. In short, when a condition for keeping the temperature of the battery pack BP warm is satisfied, the liquid passage opening/closing valve 30 decreases the supply amount of the working fluid to the device heat exchanger 12 such that the liquid surface is formed in a state where the gaseous working fluid is located on a lower side of a portion to exchange heat with the battery pack BP of the device heat exchanger 12. The condition for keeping the temperature of the battery pack BP warm is also a condition satisfied when the need for the temperature regulation of the battery pack BP is eliminated.

Specifically, the liquid passage opening/closing valve 30 of the present embodiment closes the liquid passage part 18 such that when the condition for eliminating the need for the temperature regulation of the battery pack BP is satisfied, a part of a portion located on an upper side of the liquid passage opening/closing valve 30 in the device fluid circuit 10 functions as a liquid reservoir LR. The liquid reservoir LR stores the liquid working fluid.

The liquid passage part 18 of the present embodiment is configured so as to include a middle liquid passage part 181 located between the condenser 14 and the liquid passage opening/closing valve 30. The middle liquid passage part 181 is configured such that a portion close to the condenser 14 is located on an upper side of a portion close to the liquid passage opening/closing valve 30 so as to be able to store the liquid working fluid when the condition for eliminating the need for the temperature regulation of the battery pack BP (in other words, the condition for keeping the battery pack BP warm) is satisfied. In other words, the middle liquid passage part 181 of the present embodiment is configured such that a portion connected to the condenser 14 is located on an upper side of a portion connected to the liquid passage opening/closing valve 30.

The middle liquid passage part 181 of the present embodiment has an expansion part 182 provided on an upper side of the liquid passage opening/closing valve 30, the expansion part 182 having a passage cross-sectional area expanded as compared with a portion on a lower side of the liquid passage opening/closing valve 30. The expansion part 182 functions as the liquid reservoir LR for storing the liquid working fluid when the condition for eliminating the need for the temperature regulation of the battery pack BP (in other words, the condition for keeping the battery pack BP warm) is satisfied and when the liquid passage part 18 is closed by the liquid passage opening/closing valve 30.

The expansion part 182 is configured of a portion in which the pipe configuring the liquid passage part 18 is expanded. The expansion part 182 is not limited to the portion in which the pipe configuring the liquid passage part 18 is expanded but may be configured of, for example, a tank part separate from the pipe configuring the liquid passage part 18.

Here, the condenser 14 of the present embodiment has the gas inlet part 141 arranged on an upper side of the liquid outlet part 142 so as to be able to store the liquid working fluid when the condition for eliminating the need for the temperature regulation of the battery pack BP (in other words, the condition for keeping the battery pack BP warm) is satisfied. In other words, the condenser 14 of the present embodiment is arranged on the upper side of the liquid passage opening/closing valve 30 and the gas inlet part 141 is arranged on the upper side of the liquid outlet part 142. For this reason, when the condition for eliminating the need for the temperature regulation of the battery pack BP is satisfied and when the liquid passage part 18 is closed by the liquid passage opening/closing valve 30, the condenser 14 functions as the liquid reservoir LR for storing the liquid working fluid.

In the device fluid circuit 10 of the present embodiment, when the liquid passage part 18 is closed by the liquid passage opening/closing valve 30, an internal space of the condenser 14 and an internal space of the middle liquid passage part 181 including the expansion part 182 function as the liquid reservoir LR for storing the liquid working fluid.

The liquid reservoir LR has a volume which prevents the liquid working fluid from overflowing when the condition for eliminating the need for the temperature regulation of the battery pack BP (in other words, the condition for keeping the battery pack BP warm) is satisfied and when the liquid surface of the working fluid in the device heat exchanger 12 goes down to the lower side of the device proximity part 121.

The liquid reservoir LR of the present embodiment has a volume which prevents the liquid working fluid from overflowing even when the liquid surface of the working fluid in the device heat exchanger 12 goes down to a position proximate to a wall surface on the lower side. Specifically, the liquid reservoir LR has a volume whose internal volume is a volume capable of storing the liquid working fluid collecting in the device heat exchanger 12. In other words, the liquid reservoir LR of the present embodiment has its internal volume Vc1 made larger than an internal volume Ve1 of the device heat exchanger 12 so as to be able to store the liquid working fluid collecting in the device heat exchanger 12.

Figure 6:
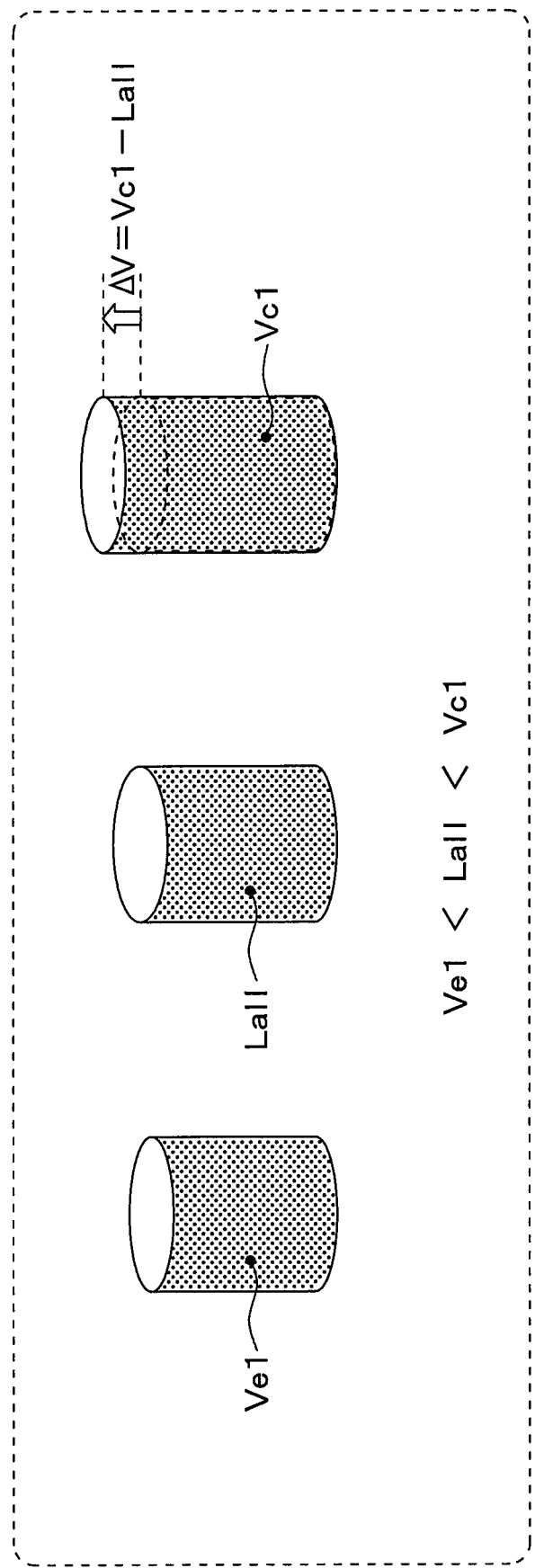
FIG. 6 is a diagram to illustrate the internal volume of the liquid reservoir of the first embodiment.

Here, in a configuration in which the total amount of the liquid working fluid collecting in the device fluid circuit 10 can be stored in the liquid reservoir LR, it is possible to reliably stop cooling the battery pack BP in the device heat exchanger 12. For this reason, as shown in FIG. 6, the internal volume Vc1 of the liquid reservoir LR is preferred to be a volume capable of storing an amount of liquid when the working fluid filled in the device fluid circuit 10 is liquefied (that is, a total liquid amount Lall).

Subsequently, the control device 100 to configure an electronic controller of the device temperature regulator 1 will be described with reference to FIG. 1. The control device 100 shown in FIG. 1 is configured of a microcomputer including a processor and a storage part (for example, a ROM, a RAM) and its peripheral circuit. The storage part of the control device 100 is configured of a non-transitive substantial storage medium.

The control device 100 performs various operations and processing on the basis of a control program stored in the storage part. The control device 100 controls operations of various kinds of devices such as the blower fan BF connected to an output side and the liquid passage opening/closing valve 30.

The control device 100 has a group of various sensors, which include a battery temperature detection part 101 and a condenser temperature detection part 102, connected to its input side.

The battery temperature detection part 101 is configured of a temperature sensor for detecting the battery temperature Tb of the battery pack BP. The battery temperature detection part 101 may be configured of a plurality of temperature sensors. In this case, the battery temperature detection part 101 may be configured so as to output an average value of the detected values of the plurality of temperature sensors to the control device 100.

The condenser temperature detection part 102 is configured of a temperature sensor for detecting a temperature of the working fluid collecting in the condenser 14. The condenser temperature detection part 102 is not necessarily configured so as to directly detect the temperature of the working fluid collecting in the condenser 14 but may be configured so as to detect a surface temperature of the condenser 14 as the temperature of the working fluid collecting in the condenser 14.

Here, the control device 100 of the present embodiment is a device in which a plurality of control parts, which are configured of hardware and software to control various kinds of devices connected to the output side thereof, are integrated. The control device 100 of the present embodiment has a fan control part 100a and a valve controller 100b integrated thereinto, the fan controller 100a controlling the number of revolutions of the blower fan BF, the valve controller 100b controlling an opening/closing state of the liquid passage opening/closing valve 30. In the present embodiment, the fan controller 100a and the valve controller 100b in the control device 100 configure a controller which controls the supply amount regulator and the heat radiation amount regulator.

Figure 7:
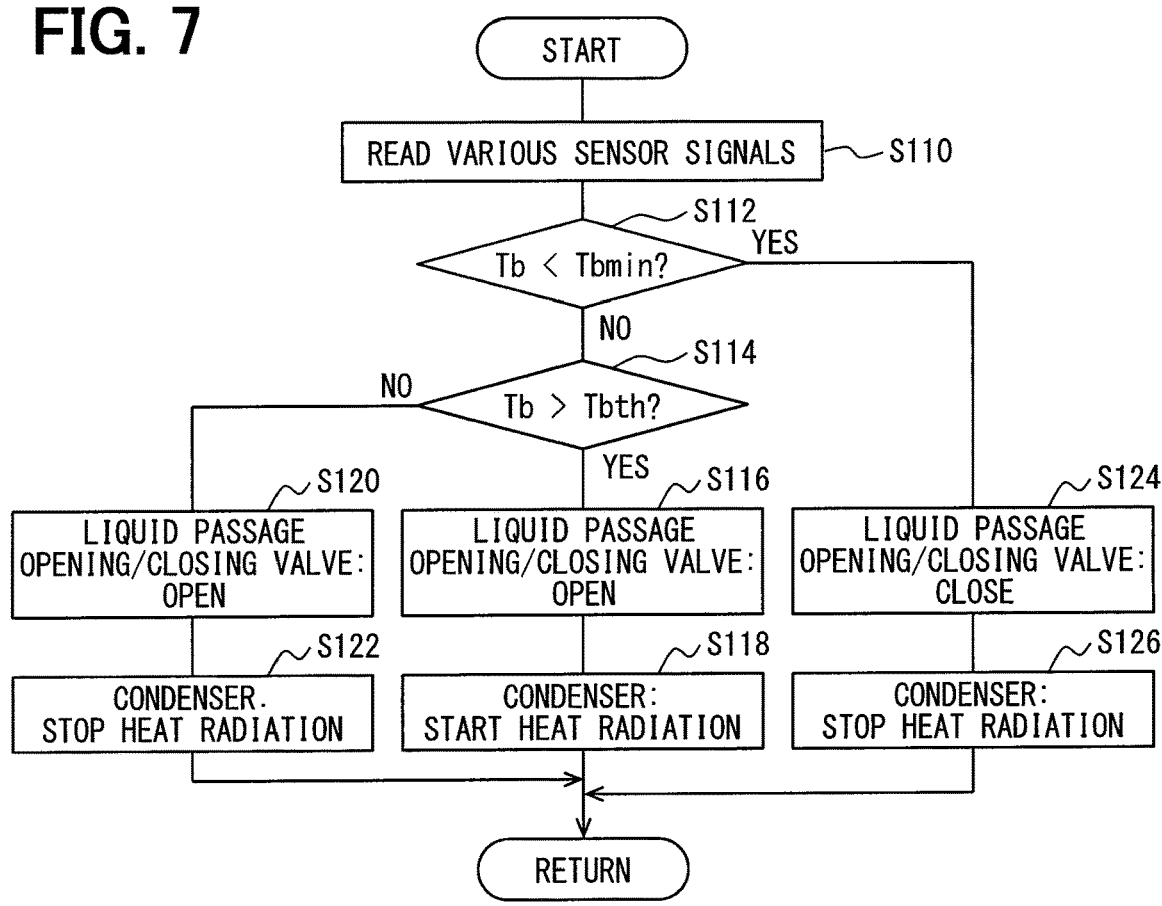
FIG. 7 is a flow chart to show a flow of control processing performed by a control device of the device temperature regulator of the first embodiment.

Next, an operation of the device temperature regulator 1 of the present embodiment will be described with reference to a flow chart shown in FIG. 7. Control processing shown in FIG. 7 is performed at a specified cycle by the control device 100 while the vehicle is travelling. Needless to say, the device temperature regulator 1 may be configured such that the control processing shown in FIG. 7 is performed by the control device 100 while the vehicle is parking. Each control step shown in FIG. 7 configures a function realization part which realizes each of various functions performed by the control device 100.

As shown in FIG. 7, the control device 100 reads various sensor signals first in step S110. Specifically, in the processing of step S110, the control device 100 reads the battery temperature Tb of the battery pack BP detected by the battery temperature detection part 101 and the temperature of the working fluid collecting in the condenser 14 detected by the condenser temperature detection part 102.

Subsequently, the control device 100 determines whether or not the condition for eliminating the need for the temperature regulation (specifically, cooling) of the battery pack BP (in other words, the condition for keeping the battery pack BP warm) is satisfied. In the present embodiment, a condition which is satisfied when the battery temperature Tb of the battery pack BP is lower than a previously-set allowable lower limit temperature Tbmin of the battery pack BP is employed as the condition for eliminating the need for the temperature regulation of the battery pack BP (in other words, the condition for keeping the battery pack BP warm). In other words, the control device 100 determines in step S112 whether or not the battery temperature Tb of the battery pack BP is lower than the previously-set allowable lower limit temperature Tbmin of the battery pack BP. The allowable lower limit temperature Tbmin is set to, for example, a temperature (for example, 10° C.) at which the input/output characteristics of the battery pack BP are not easily impaired even if the battery temperature Tb of the battery pack BP is decreased.

In a case where it is determined from a result of determination processing in step S112 that the battery temperature Tb of the battery pack BP is the allowable lower limit temperature Tbmin or more, the control device 100 determines in step S114 whether or not the battery temperature Tb of the battery pack BP is higher than a previously-set cooling necessary temperature Tbth. The cooling necessary temperature Tbth is set a temperature (for example, 40° C.) at which the input/output characteristics of the battery pack BP are not easily impaired even if the battery temperature Tb of the battery pack BP is increased.

In a case where it is determined from a result of the determination processing in step S114 that the battery temperature Tb of the battery pack BP is higher than the cooling necessary temperature Tbth, the device temperature regulator 1 proceeds to a cooling mode for cooling the battery pack BP. In other words, in a case where it is determined from a result of the determination processing in step S114 that the battery temperature Tb of the battery pack BP is higher than the cooling necessary temperature Tbth, the control device 100 controls the liquid passage opening/closing valve 30 to an open state in step S116. Further, the control device 100 drives the blower fan in step S118 to thereby start radiating the heat of the working fluid collecting in the condenser 14.

In the device temperature regulator 1, at the time of the cooling mode, when the battery temperature Tb of the battery pack BP is increased by the self-heating or the like when the vehicle travels, the heat of the battery pack BP is transferred to the device heat exchanger 12. In the device heat exchanger 12, heat is absorbed from the battery pack BP and hence a portion of the liquid working fluid is evaporated. The battery pack BP is cooled by a latent heat of evaporation of the working fluid collecting in the device heat exchanger 12 and hence has its temperature decreased.

Figure 8:
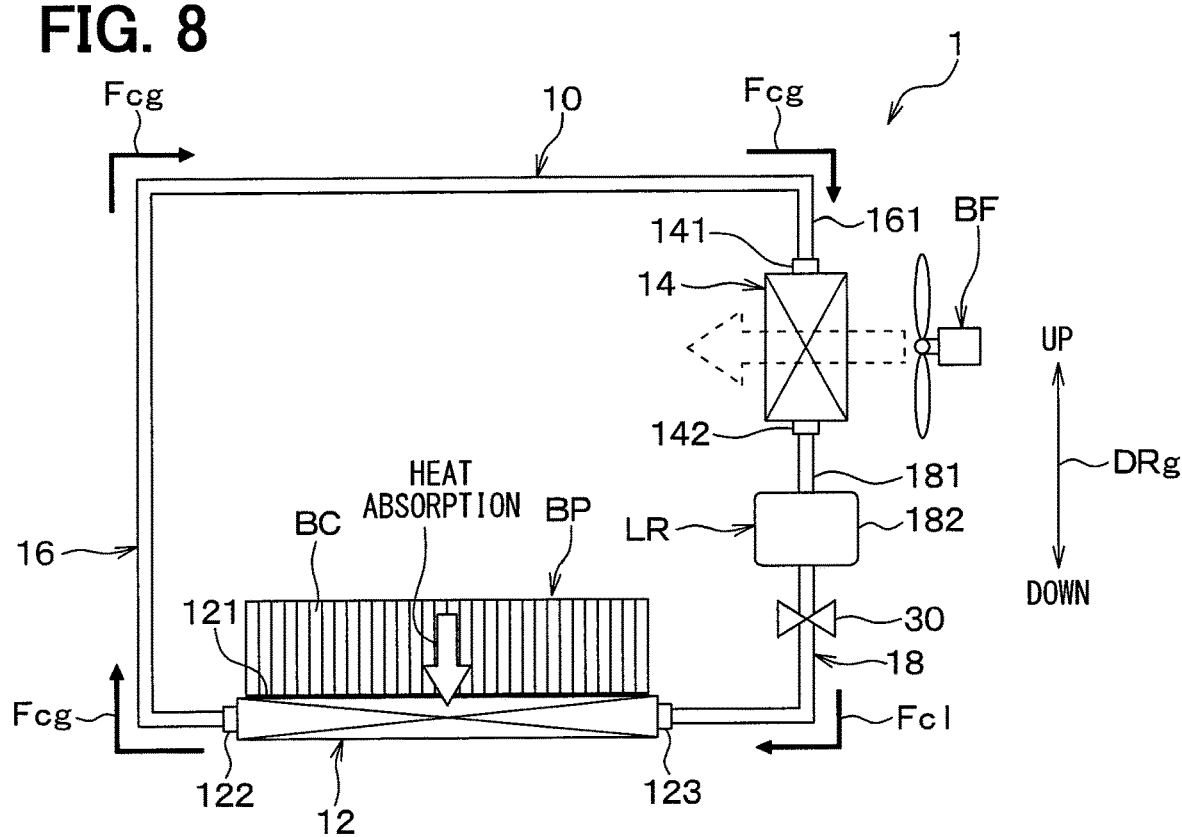
FIG. 8 is a diagram to illustrate an operation at the time of a cooling mode of the device temperature regulator of the first embodiment.

The gaseous working fluid evaporated in the device heat exchanger 12 flows out to the gas passage part 16 from the gas outlet part 122 of the device heat exchanger 12 and moves to the condenser 14 via the gas passage part 16, as shown by an arrow Fcg in FIG. 8.

In the condenser 14, the gaseous working fluid radiates heat to the blown air from the blower fan BF, thereby being condensed. In the condenser 14, the gaseous working fluid is liquefied and hence a specific gravity of the working fluid is increased. In this way, the working fluid liquefied in the condenser 14 is moved down toward the liquid outlet part 142 of the condenser 14 by its own weight.

The liquid working fluid condensed in the condenser 14 flows out to the liquid passage part 18 from the liquid outlet part 142 of the condenser 14 and moves to the device heat exchanger 12 via the liquid passage part 18 as shown by an arrow Fcl in FIG. 8. Then, in the device heat exchanger 12, a portion of the liquid working fluid flowing into the device heat exchanger 12 from the liquid inlet part 123 via the liquid passage part 18 absorbs heat from the battery pack BP, thereby being evaporated.

In this way, in the device temperature regulator 1, at the time of the cooling mode, the working fluid is circulated between the device heat exchanger 12 and the condenser 14 while changing its phase into a gas state and a liquid state and the heat is transported to the condenser 14 from the device heat exchanger 12, and thereby the battery pack BP is cooled.

The device temperature regulator 1 is configured such that the working fluid is naturally circulated in the device fluid circuit 10 even if there is not a driving force required for circulating the working fluid by a compressor or the like. For this reason, the device temperature regulator 1 can realize the temperature regulation of the battery pack BP, which depresses both of a power consumption and noises and is efficient as compared with a refrigeration cycle or the like.

Returning to FIG. 7, in a case where it is determined from the result of the determination processing in step S114 that the battery temperature Tb of the battery pack BP is the cooling necessary temperature Tbth or lower, the device temperature regulator 1 stops the heat radiation of the working fluid in the condenser 14.

Specifically, in a case where it is determined from the result of the determination processing in step S114 that the battery temperature Tb of the battery pack BP is the cooling necessary temperature Tbth or lower, the control device 100 controls the liquid passage opening/closing valve 30 to the open state in step S120. Further, the control device 100 stops the operation of the blower fan BF in step S122 to thereby stop the heat radiation of the working fluid collecting in the condenser 14.

In the device temperature regulator 1, even if the operation of the blower fan BF is stopped, in a case where the temperature of the working fluid collecting in the condenser 14 is higher than the battery temperature Tb of the battery pack BP, the heat is transferred to the condenser 14 from the device heat exchanger 12, and thereby the battery pack BP is cooled. In other words, in the device temperature regulator 1, if the temperature of the working fluid collecting in the condenser 14 is higher than the battery temperature Tb of the battery pack BP, as is the case with the cooling mode, the battery pack BP is held cooled.

For this reason, in a case where the surrounds of the condenser 14 becomes a low temperature in the winter or the like and hence the temperature of the condenser 14 becomes the low temperature, the battery pack BP is held cooled by the device temperature regulator 1, so that the temperature Tb of the battery pack BP may become lower than the allowable lower limit temperature Tbmin.

In contrast to this, if the battery temperature Tb of the battery pack BP becomes lower than the allowable lower limit temperature Tbmin, the device temperature regulator 1 of the present embodiment is shifted to an excessive cooling prevention mode so as to prevent the battery pack BP from being excessively cooled. In other words, in a case where it is determined from a result of the determination processing in step S112 that the battery temperature Tb of the battery pack BP is lower than the allowable lower limit temperature Tbmin, the control device 100 closes the liquid passage part 18 by the liquid passage opening/closing valve 30 in step S124. Further, the control device 100 stops an operation of the blower fan BF in step S126 to thereby stop the heat radiation of the working fluid collecting in the condenser 14.

In the device temperature regulator 1 of the present embodiment, at the time of the excessive cooling prevention mode, the liquid passage part 18 is closed by the liquid passage opening/closing valve 30. In other words, in the device temperature regulator 1 of the present embodiment, at the time of the excessive cooling prevention mode, a supply of the liquid working fluid to the device heat exchanger 12 is stopped.

In the device temperature regulator 1 of the present embodiment, even if the supply of the liquid working fluid to the device heat exchanger 12 is stopped, if the temperature of the working fluid collecting in the condenser 14 is higher than the battery temperature Tb of the battery pack BP, the gaseous working fluid is condensed in the condenser 14.

Figure 9:
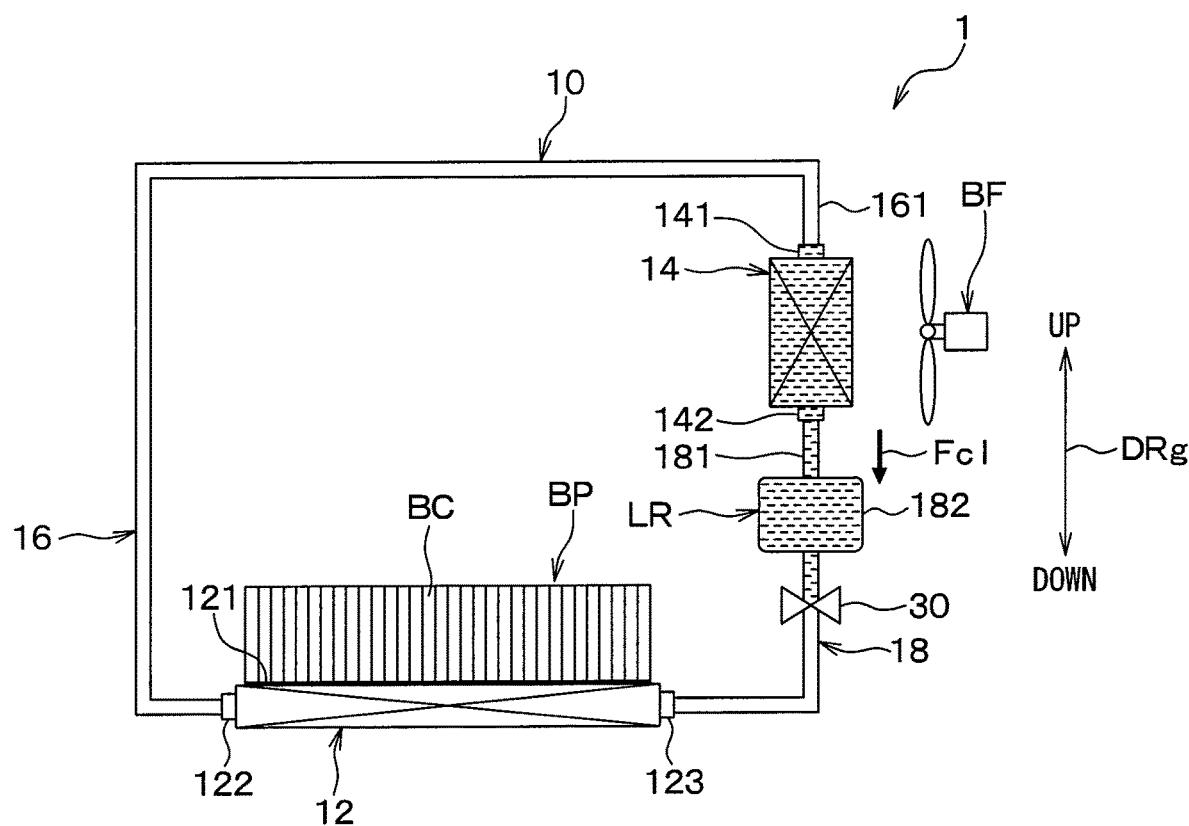
FIG. 9 is a diagram to illustrate an operation at the time of an excessive cooling prevention mode of the device temperature regulator of the first embodiment.

For this reason, in the device temperature regulator 1, as shown in FIG. 9, the liquid working fluid condensed in the condenser 14 is stored in the liquid reservoir LR configured of the internal space of the condenser 14 and the internal space of the middle liquid passage part 181 including the expansion part 182.

Figure 10:
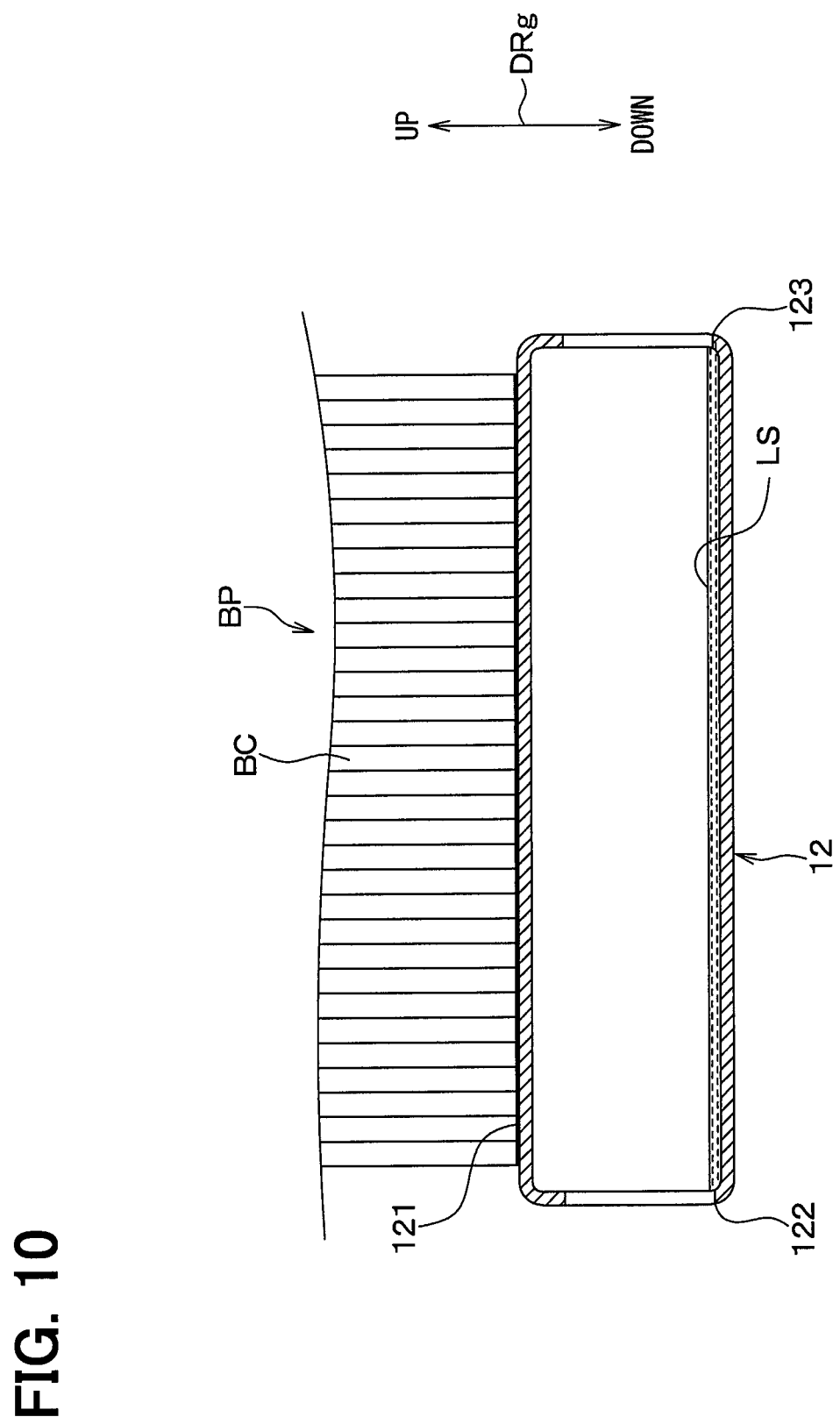
FIG. 10 is a schematic diagram to show an interior of a device heat exchanger at the time of the excessive cooling prevention mode.

In the device temperature regulator 1, as the liquid working fluid stored in the liquid reservoir LR is increased, the liquid working fluid collecting in the device heat exchanger 12 is decreased. In consequence, in the device heat exchanger 12, as shown in FIG. 10, the liquid surface LS of the working fluid goes down to a lower side of the device proximity part 121. In other words, in the device heat exchanger 12, the gaseous working fluid comes closer to the device proximity part 121 than the liquid working fluid. In this way, in the device temperature regulator 1 of the present embodiment, a heat absorption from the battery pack BP by the evaporation of the working fluid of the device heat exchanger 12 is suppressed.

The device temperature regulator 1 of the present embodiment described above is configured such that when the condition for eliminating the need for the temperature regulation of the battery pack BP (in other words, the condition for keeping the battery pack BP warm) is satisfied, the liquid surface LS of the working fluid in the device heat exchanger 12 goes down to the lower side of the device proximity part 121. In other words, when the condition for keeping the battery pack BP warm is satisfied, the device temperature regulator 1 decreases the supply amount of the working fluid to the device heat exchanger 12 such that the liquid surface is formed in a state where the gaseous working fluid is located on the lower side of a portion to exchange heat with the battery pack BP of the device heat exchanger 12. In this configuration, the battery pack BP is close to a portion in which the gaseous working fluid collects in the device heat exchanger 12.

For this reason, in the device temperature regulator 1 of the present embodiment, the heat absorption from the battery pack BP by the evaporation of the working fluid in the device heat exchanger 12 is suppressed, so that the battery pack BP is sufficiently prevented from being excessively cooled. As a result, in the device temperature regulator 1 of the present embodiment, it is possible to avoid the input/output characteristics from being impaired by an increase in an internal resistance which is caused by suppressing a chemical change in the battery pack BP.

Specifically, the device temperature regulator 1 of the present embodiment is configured such that, when the condition for eliminating the need for the temperature regulation of the battery pack BP is satisfied, the liquid passage part 18 is closed by the liquid passage opening/closing valve 30 to thereby store the liquid working fluid in a portion in a part located on the upper side of the liquid passage opening/closing valve 30.

According to this, when the condition for eliminating the need for the temperature regulation of the battery pack BP (in other words, the condition for keeping the battery pack BP warm) is satisfied and the liquid passage part 18 is closed by the liquid passage opening/closing valve 30, the amount of the liquid working fluid stored in the liquid reservoir LR is increased. For this reason, the amount of the liquid working fluid in the device heat exchanger 12 can be reduced as appropriate.

Further, the device temperature regulator 1 of the present embodiment causes the internal space of the condenser 14 and the middle liquid passage part 181 to function as the liquid reservoir LR. In this way, when the device temperature regulator 1 is configured so as to cause the condenser 14 and a portion of the middle liquid passage part 181 to function as the liquid reservoir LR, the device temperature regulator 1 can sufficiently ensure an internal volume for storing the liquid working fluid without adding parts.

Here, the device temperature regulator 1 of the present embodiment has the expansion part 182, in which a passage cross-sectional area is expanded, in the middle liquid passage part 181 and causes the expansion part 182 to function as the liquid reservoir LR. In this way, when the liquid reservoir LR is configured so as to include the expansion part 182 provided in the middle liquid passage part 181, the device temperature regulator 1 can sufficiently ensure the internal volume for storing the liquid working fluid by a small number of parts.

Further, in the device temperature regulator 1 of the present embodiment, the internal volume of the liquid reservoir LR has a volume which prevents the liquid working fluid from overflowing when the liquid surface LS of the working fluid in the device heat exchanger 12 goes down to the lower side of the device proximity part 121.

According to this, when the liquid surface LS of the working fluid in the device heat exchanger 12 goes down to the lower side of the device proximity part 121, the liquid working fluid does not flow out to the device heat exchanger 12 from the liquid reservoir LR. In this way, in the device temperature regulator 1 of the present embodiment, it is possible to keep a state where the liquid surface LS of the working fluid in the device heat exchanger 12 is caused to go down to a lower side of the device proximity part 121. Thus, in the device temperature regulator 1 of the present embodiment, the heat absorption from the battery pack BP by the evaporation of the working fluid in the device heat exchanger 12 can be sufficiently suppressed.

Specifically, the internal volume of the liquid reservoir LR of the present embodiment is larger than an internal volume of the device heat exchanger 12. According to this, in the device temperature regulator 1 of the present embodiment, when the condition for eliminating the need for the temperature regulation of the battery pack BP is satisfied, the liquid working fluid collecting in the device heat exchanger 12 can be stored in the liquid reservoir LR. For this reason, the device temperature regulator 1 of the present embodiment can sufficiently suppress the heat adsorption from the battery pack BP by the evaporation of the working fluid in the device heat exchanger 12.

Here, as described above, it is preferred that the internal volume of the liquid reservoir LR can store the amount of the liquid when all of the working fluid filled in the device fluid circuit 10 is liquefied. In this configuration, in a case where the temperature regulation of the battery pack BP is not required, it is possible to prevent the liquid working fluid from remaining in the device heat exchanger 12.

Modifications of the First Embodiment

Hereinafter, a first modification to a third modification of the device temperature regulator 1 of the first embodiment will be described with reference to FIG. 11 to FIG. 14. Contents described in the present modifications can be applied to the device temperature regulator 1 of the second embodiment and the third embodiment, which will be described later, within a range in which a trouble will be not caused in particular.

First Modification

In the first embodiment described above, the configuration in which the internal volume of the liquid reservoir LR is larger than the internal volume of the device heat exchanger 12 has been shown, but the configuration is not limited to this.

Figure 11:
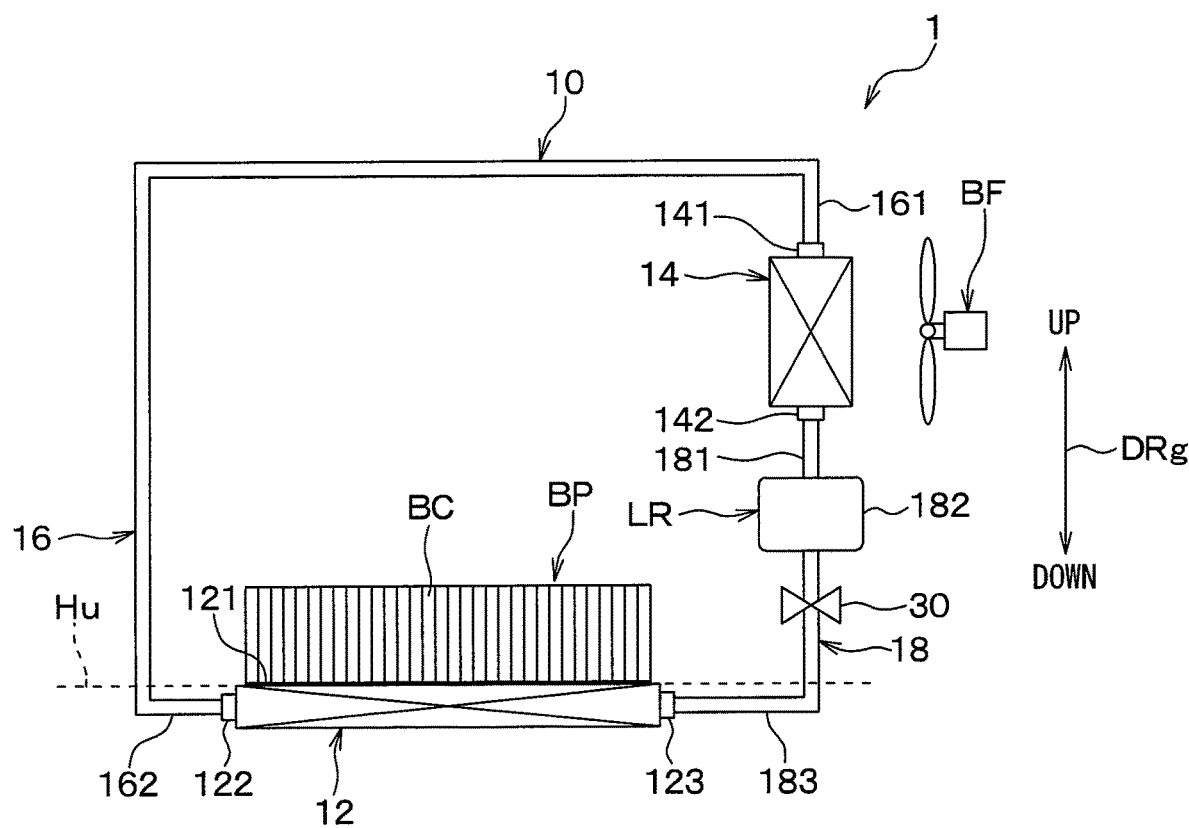
FIG. 11 is a schematic diagram of a device temperature regulator of a first modification of the first embodiment.

As shown in FIG. 11, the device temperature regulator 1 of the present modification is configured such that the gas passage part 16 includes a lower-side gas passage part 162 located on a lower side of a portion Hu located uppermost in the device heat exchanger 12. Further, the device temperature regulator 1 of the present modification is configured such that the liquid passage part 18 includes a lower-side liquid passage part 183 located on a lower side of the portion Hu located uppermost in the device heat exchanger 12.

Figure 12:
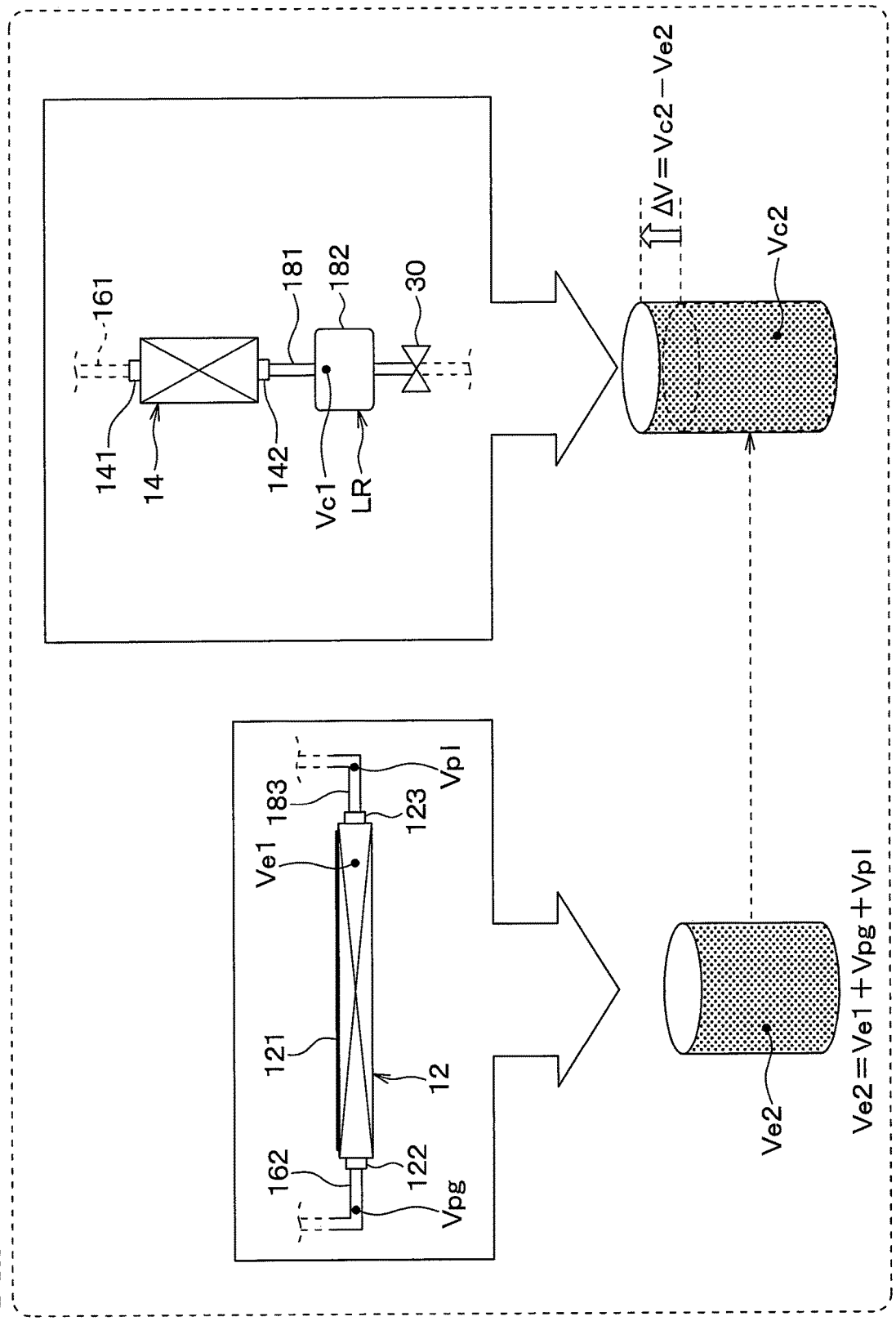
FIG. 12 is a diagram to illustrate an internal volume of a liquid reservoir in the device temperature regulator of the first modification of the first embodiment.

Then, the liquid reservoir LR of the present modification has a volume capable of storing the liquid working fluid which collects in the device heat exchanger 12 and the liquid working fluid which may flow into the device heat exchanger 12 when the liquid passage part 18 is closed by the liquid passage opening/closing valve 30. In other words, the liquid reservoir LR of the present modification, as shown in FIG. 12, has an internal volume Vc2 larger than the sum total Ve2 of an internal volume Ve1 of the device heat exchanger 12, an internal volume Vpg of the lower-side gas passage part 162, and an internal volume Vpl of the lower-side liquid passage part 183.

According to this, in the device temperature regulator 1, the liquid reservoir LR can store not only the liquid working fluid in the device heat exchanger 12 but also the liquid working fluid which collects in the lower-side gas passage part 162 and in the lower-side liquid passage part 183 and which may flow into the device heat exchanger 12. For this reason, in the device temperature regulator 1 of the present modification, in a case where the temperature regulation of the battery pack BP becomes unnecessary, the liquid surface of the working fluid in the device heat exchanger 12 can be caused to sufficiently go down, so that the heat absorption from the battery pack BP in the device heat exchanger 12 can be sufficiently suppressed.

Second Modification

In the first embodiment described above, the blower fan BF has been shown as the heat radiation amount regulator for regulating a heat radiation amount of the working fluid collecting in the condenser 14, but the heat radiation amount regulator is not limited to the blower fan BF.

Figure 13:
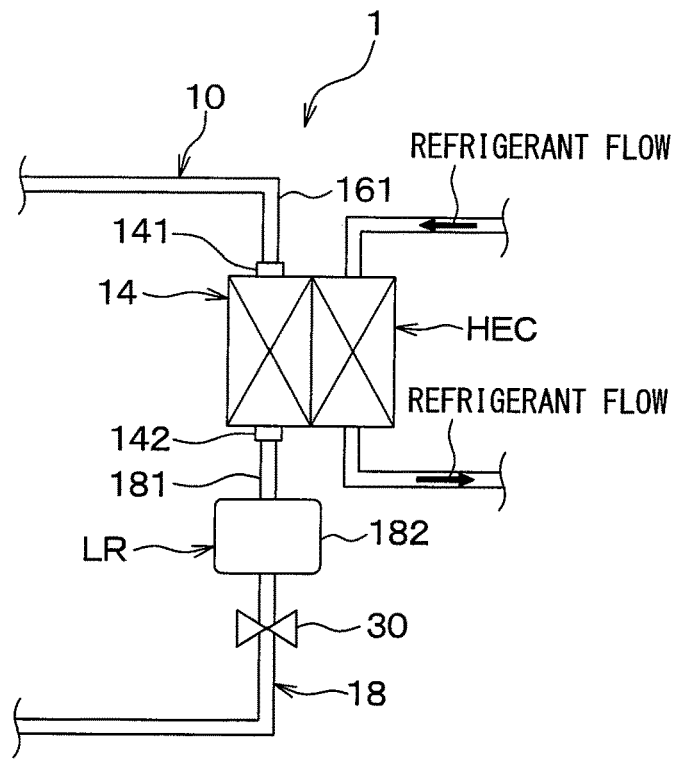
FIG. 13 is a schematic diagram to show a main part of a device temperature regulator of a second modification of the first embodiment.

The heat radiation amount regulator, as shown in FIG. 13, may be configured of a refrigerant-side heat exchanger HEC in which the low-temperature refrigerant of a refrigeration cycle of a vapor compression type flows. In this case, the heat radiation amount in the condenser 14 is varied by increasing or decreasing the number of revolutions of a compressor in the refrigeration cycle. In a case where the refrigerant-side heat exchanger HEC shown in FIG. 13 is used as the heat radiation amount regulator, a configuration for controlling the number of revolutions of the compressor becomes a control part for controlling the heat radiation amount regulator.

Third Modification

Figure 14:
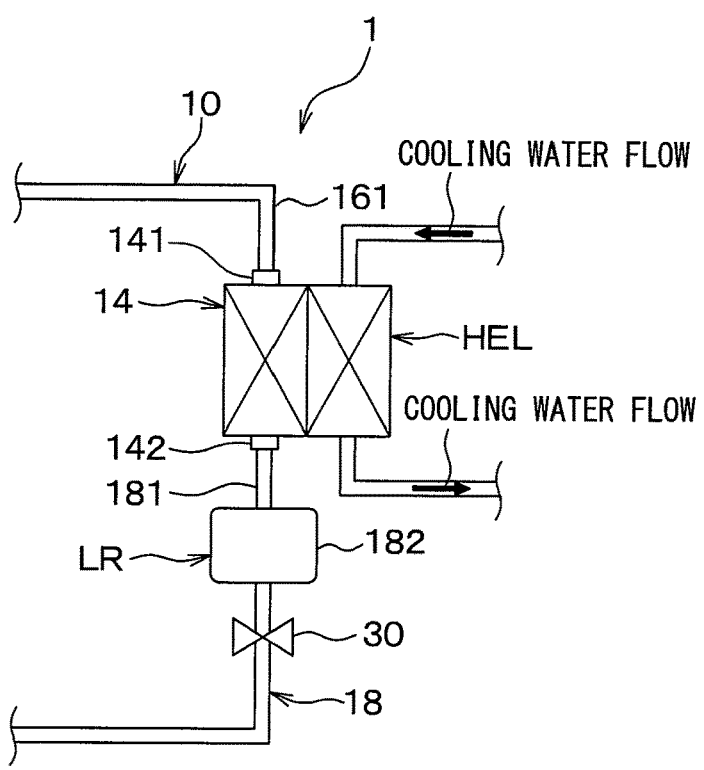
FIG. 14 is a schematic diagram to show a main part of a device temperature regulator of a third modification of the first embodiment.

Further, the heat radiation amount regulator, as shown in FIG. 14, may be configured of a water-side heat exchanger HEL in which a low-temperature antifreeze flows in a cooling water circuit. In this case, the heat radiation amount in the condenser 14 is varied by increasing or decreasing the number of revolutions of a pump in the cooling water circuit. In a case where the water-side heat exchanger HEL shown in FIG. 14 is made the heat radiation amount regulator, a configuration for controlling the number of revolutions of the pump becomes a control part for controlling the heat radiation amount regulator.

Second Embodiment

Figure 15:
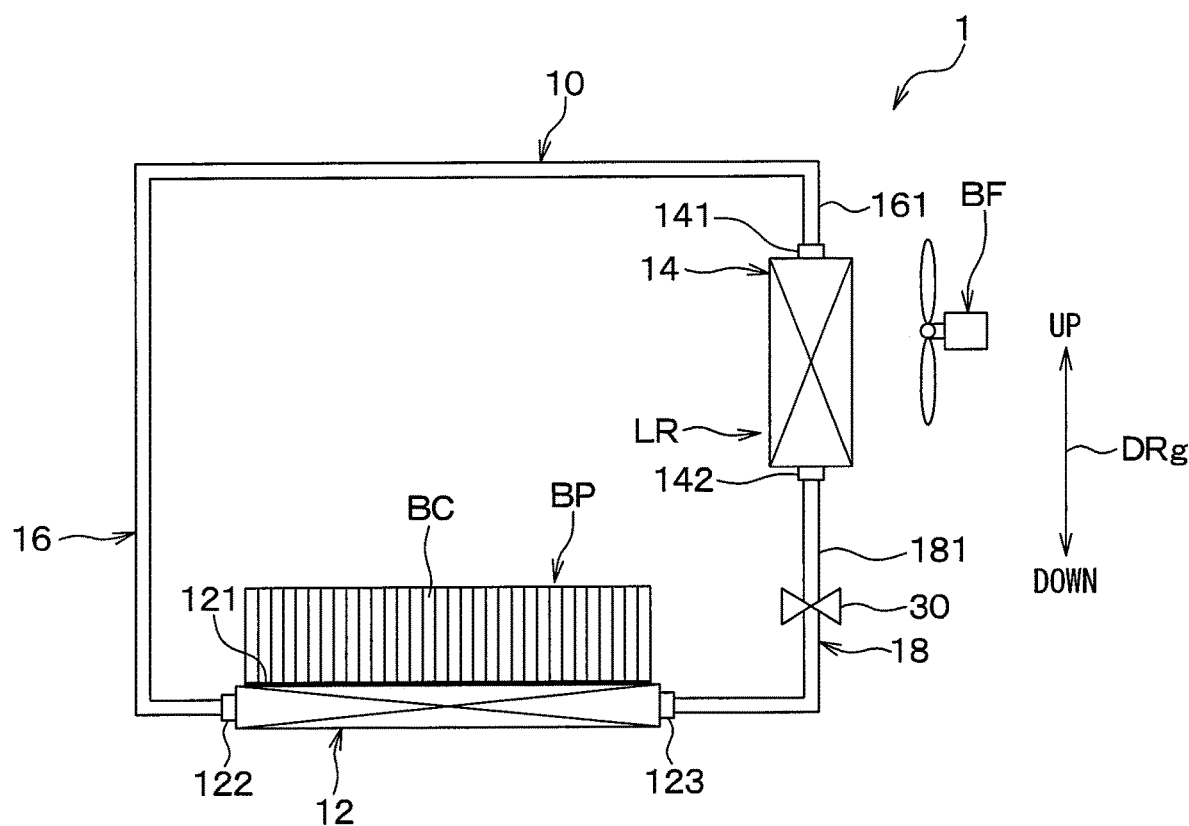
FIG. 15 is a schematic diagram of a device temperature regulator of a second embodiment.
Figure 16:
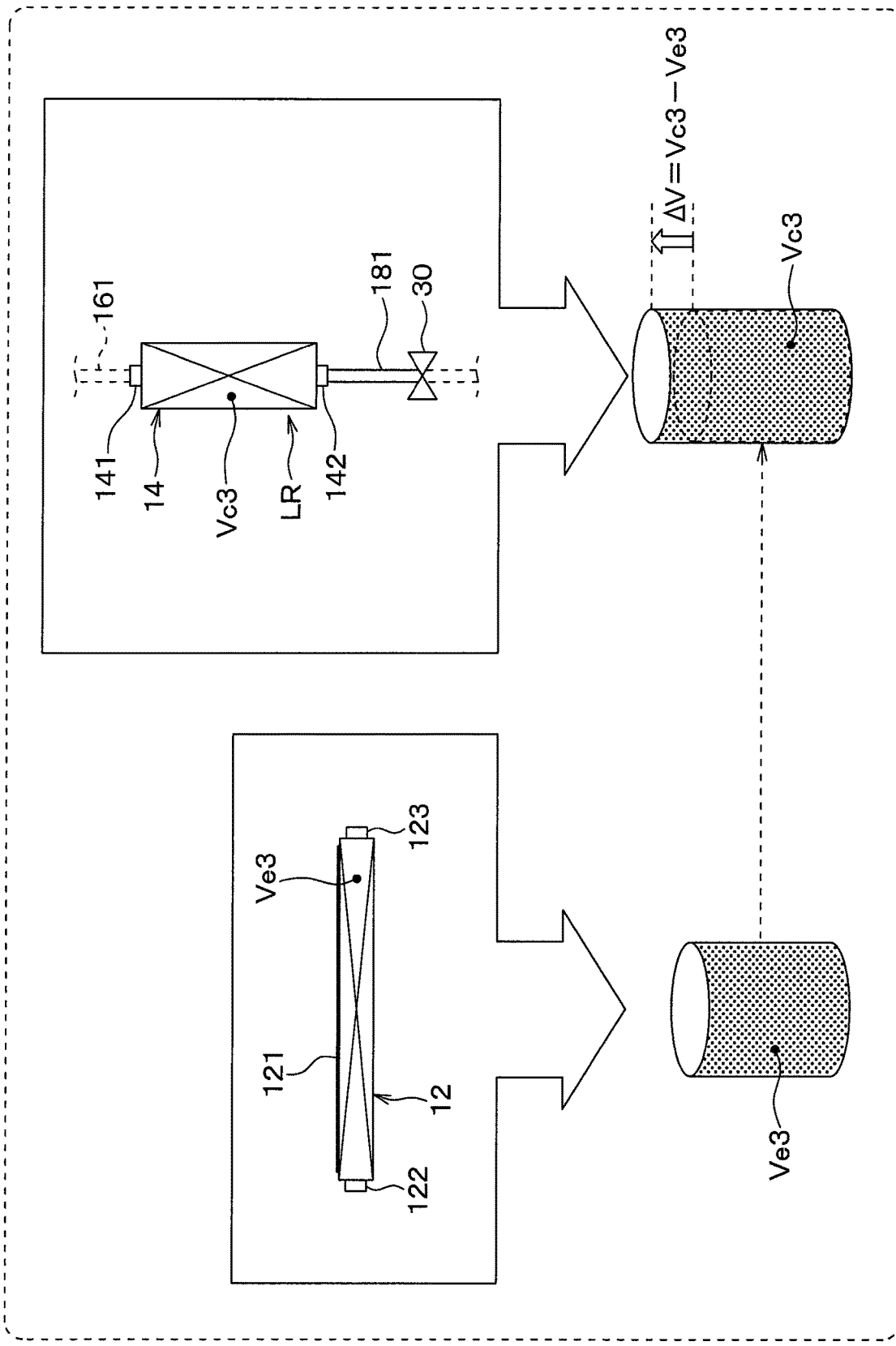
FIG. 16 is a diagram to illustrate an internal volume of a liquid reservoir of the second embodiment.

Next, a second embodiment will be described with reference to FIG. 15 and FIG. 16. A device temperature regulator 1 of the present embodiment, as shown in FIG. 15 and FIG. 16, is different from the first embodiment in that the middle liquid passage part 181 of the liquid passage part 18 is not provided with the expansion part 182. In other words, the middle liquid passage part 181 of the present embodiment is configured of a pipe having a roughly constant passage cross-sectional area.

In the device fluid circuit 10 of the present embodiment, when the liquid passage part 18 is closed by the liquid passage opening/closing valve 30, the internal space of the condenser 14 and the internal space of the middle liquid passage part 181 function as the liquid reservoir LR for storing the liquid working fluid.

An internal volume of the liquid reservoir LR of the present embodiment is a volume capable of storing the liquid working fluid collecting in the device heat exchanger 12. In other words, the liquid reservoir LR of the present embodiment, as shown in FIG. 16, has an internal volume $Vc3$ larger than an internal volume $Ve3$ of the device heat exchanger 12 so as to be able to store the liquid working fluid collecting in the device heat exchanger 12. The liquid reservoir LR is preferred to have a volume capable of storing the amount of liquid (that is, a total liquid amount Lall) when all of the working fluid filled in the device fluid circuit 10 is liquefied.

The other configuration is the same as the first embodiment. The device temperature regulator 1 of the present embodiment can produce the same operations and effects, which are produced by the configuration common to the device temperature regulator 1 of the first embodiment, as is the case with the first embodiment.

The device temperature regulator 1 of the present embodiment does not have the expansion part 182 provided in the middle liquid passage part 181 and hence can reduce the number of parts as compared with the device temperature regulator 1 of the first embodiment.

Modifications of the Second Embodiment

Hereinafter, a first modification to a sixth modification of the device temperature regulator 1 of the second embodiment will be described with reference to FIG. 17 to FIG. 22. The contents described in the present modifications can be applied to the device temperature regulator 1 of the first embodiment and a device temperature regulator 1 of a third embodiment which will be described later within a range in which a trouble will be not caused in particular.

First Modification

In the second embodiment described above, a configuration in which the internal volume of the liquid reservoir LR is larger than the internal volume of the device heat exchanger 12 has been described, but the present disclosure is not limited to this.

Figure 17:
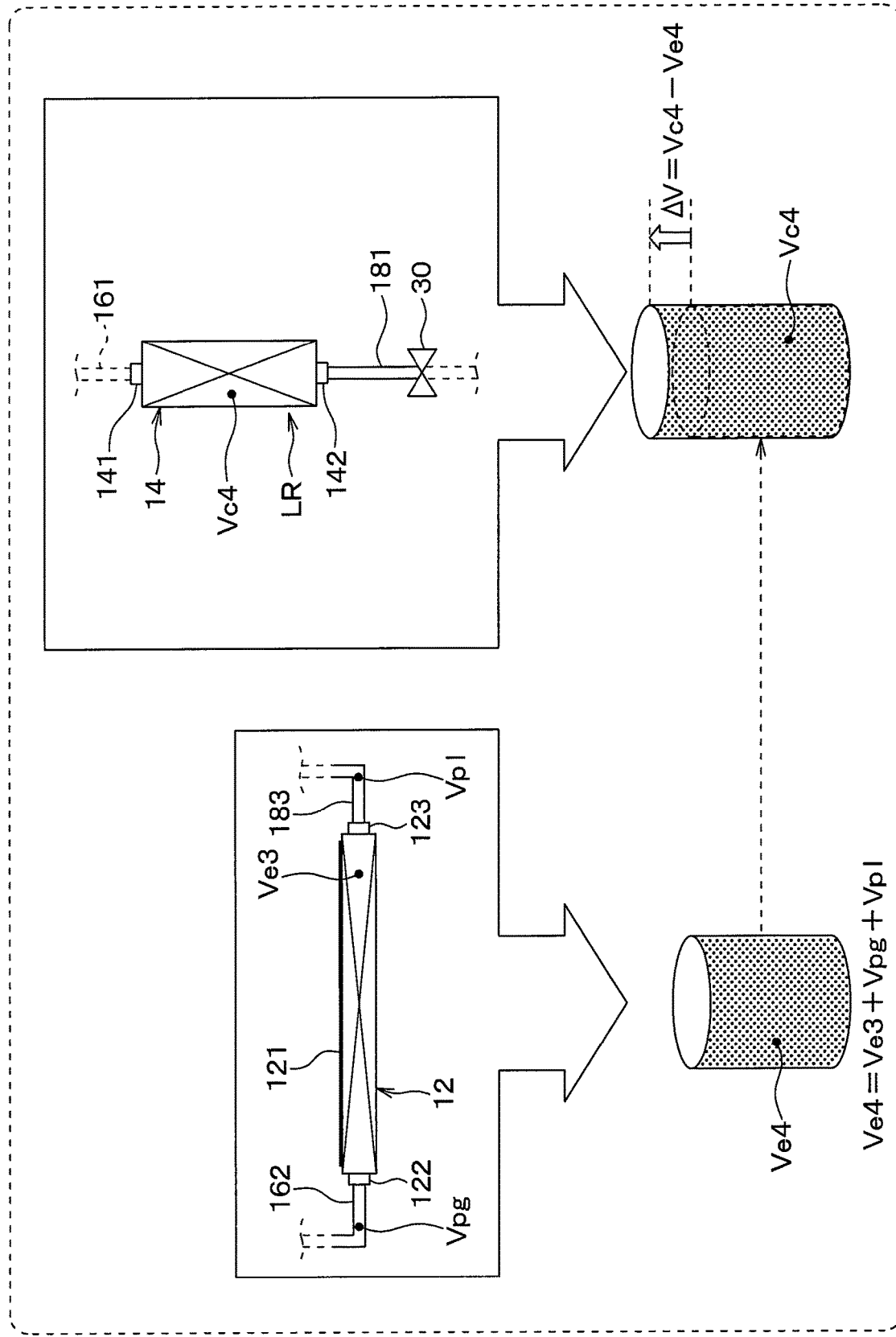
FIG. 17 is a diagram to illustrate an internal volume of a liquid reservoir in a device temperature regulator of a first modification of the second embodiment.

As shown in FIG. 17, a device temperature regulator 1 of the present modification is configured such that the gas passage part 16 includes a lower-side gas passage part 162 located on a lower side of a portion Hu located uppermost in the device heat exchanger 12. Further, the device temperature regulator 1 of the present modification is configured such that the liquid passage part 18 includes a lower-side liquid passage part 183 located on a lower side of the portion Hu located uppermost in the device heat exchanger 12.

The liquid reservoir LR of the present modification has its internal volume capable of storing the liquid working fluid which collects in the device heat exchanger 12 and the liquid working fluid which may flow into the device heat exchanger 12 when the liquid passage part 18 is closed by the liquid passage opening/closing valve 30. In other words, the liquid reservoir LR of the present embodiment, as shown in FIG. 17, has its internal volume $Vc4$ larger than the sum total $Ve4$ of the internal volume $Ve3$ of the device heat exchanger 12, the internal volume $Vpg$ of the lower-side gas passage part 162, and the internal volume $Vpl$ of the lower-side liquid passage part 183.

According to this, in the device temperature regulator 1, the liquid reservoir LR can store not only the liquid working fluid in the device heat exchanger 12 but also the liquid working fluid which collects in the lower-side gas passage part 162 and in the lower-side liquid passage part 183 and which may flow into the device heat exchanger 12. For this reason, in the device temperature regulator 1 of the present modification, in a case where the temperature regulation of the battery pack BP becomes unnecessary, the liquid surface of the working fluid in the device heat exchanger 12 can be caused to sufficiently go down, so that the heat absorption from the battery pack BP in the device heat exchanger 12 can be sufficiently suppressed.

Second Modification

In the first embodiment described above, the configuration in which the internal space of the condenser 14 and the internal space of the middle liquid passage part 181 function as the liquid reservoir LR has been shown as an example, but the present disclosure is not limited to this.

As described in the first embodiment, the gas passage part 16 is configured so as to include the upper-side gas passage part 161 extending to the upper side from the gas inlet part 141 of the condenser 14. The upper-side gas passage part 161 is connected to the gas inlet part 141 of the condenser 14 located on the upper side of the liquid passage opening/closing valve 30. For this reason, when the temperature regulation of the battery pack BP becomes unnecessary, the upper-side gas passage part 161 can store the liquid working fluid.

Then, in the device fluid circuit 10 of the present modification, the liquid reservoir LR is configured of the internal space of the condenser 14, the internal space of the middle liquid passage part 181, and the internal space of the upper-side gas passage part 161.

Figure 18:
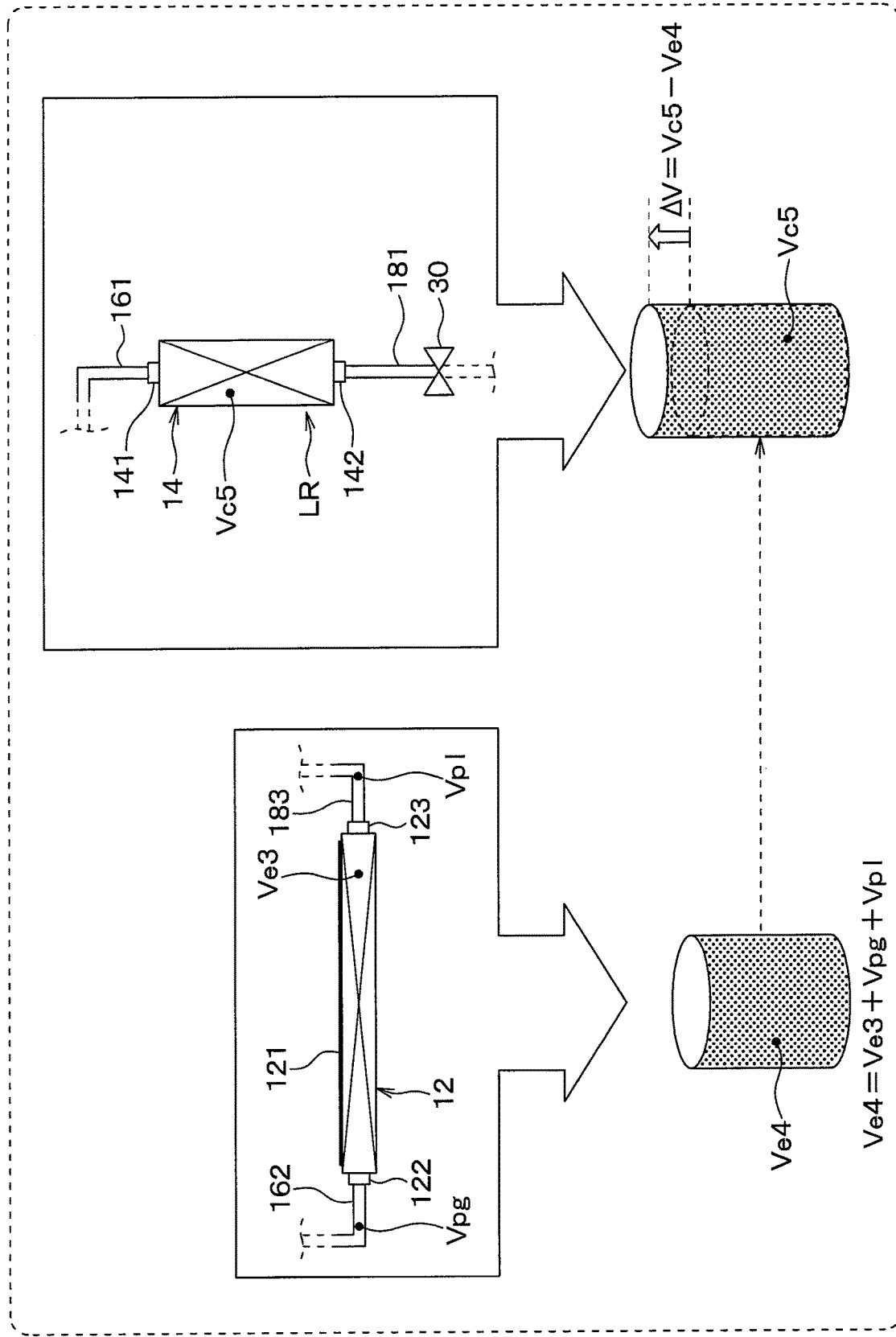
FIG. 18 is a diagram to illustrate an internal volume of a liquid reservoir in a device temperature regulator of a second modification of the second embodiment.

The liquid reservoir LR of the present modification has its internal volume capable of storing the liquid working fluid which collects in the device heat exchanger 12 and the liquid working fluid which may flow into the device heat exchanger 12 when the liquid passage part 18 is closed by the liquid passage opening/closing valve 30. In other words, the liquid reservoir LR of the present embodiment, as shown in FIG. 18, has its internal volume Vc5 larger than the sum total Ve4 of the internal volume Ve3 of the device heat exchanger 12, the internal volume Vpg of the lower-side gas passage part 162, and the internal volume Vpl of the lower-side liquid passage part 183.

In this way, in the device fluid circuit 10, when the temperature regulation of the battery pack BP becomes unnecessary, a portion of the gas passage part 16, that is, the upper-side gas passage part 161 can be caused to function as the liquid reservoir LR and hence an internal volume for storing the liquid working fluid can be sufficiently ensured.

Third Modification

In the second embodiment described above, the configuration in which the upper-side gas passage part 161 of the gas passage part 16 is configured of only a portion extending to an upper side along the vertical direction DRg from the gas inlet part 141 of the condenser 141 has been shown as an example, but the present disclosure is not limited to this.

Figure 19:
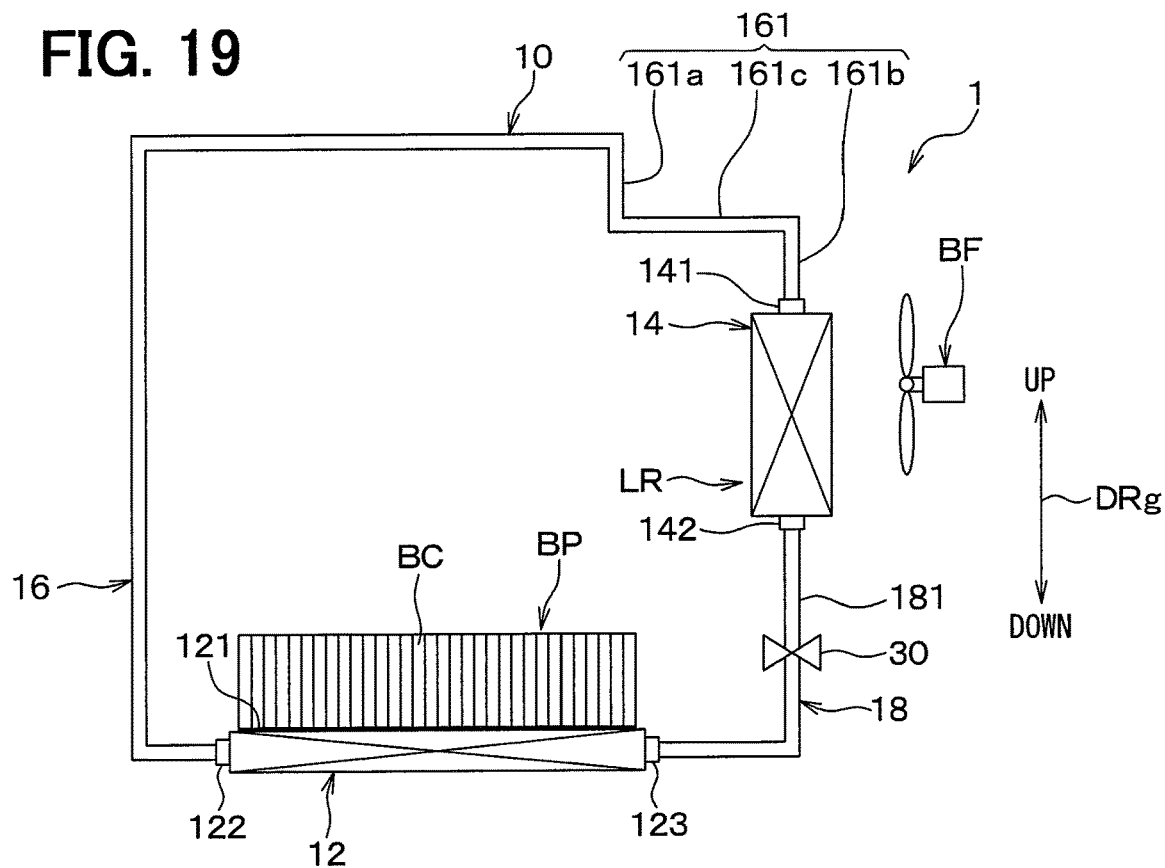
FIG. 19 is a schematic diagram of a device temperature regulator of a third modification of the second embodiment.

The upper-side gas passage part 161 may be formed, for example, in a shape bent in a shape of a letter L as shown in FIG. 19. In other words, the upper-side gas passage part 161 may be configured so as to include parts 161a, 161b extending along the vertical direction DRg and a portion 161c extending in a direction crossing the vertical direction DRg.

In this way, in a device temperature regulator 1 of the present modification, the internal volume of the upper-side gas passage part 161 can be increased, so that the internal volume of the liquid reservoir LR when the condition for eliminating the need for the temperature regulation of the battery pack BP is satisfied can be sufficiently ensured.

Fourth Modification

In the second embodiment described above, the configuration in which the condenser 14 is connected between the upper-side gas passage part 161 of the gas passage part 16 and the liquid passage part 18 has been shown an example, but the present disclosure is not limited to this.

Figure 20:
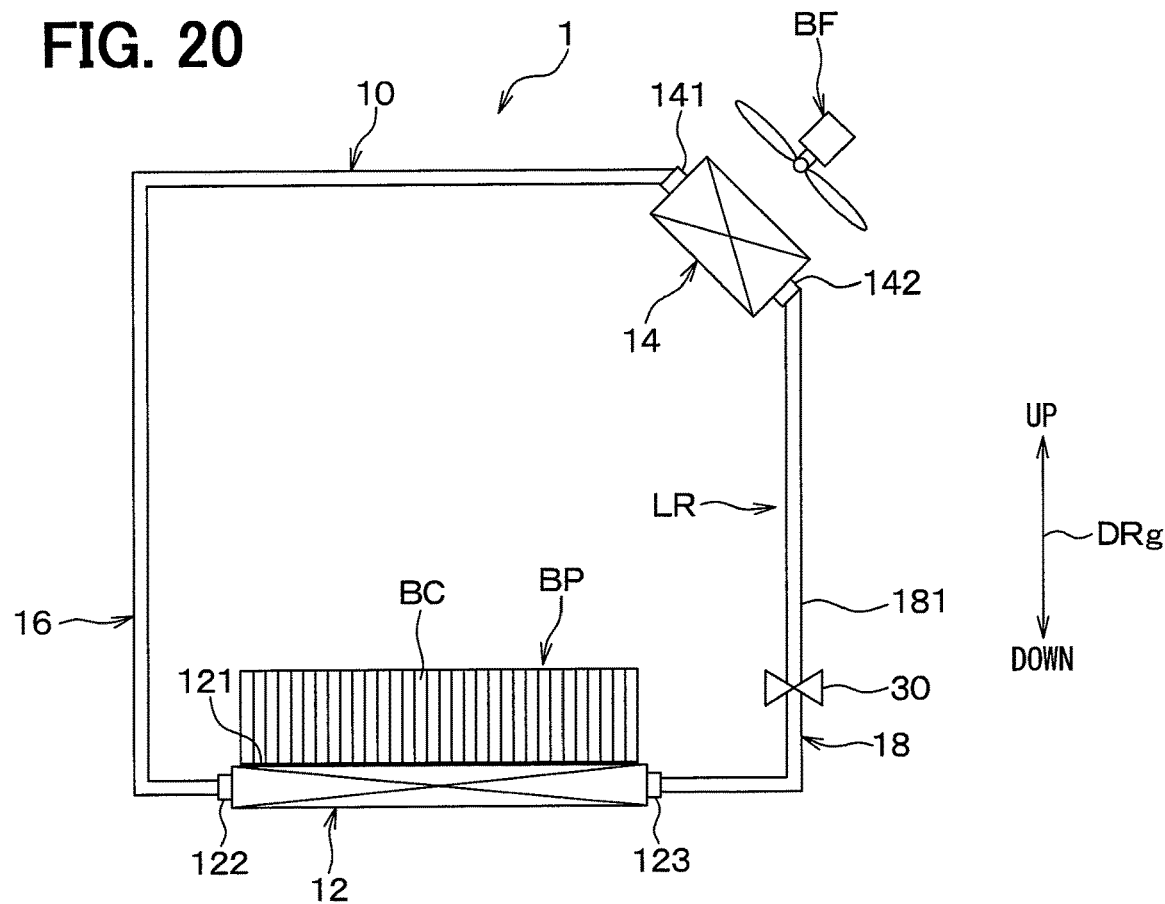
FIG. 20 is a schematic diagram of a device temperature regulator of a fourth modification of the second embodiment.

The condenser 14 may be configured such that, for example, as shown in FIG. 20, the gas inlet part 141 is arranged so as to be located at the uppermost portion of the device fluid circuit 10. The condenser 14 of the present modification has an arrangement in which the liquid outlet part 142 is located on the lower side of the gas inlet part 141 in the vertical direction DRg.

Fifth Modification

Figure 21:
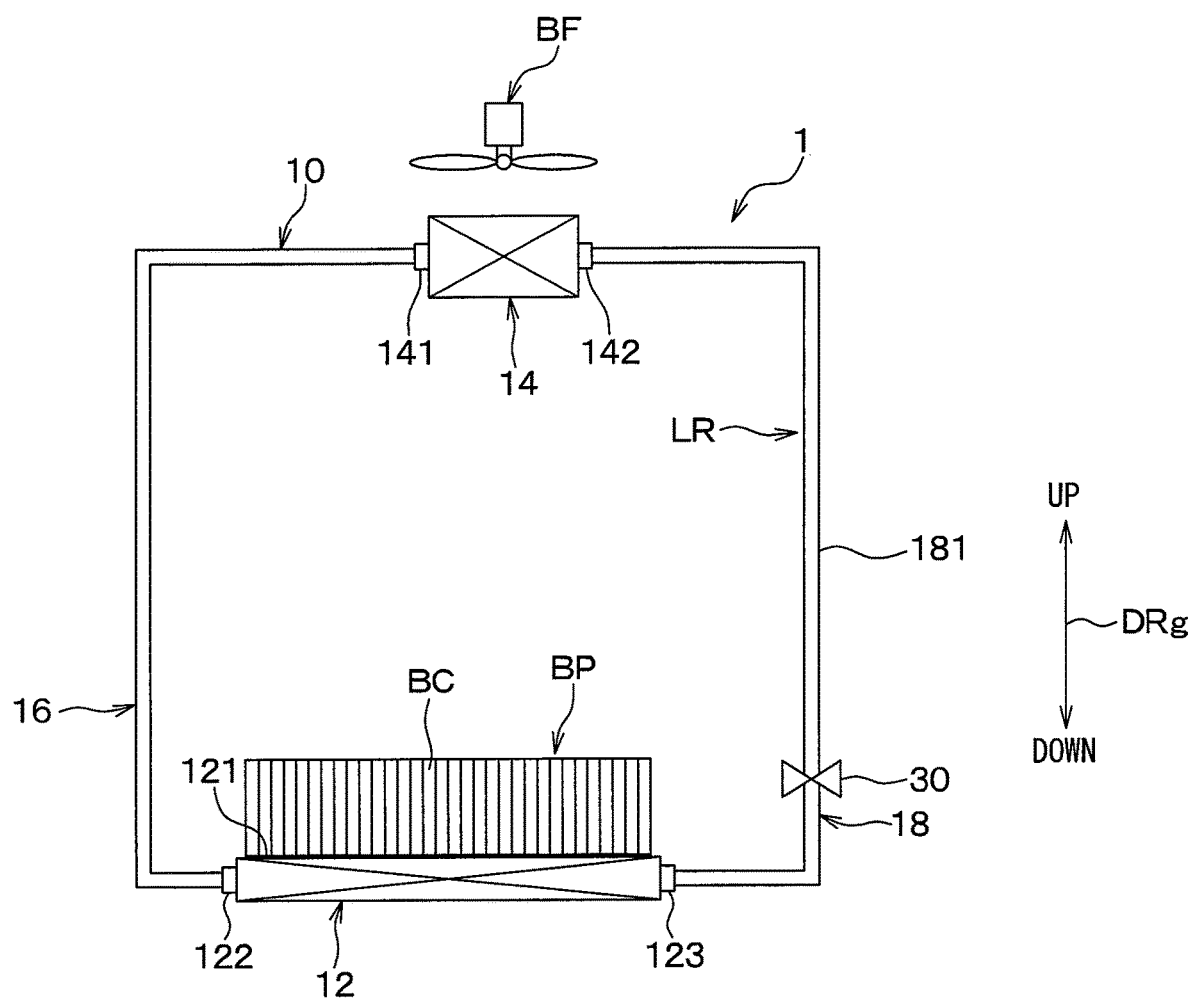
FIG. 21 is a schematic diagram of a device temperature regulator of a fifth modification of the second embodiment.

Further, the condenser 14 may be configured such that, for example, as shown in FIG. 21, both of the gas inlet part 141 and the liquid outlet part 142 are arranged so as to be located at an uppermost portion of the device fluid circuit 10. The condenser 14 of the present modification is arranged such that the liquid outlet part 142 is located at the same level as the gas inlet part 141 in the vertical direction DRg.

Sixth Modification

In the second embodiment described above, an example in which the gaseous working fluid is condensed in a single condenser 14 has been described, but the present disclosure is not limited to this.

Figure 22:
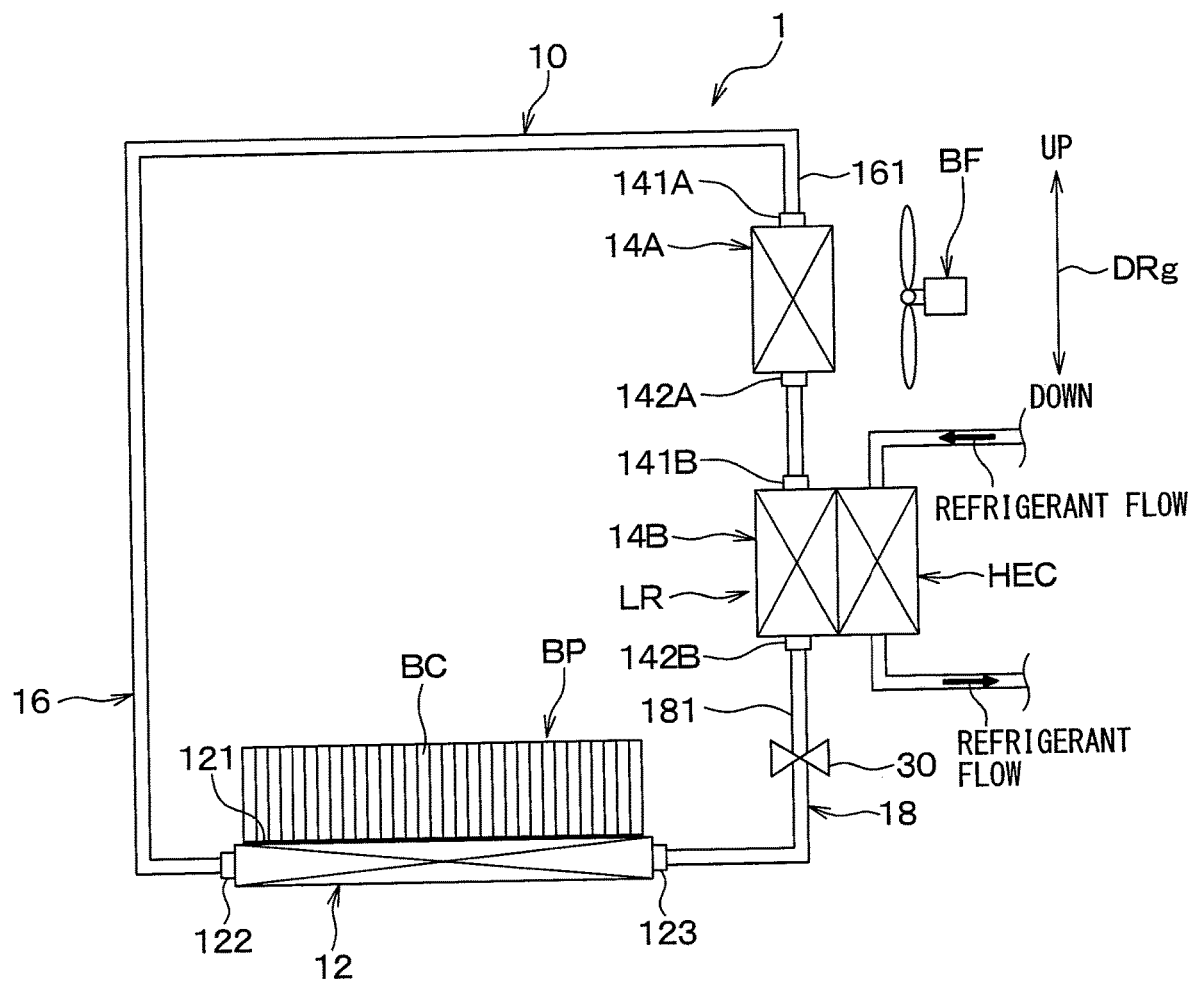
FIG. 22 is a schematic diagram of a device temperature regulator of a sixth modification of the second embodiment.

The device temperature regulator 1 may be configured so as to be provided with a plurality of condensers 14. For example, as shown in FIG. 22, the device temperature regulator 1 may be configured so as to be provided with a first condenser 14A and a second condenser 14B.

In this case, the device temperature regulator 1 may be configured such that the respective condensers 14A, 14B can be cooled by different heat radiation amount regulators. In FIG. 22, the heat radiation amount regulator of the first condenser 14A is configured of the blower fan BF and the heat radiation amount regulator of the second condenser 14B is configured of the refrigerant-side heat exchanger HEC of the refrigeration cycle.

The device temperature regulator 1 of the present modification is provided with the plurality of condensers 14A, 14B. In the device temperature regulator 1 of the present modification, the plurality of condensers 14A, 14B can be caused to function as the liquid reservoir LR, so that the internal volume of the liquid reservoir LR when the condition for eliminating the need for the temperature regulation of the battery pack BP is satisfied can be sufficiently ensured.

Further, the device temperature regulator 1 of the present modification is configured so as to include the plurality of condensers 14A, 14B and so as to cool the respective condensers 14A, 14B by the different heat radiation amount regulators. In this way, in the configuration in which the working fluid in the plurality of condensers 14A, 14B are cooled by the different heat radiation amount regulators, a regulation width of the heat radiation capacity in the device temperature regulator 1 can be sufficiently ensured. This is effective for improving an energy efficiency of the device temperature regulator 1.

Third Embodiment

Next, a third embodiment will be described with reference to FIG. 23. A device temperature regulator 1 of the present embodiment is different from the first embodiment in an operation at the time of the excessive cooling prevention mode.

At the time of the excessive cooling prevention mode, the control device 100 of the present embodiment controls the liquid passage opening/closing valve 30 such that the supply amount of the liquid working fluid to the device heat exchanger 12 is decreased and then controls an operation of the blower fan BF such that the heat radiation amount of the working fluid in the condenser 14 is increased.

Hereinafter, an operation of the device temperature regulator 1 of the present embodiment will be described with reference to a flow chart shown in FIG. 23. Control processing shown in FIG. 23 is performed by the control device 100. Of the control processing shown in FIG. 23, the processing in steps S110 to S122 are the same as the processing of steps S110 to S122 described in the first embodiment and shown in FIG. 7. For this reason, in the present embodiment, the description of the processing of steps S110 to S122 will be omitted or simplified.

Figure 23:
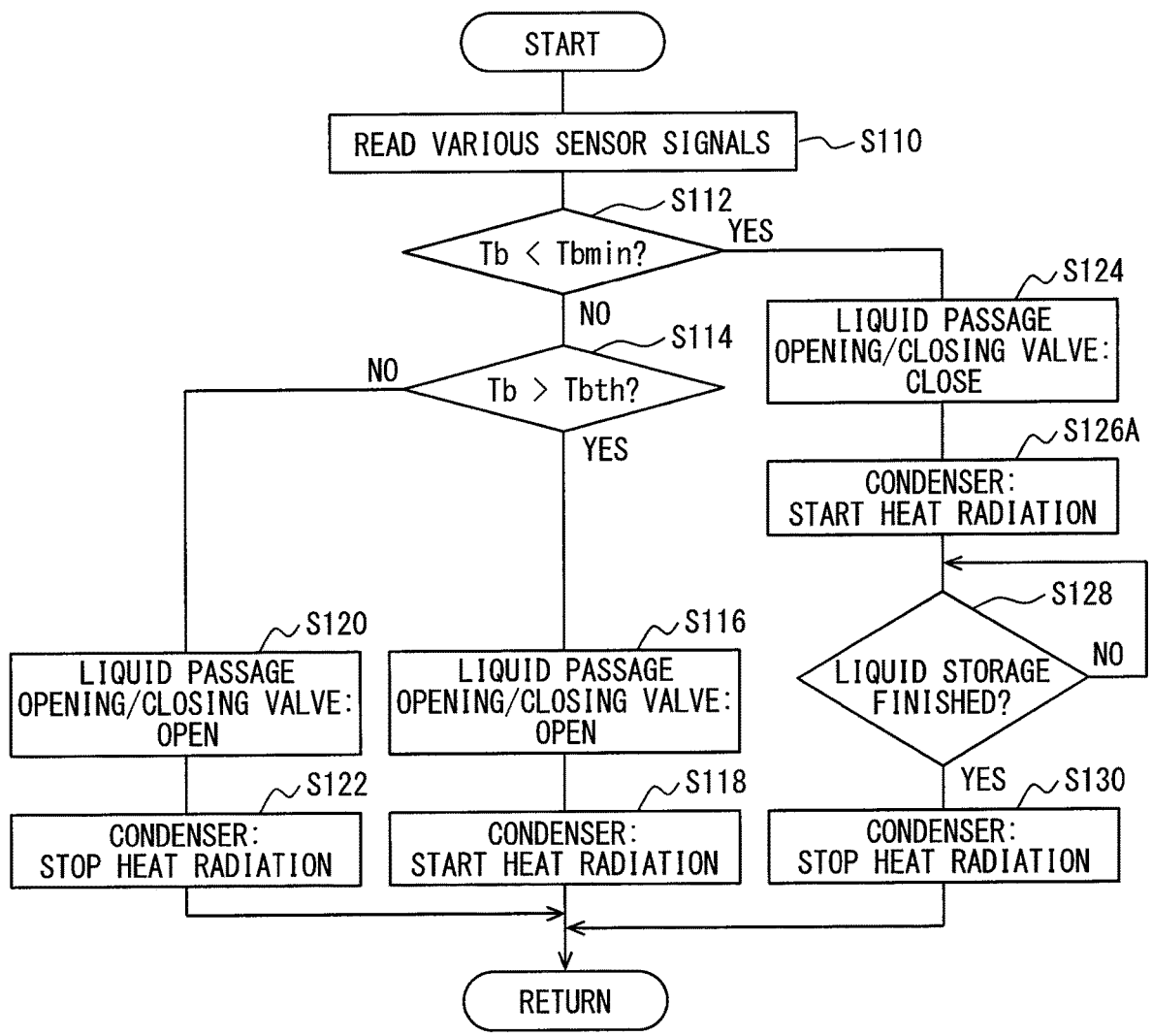
FIG. 23 is a flow chart to show a flow of control processing performed by a control device of a device temperature regulator of a third embodiment.

As shown in FIG. 23, in a case where it is determined as the result of determination processing of step S112 that the battery temperature Tb of the battery pack BP is lower than the allowable lower limit temperature Tbmin, the control device 100 closes the liquid passage part 18 by the liquid passage opening/closing valve 30 in step S124.

Further, the control device 100 operates the blower fan BF to start the heat radiation of the working fluid collecting in the condenser 14 in step S126A. In other words, the control device 100 controls the liquid passage opening/closing valve 30 such that the supply amount of the liquid working fluid to the device heat exchanger 12 is decreased and then controls the operation of the blower fan BF such that the heat radiation amount of the working fluid in the condenser 14 is increased. In this way, the gaseous working fluid collecting in the device fluid circuit 10 is condensed in the condenser 14 and the condensed liquid working fluid is stored in the liquid reservoir LR.

Subsequently, the control device 100 determines in step S128 whether or not a storage of the liquid working fluid in the liquid reservoir LR is finished. The control device 100 of the present embodiment operates the blower fan BF in step S126 and then when a specified time passes, the control device 100 determines that the storage of the liquid working fluid in the liquid reservoir LR is finished.

The processing of step S128 may be processing for determining whether or not the storage of the liquid working fluid in the liquid reservoir LR is finished regardless of the time which passes after the blower fan BF is operated in step S126. For example, the control device 100 may be configured such that when the blower fan BF is operated in step S126 and then the battery temperature Tb of the battery pack BP is increased to a specified temperature, the control device 100 determines that the storage of the liquid working fluid in the liquid reservoir LR is finished. Further, the control device 100 may be configured such as to monitor an actual amount of the liquid working fluid stored in the liquid reservoir LR and to determine that the storage of the liquid working fluid in the liquid reservoir LR is finished when the actual amount of the liquid working fluid becomes more than a specified reference amount.

In a case where it is determined in step S128 that the storage of the liquid working fluid in the liquid reservoir LR is finished, the control device 100 stops the operation of the blower fan BF in step S130 to thereby stop the heat radiation of the working fluid collecting in the condenser 14.

The present embodiment is similar to the first embodiment in the other configuration. The device temperature regulator 1 of the present embodiment can produce the same operations and effects produced by the configuration common to the device temperature regulator 1 of the first embodiment as is the case with the first embodiment.

The device temperature regulator 1 of the present embodiment is configured so as to increase the heat radiation amount of the working fluid in the condenser 14 when the supply amount of the liquid working fluid to the device heat exchanger 12 is decreased. According to this, when the condition for eliminating the need for the temperature regulation of the battery pack BP is satisfied, the liquid surface of the working fluid of the device heat exchanger 12 can be caused to early go down to a lower side of the device proximity part 121.

Fourth Embodiment

Next, a fourth embodiment will be described with reference to FIG. 24 to FIG. 26. A device temperature regulator 1 of the present embodiment is different from the first embodiment in that the liquid passage part 18 is provided with a part located on a lower side of the device heat exchanger 12. In the present embodiment, parts different from the first embodiment will be mainly described.

Figure 24:
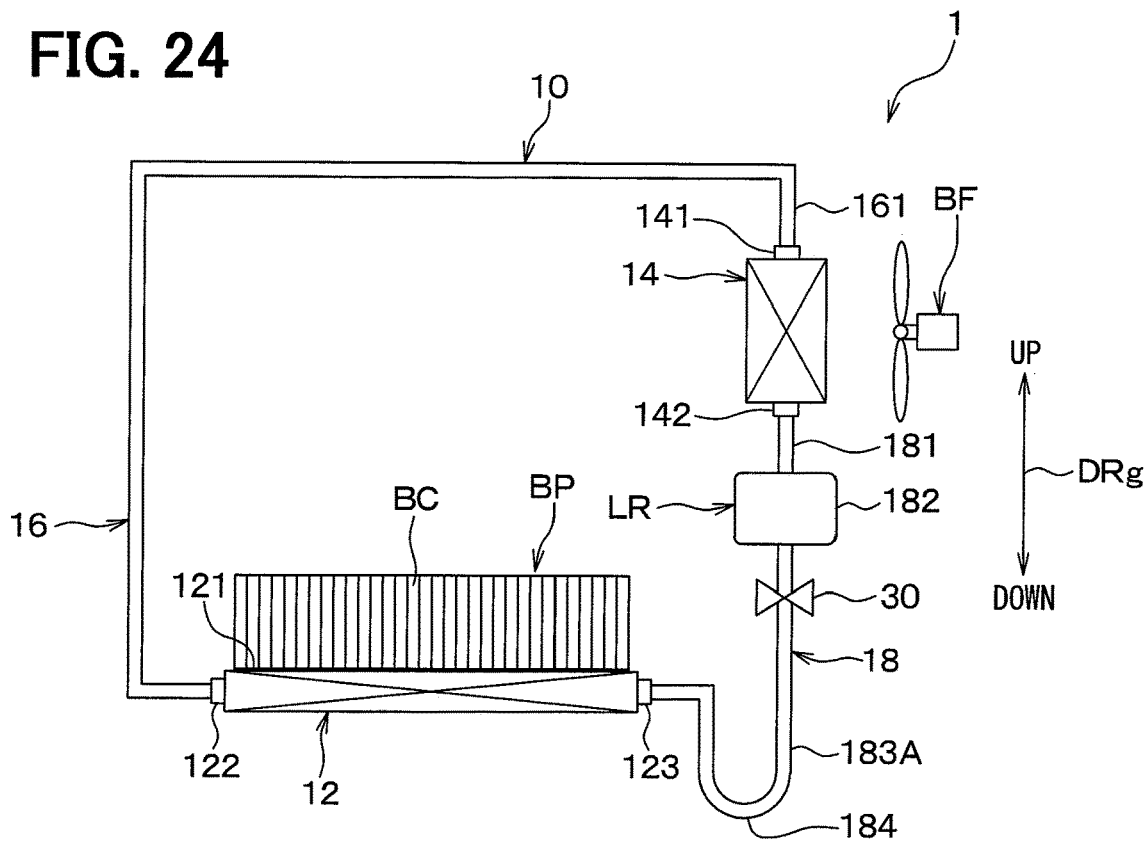
FIG. 24 is a schematic diagram of a device temperature regulator of a fourth embodiment.

As shown in FIG. 24, the liquid passage part 18 is configured so as to include a lower-side liquid passage part 183A located on the lower side of a part located uppermost of the device heat exchanger 12. This lower-side liquid passage part 183A is configured such that a lowermost part 184 located lowermost is lower than the liquid inlet part 123 of the device heat exchanger 12.

Specifically, the lower-side liquid passage part 183A of the present embodiment is configured so as to include a portion, which is projected down from the liquid inlet part 123 of the device heat exchanger 12 and is shaped like a letter U. As to the lower-side liquid passage part 183A, if the lowermost part 184 is configured so as to be lower than the liquid inlet part 123 of the device heat exchanger 12, the lowermost part 184 may be configured so as not to have the portion shaped like the letter U.

Next, an operation of the device temperature regulator 1 of the present embodiment will be described with reference to FIG. 25 and FIG. 26. In the device temperature regulator 1 of the present embodiment, as shown in FIG. 25, at the time of the cooling mode, the blower fan BF is operated in a state where the liquid passage opening/closing valve 30 is opened.

In this way, in the device temperature regulator 1, the liquid working fluid absorbs heat from the battery pack BP and hence a portion of the liquid working fluid is evaporated. The battery pack BP is cooled by a latent heat of evaporation of the working fluid collecting in the device heat exchanger 12, thereby having its temperature decreased.

Figure 25:
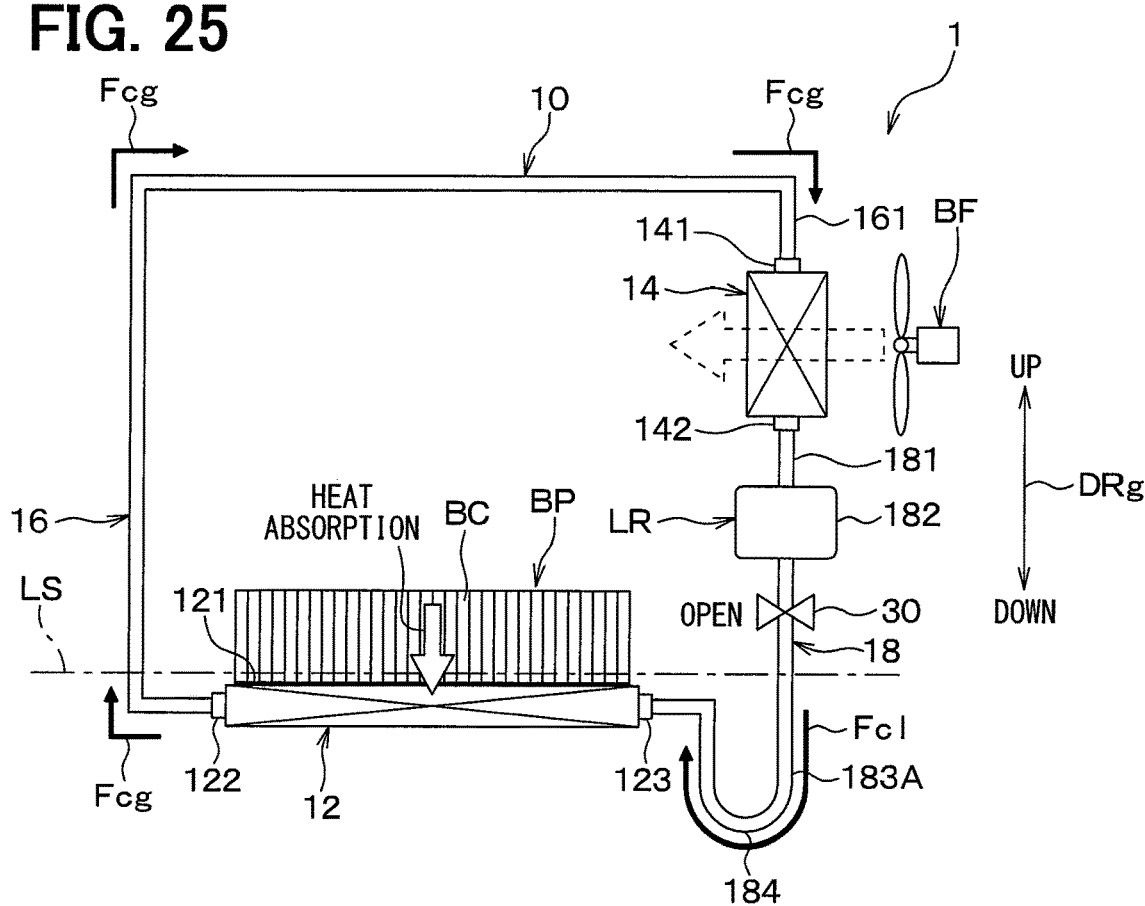
FIG. 25 is a diagram to illustrate an operation at the time of a cooling mode of the device temperature regulator of the fourth embodiment.

The gaseous working fluid evaporated in the device heat exchanger 12 flows out to the gas passage part 16 from the gas outlet part 122 of the device heat exchanger 12 and moves to the condenser 14 via the gas passage part 16 as shown by an arrow Fcg in FIG. 25.

In the condenser 14, the gaseous working fluid radiates heat to air blown from the blower fan BF, thereby being condensed. In the condenser 14, the gaseous working fluid is liquefied and hence a specific gravity of the working fluid is increased. In this way, the working fluid liquefied in the condenser 14 goes down toward the liquid outlet part 142 of the condenser 14 by its own weight.

The liquid working fluid condensed in the condenser 14 flows out to the liquid passage part 18 from the liquid outlet part 142 of the condenser 14 and moves to the device heat exchanger 12 via the liquid passage part 18 as shown by an arrow Fcl in FIG. 25. Then, in the device heat exchanger 12, a portion of the liquid working fluid flowing into the device heat exchanger 12 from the liquid inlet part 123 via the liquid passage part 18 absorbs heat from the battery pack BP, thereby being evaporated.

In this way, in the device temperature regulator 1, at the time of the cooling mode, the working fluid is circulated between the device heat exchanger 12 and the condenser 14 while changing the phase between the gas phase and the liquid phase and hence the heat is transferred from the device heat exchanger 12 to the condenser 14, and thereby the battery pack BP is cooled.

Here, at the time of the cooling mode, a portion of the gaseous working fluid evaporated in the device heat exchanger 12 flows out to the liquid passage part 18 from the liquid inlet part 123 of the device heat exchanger 12 in some cases. When the gaseous working fluid flowing out to the liquid passage part 18 flows into the condenser 14, a hydraulic head in the liquid passage part 18 is not easily ensured, and the working fluid is suppressed from circulating in the device fluid circuit 10.

In contrast to this, the present embodiment is configured such that a portion of the liquid passage part 18 is located on the lower side of the liquid inlet part 123 of the device heat exchanger 12 and hence the gaseous working fluid does not easily flow into the condenser 14 via the liquid passage part 18. In this way, the device temperature regulator 1 of the present embodiment can suitably circulate the working fluid in the device fluid circuit 10.

Further, when the condition for keeping the battery pack BP warm is satisfied, the device temperature regulator 1 of the present embodiment is shifted to the excessive cooling prevention mode. At the time of the excessive cooling prevention mode, the device temperature regulator 1 of the present embodiment has the liquid passage part 18 closed by the liquid passage opening/closing valve 30 in a state where the operation of the blower fan BF is stopped. In other words, at the time of the excessive cooling prevention mode, in the device temperature regulator 1 of the present embodiment, the supply of the liquid working fluid to the device heat exchanger 12 is stopped.

In the device temperature regulator 1, even if the supply of the liquid working fluid to the device heat exchanger 12 is stopped, when the temperature of the working fluid collecting in the condenser 14 is higher than the battery temperature Tb of the battery pack BP, the gaseous working fluid is condensed in the condenser 14.

Figure 26:
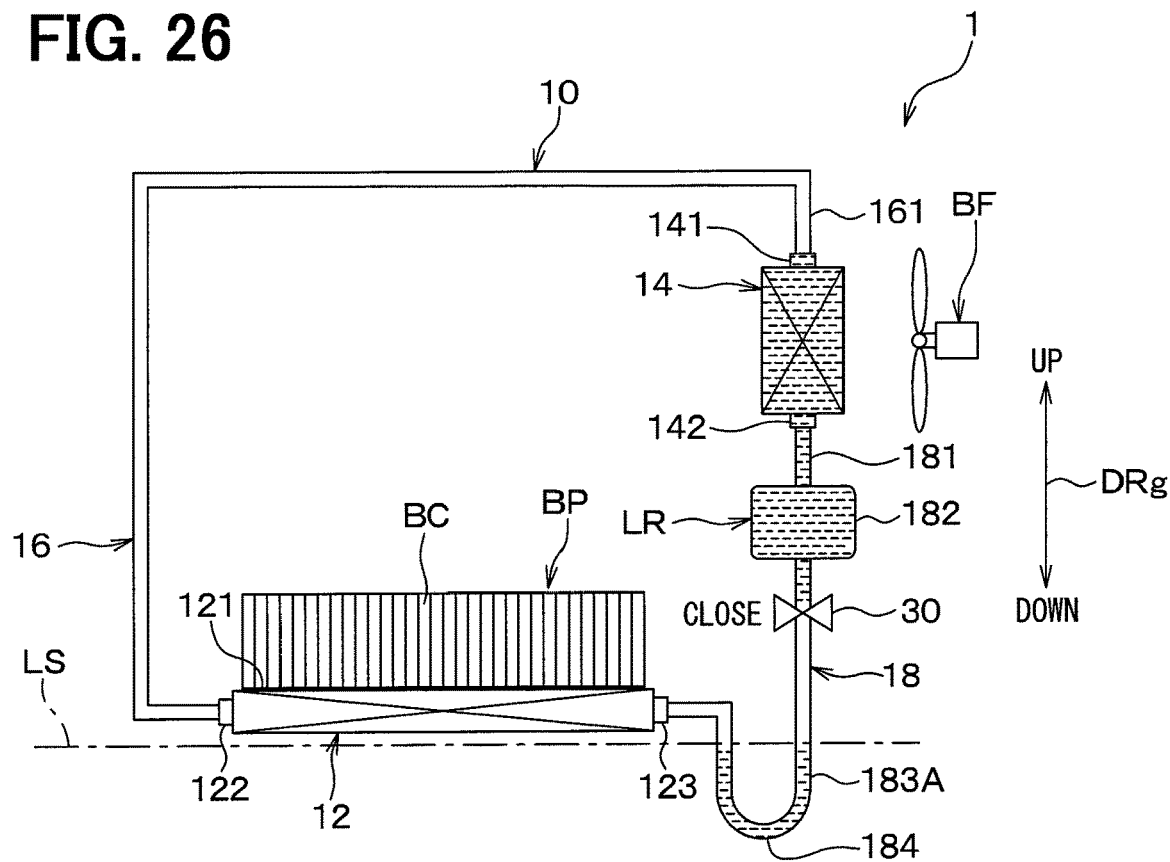
FIG. 26 is a diagram to illustrate an operation at the time of an excessive cooling prevention mode of the device temperature regulator of the fourth embodiment.

For this reason, in the device temperature regulator 1, as shown in FIG. 26, the liquid working fluid condensed in the condenser 14 is stored in the liquid reservoir LR configured of the internal space of the condenser 14 and the internal space of the middle liquid passage part 181 including the expansion part 182.

Here, the present embodiment is configured such that a portion of the liquid passage part 18 is located on the lower side of the device heat exchanger 12. For this reason, at the time of the excessive cooling prevention mode, the liquid working fluid collecting in the device heat exchanger 12 is stored also in a portion located on the lower side of the device heat exchanger 12.

In this way, the liquid working fluid collecting in the device heat exchanger 12 is decreased. Thus, in the device heat exchanger 12, the liquid surface LS of the working fluid goes down to the lower side of the device proximity part 121. In other words, in the device heat exchanger 12, the liquid surface is formed in a state where the gaseous working fluid is located on the lower side of a portion to exchange heat with the battery pack BP.

The device temperature regulator 1 of the present embodiment described above can produce the same operations and effects produced by the configuration common to the first embodiment as is the case with the first embodiment. In particular, the present embodiment is configured such that the portion of the liquid passage part 18 is located on the lower side of the device heat exchanger 12. According to this, at the time of the cooling mode, the working fluid can be suitably circulated in the device fluid circuit 10.

Further, when the condition for keeping the battery pack BP warm is satisfied, the liquid working fluid collecting in the device heat exchanger 12 is stored in a portion located on the lower side of the device heat exchanger 12 of the liquid passage part 18. According to this, the internal volume of the liquid reservoir LR, which is configured of the internal space of the condenser 14 and the internal space of the middle liquid passage part 181 including the expansion part 182, can be reduced in size.

Fifth Embodiment

Next, a fifth embodiment will be described with reference to FIG. 27 to FIG. 32. The present embodiment is configured such that a device heat exchanger 12 is arranged at a position opposite to a side surface portion of the battery pack BP, which is different from the first embodiment. In the present embodiment, parts different from the first embodiment will be mainly described.

Figure 27:
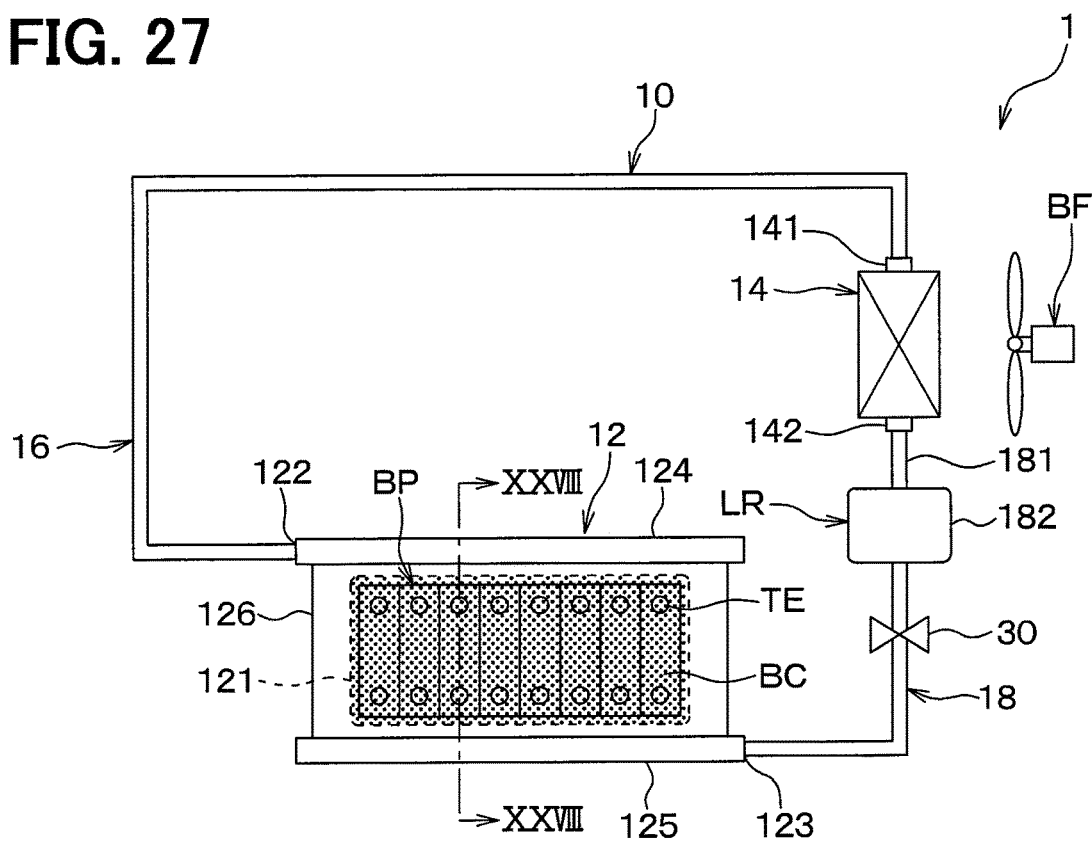
FIG. 27 is a schematic diagram of a device temperature regulator of a fifth embodiment.
Figure 28:
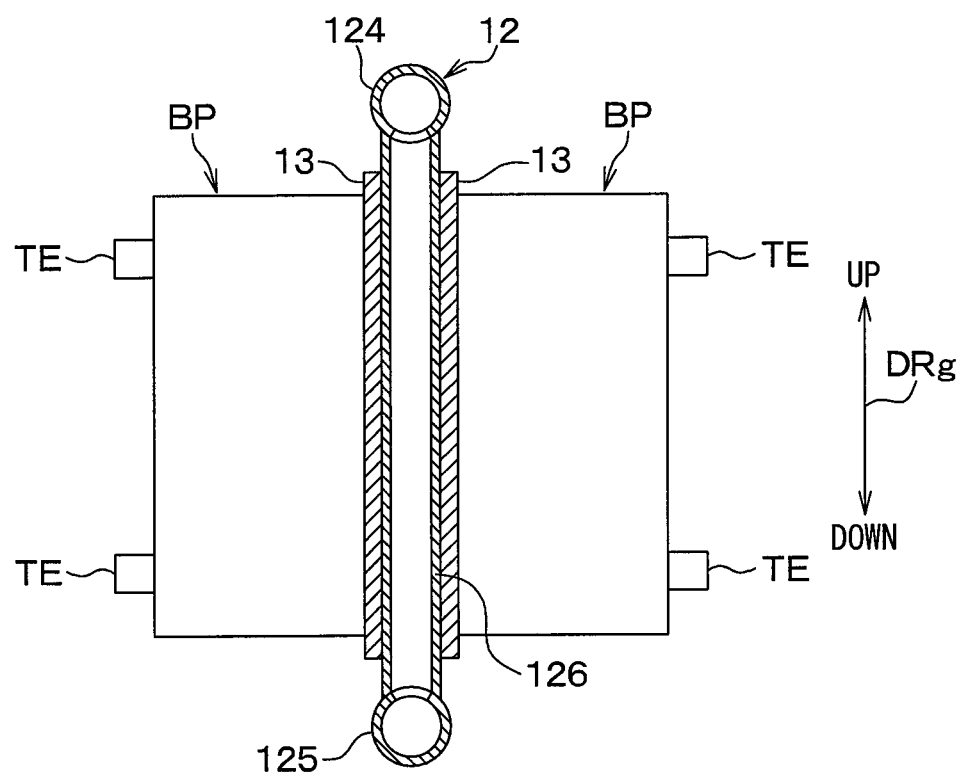
FIG. 28 is a cross-sectional view taken on a line XVIII-XXVIII in FIG. 27.

As shown in FIG. 27 and FIG. 28, the device heat exchanger 12 of the present embodiment is configured so as to include a cylindrical upper tank 124, a cylindrical lower tank 125, and a plurality of tubes 126 for causing the upper tank 124 to communicate with the lower tank 125. The device heat exchanger 12 may be configured such that the upper tank 124 communicates with the lower tank 125 by a hollow member having a plurality of flow passages formed on the inside thereof in place of the plurality of tubes 126.

The respective members configuring the device heat exchanger 12 are configured of metal having an excellent thermal conductivity, for example, aluminum and copper. The respective members configuring the device heat exchanger 12 may be configured of a material other than the metal and having an excellent thermal conductivity.

The upper tank 124 is located on an upper portion in the vertical direction DRg of the device heat exchanger 12. The upper tank 124 is provided with a gas outlet part 122, to which an end portion on a lower side of the gas passage part 16 is connected, on one side in a longitudinal direction. The gas outlet part 122 configures a gas-side connection part to which the gas passage part 16 in the device heat exchanger 12 is connected.

The lower tank 125 is located on a lower portion in the vertical direction DRg of the device heat exchanger 12. The lower tank 125 is provided with a liquid inlet part 123, to which an end portion on a lower side of the liquid passage part 18 is connected, on one side in the longitudinal direction. The liquid inlet part 123 configures a liquid-side connection part to which the liquid passage part 18 in the device heat exchanger 12 is connected.

The battery pack BP is located on the outside of the device heat exchanger 12 via a thermal conductive sheet 13 having an electric insulation. In the device heat exchanger 12, by the thermal conductive sheet 13, the electric insulation to the battery pack BP is ensured and a thermal resistance to the battery pack BP is reduced.

The device heat exchanger 12 is arranged so as to be opposed to the battery pack BP in a direction orthogonal to the vertical direction DRg. In the device heat exchanger 12 of the present embodiment, a part opposed to the battery pack BP in the direction orthogonal to the vertical direction DRg configures a part (that is, the device proximity part 121) which exchanges heat with the battery pack BP. The device proximity part 121 is a heat transfer part which transfers heat between the battery pack BP and the device heat exchanger 12. The device proximity part 121 has a size large enough to cover the entire side surface part of the battery pack BP so as not to cause a temperature distribution on the respective battery cells BC configuring the battery pack BP. The device proximity part 121 of the present embodiment extends along the vertical direction DRg.

In the battery pack BP of the present embodiment, a surface opposite to a surface having a terminal TE located thereon is set so as to be opposed to the device proximity part 121 of the device heat exchanger 12 via the thermal conductive sheet 13. The respective battery cells BC configuring the battery pack BP are located in a direction crossing the vertical direction DRg.

In the device temperature regulator 1 of the present embodiment, the liquid passage part 18 is provided with the liquid passage opening/closing valve 30. When the condition for keeping the battery pack BP warm is satisfied, the liquid passage opening/closing valve 30 reduces the supply amount of the working fluid to the device heat exchanger 12 such that the liquid working fluid forms a liquid surface in a state where the gaseous working fluid is located on the lower side of a portion, which exchanges heat with the battery pack BP, of the device heat exchanger 12. The liquid passage opening/closing valve 30 functions as the supply amount regulator which increases or decreases the supply amount of the liquid working fluid to the device heat exchanger 12, as is the case with the first embodiment.

In the device fluid circuit 10 of the present embodiment, when the liquid passage part 18 is closed by the liquid passage opening/closing valve 30, the internal space of the condenser 14 and the internal space of the middle liquid passage part 181 including the expansion part 182 function as the liquid reservoir LR for storing the liquid working fluid.

Figure 29:
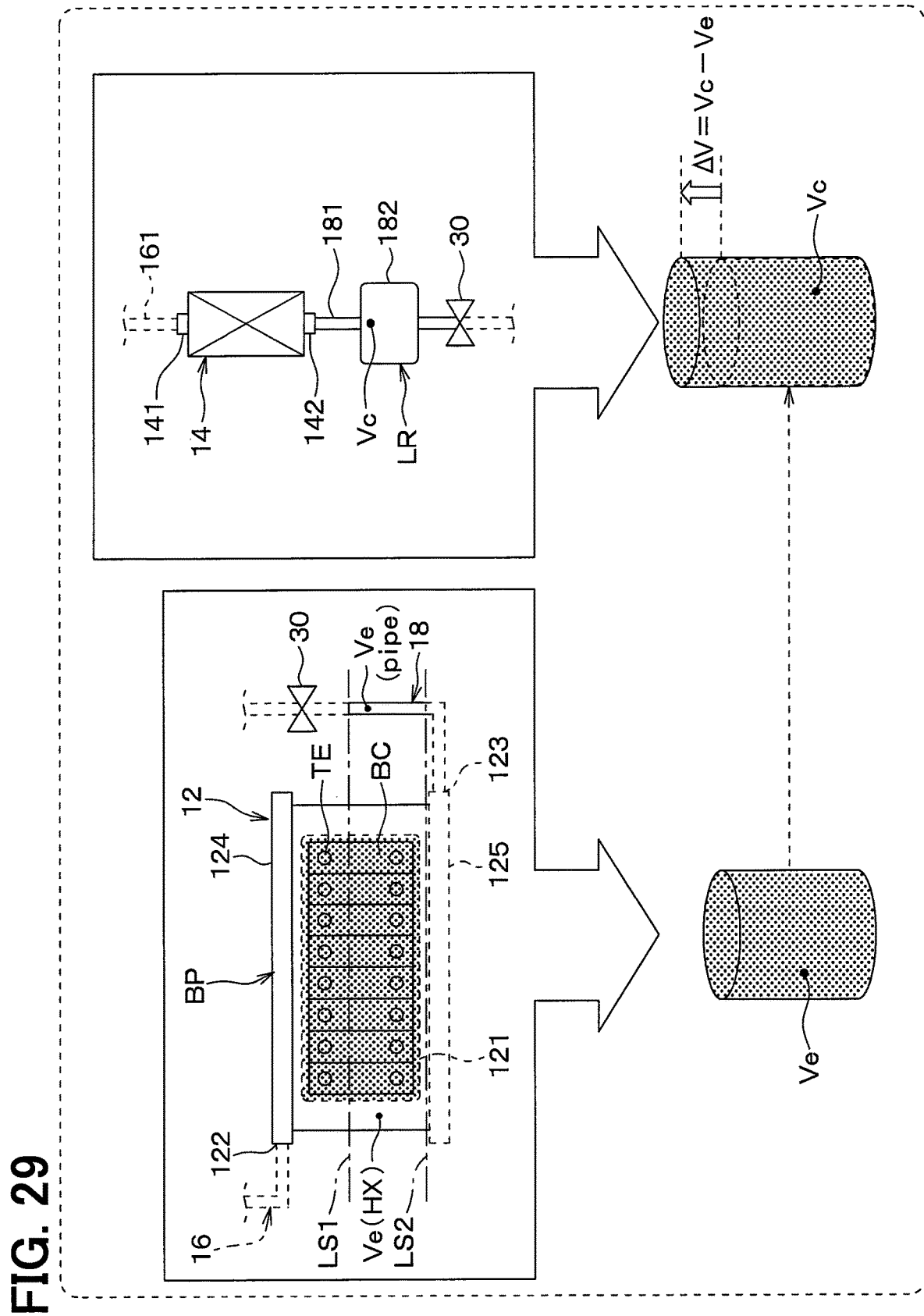
FIG. 29 is a diagram to illustrate an internal volume of a liquid reservoir of the fifth embodiment.

The liquid reservoir LR of the present embodiment has a volume which prevents the liquid working fluid from overflowing even if the liquid surface of the working fluid in the device heat exchanger 12 goes down to a lower end position of the device proximity part 121 of the portion which exchanges heat with the battery pack BP For example, it is assumed that, as shown in FIG. 29, the device temperature regulator 1 is configured such that the liquid surface LS of the working fluid at the time of the cooling mode is located at a nearly central portion of the device heat exchanger 12. In this case, the liquid reservoir LR has its internal volume Vc set such that the liquid surface LS2 of the working fluid at the time of the excessive cooling prevention mode can be caused to go down to a lower end position of the device proximity part 121. Specifically, the internal volume Vc of the liquid reservoir LR becomes larger than the sum total value Ve of an internal volume Ve (HX) of the device heat exchanger 12 between a position of the liquid surface LS1 of the working fluid at the time of the cooling mode and the lower end position of the device proximity part 121 and an internal volume Ve (pipe) of the liquid passage part 18.

Next, an operation of the device temperature regulator 1 of the present embodiment will be described with reference to FIG. 30 to FIG. 32. In the device temperature regulator 1 of the present embodiment, as shown in FIG. 30, the blower fan BF is operated at the time of the cooling mode in a state where the liquid passage opening/closing valve 30 is opened.

Figure 30:
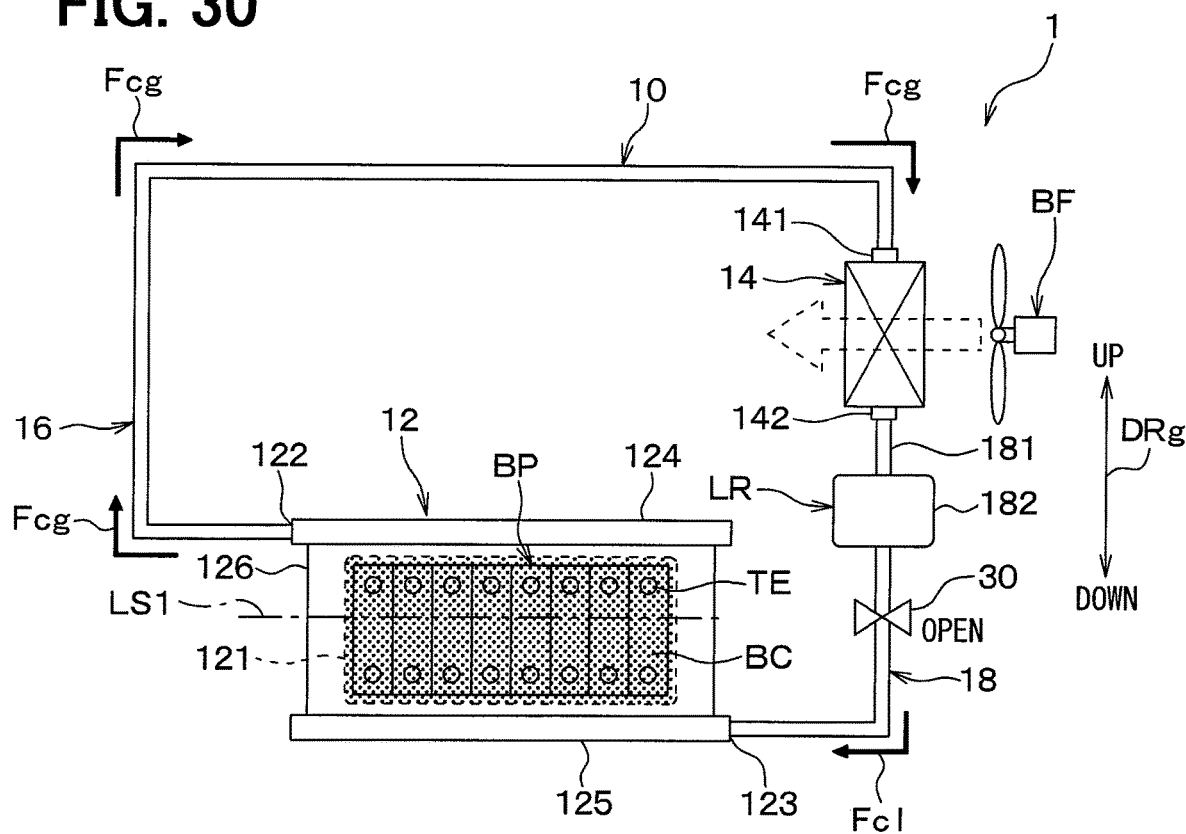
FIG. 30 is a diagram to illustrate an operation at the time of a cooling mode of the device temperature regulator of the fifth embodiment.

In this way, in the device temperature regulator 1, as shown in FIG. 30, the working fluid is circulated between the device heat exchanger 12 and the condenser 14 while the working fluid is changing the phase between the gas phase and the liquid phase and hence heat is transported from the device heat exchanger 12 to the condenser 14, and thereby the battery pack BP is cooled.

Further, when the condition for keeping the battery pack BP warm is satisfied, the device temperature regulator 1 of the present embodiment is shifted to the excessive cooling prevention mode. In the device temperature regulator 1 of the present embodiment, at the time of the excessive cooling prevention mode, the liquid passage part 18 is closed by the liquid passage opening/closing valve 30 in a state where the operation of the blower fan BF is stopped. In other words, in the device temperature regulator 1 of the present embodiment, at the time of the excessive cooling prevention mode, the supply of the liquid working fluid to the device heat exchanger 12 is stopped.

In the device temperature regulator 1, even if the supply of the liquid working fluid to the device heat exchanger 12 is stopped, when the temperature of the working fluid collecting in the condenser 14 is higher than the battery temperature Tb of the battery pack BP, the gaseous working fluid is condensed in the condenser 14.

Figure 31:
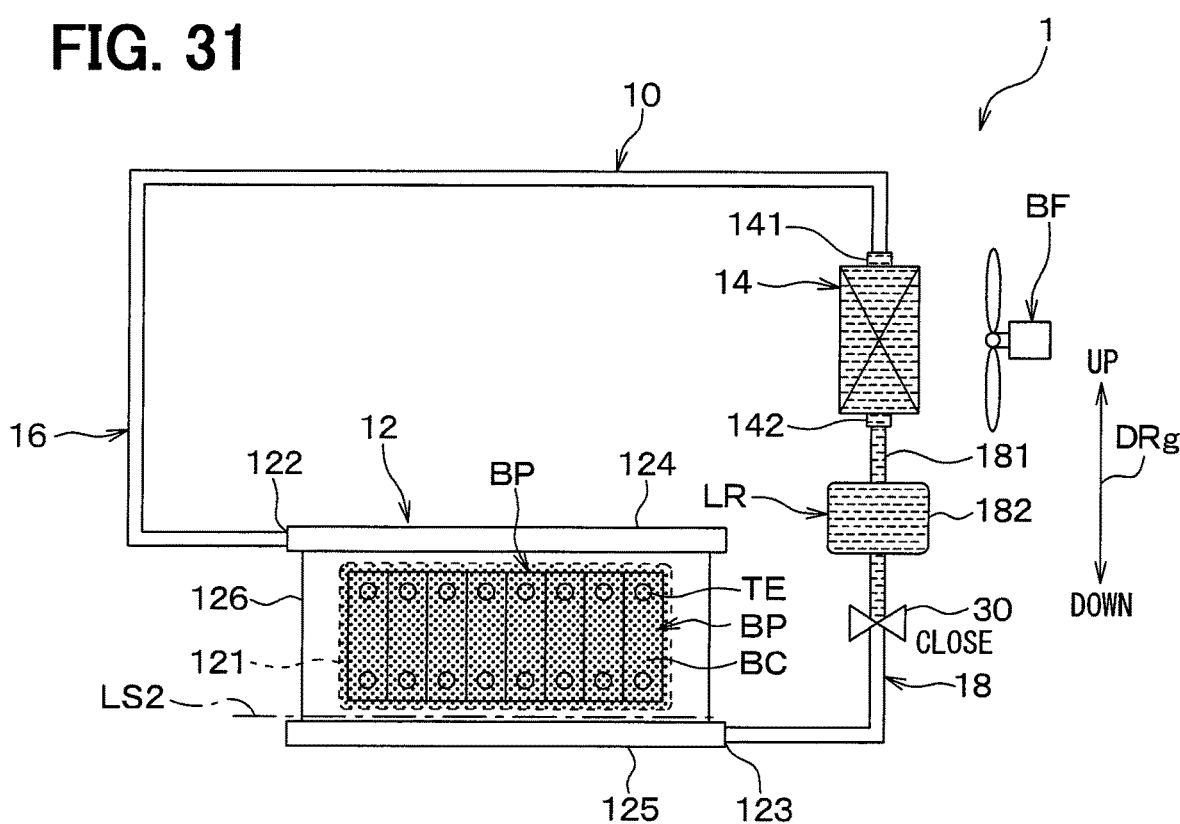
FIG. 31 is a diagram to illustrate an operation at the time of an excessive cooling prevention mode of the device temperature regulator of the fifth embodiment.

For this reason, in the device temperature regulator 1, as shown in FIG. 31, the liquid working fluid condensed in the condenser 14 is stored in the liquid reservoir LR configured of the internal space of the condenser 14 and the internal space of the middle liquid passage part 181 including the expansion part 182.

In this way, the liquid working fluid collecting in the device heat exchanger 12 is decreased and hence the liquid surface LS2 of the working fluid is caused to go down to the lower side of the device proximity part 121 in the device heat exchanger 12. In other words, in the device heat exchanger 12, the liquid surface is formed in a state where the gaseous working fluid is located on the lower side of the portion to exchange heat with the battery pack BP.

Figure 32:
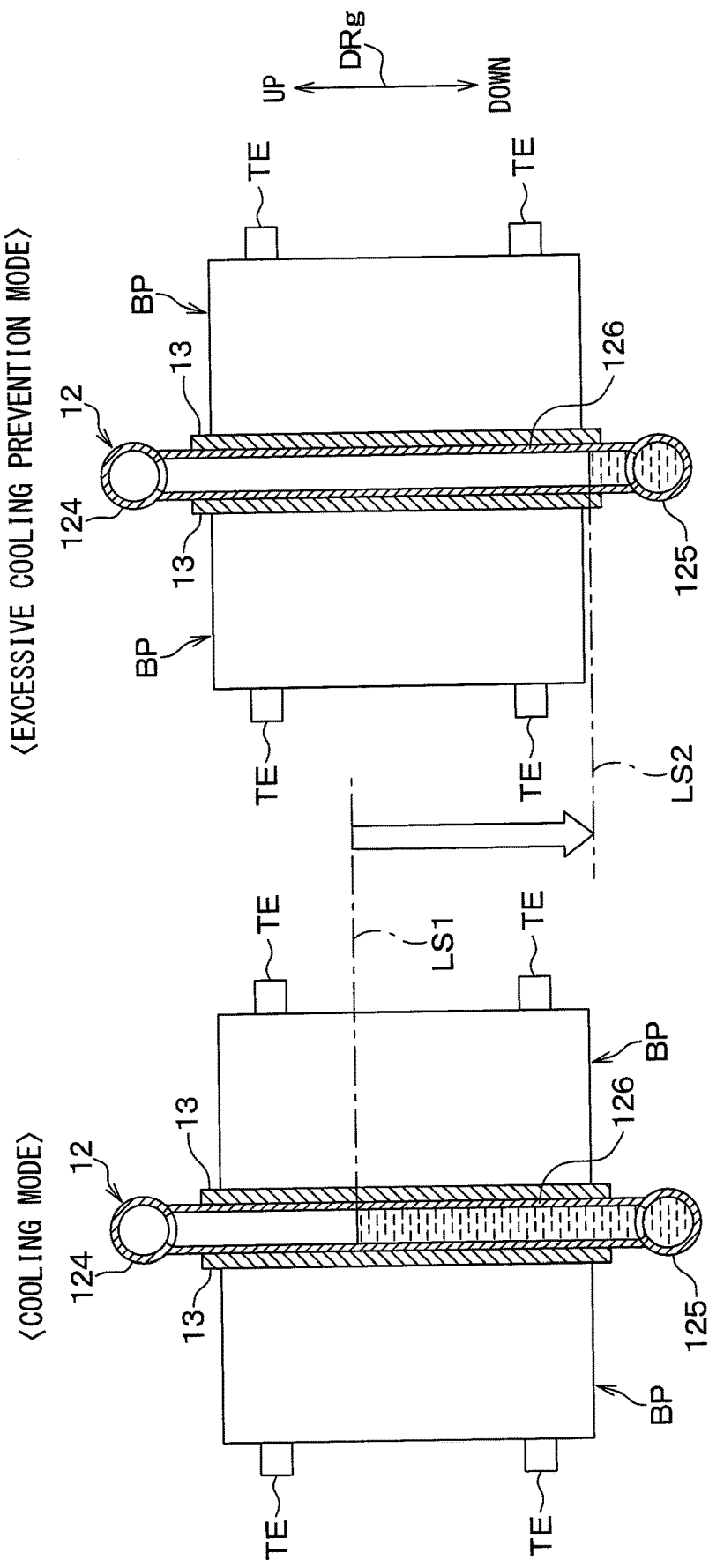
FIG. 32 is a diagram to illustrate a change in a liquid surface in a device heat exchanger at the time of the cooling

In the device temperature regulator 1 of the present embodiment described above, when the condition for keeping the battery pack BP warm is satisfied, as shown in FIG. 32, the liquid surface LS2 is formed in a state where the gaseous working fluid is located on the lower side of the portion, which exchanges heat with the battery pack BP, of the device heat exchanger 12. For this reason, in the device temperature regulator 1 of the present embodiment described above, a heat absorption from the battery pack BP by the evaporation of the working fluid of the device heat exchanger 12 is suppressed, which hence can sufficiently suppress the battery pack BP from being excessively cooled. As a result, in the device temperature regulator 1 of the present embodiment described above, it is possible to avoid the input characteristics from being impaired by an increase in an internal resistance caused by suppressing a chemical change in the battery pack BP.

Here, in the present embodiment, an example in which the expansion part 182 is provided in the middle liquid passage part 181 of the liquid passage part 18 has been described, but the present disclosure is not limited to this. The device temperature regulator 1 of the present embodiment can also be applied to a device temperature regulator in which the expansion part 182 is not provided in the middle liquid passage part 181 of the liquid passage part 18 as is the case with the second embodiment.

Sixth Embodiment

Next, a sixth embodiment will be described with reference to FIG. 33 to FIG. 35. A device temperature regulator 1 of the present embodiment is different from the first embodiment in that the liquid passage part 18 is provided with a portion located on a lower side of the device heat exchanger 12. In the present embodiment, parts different from the fifth embodiment will be mainly described.

Figure 33:
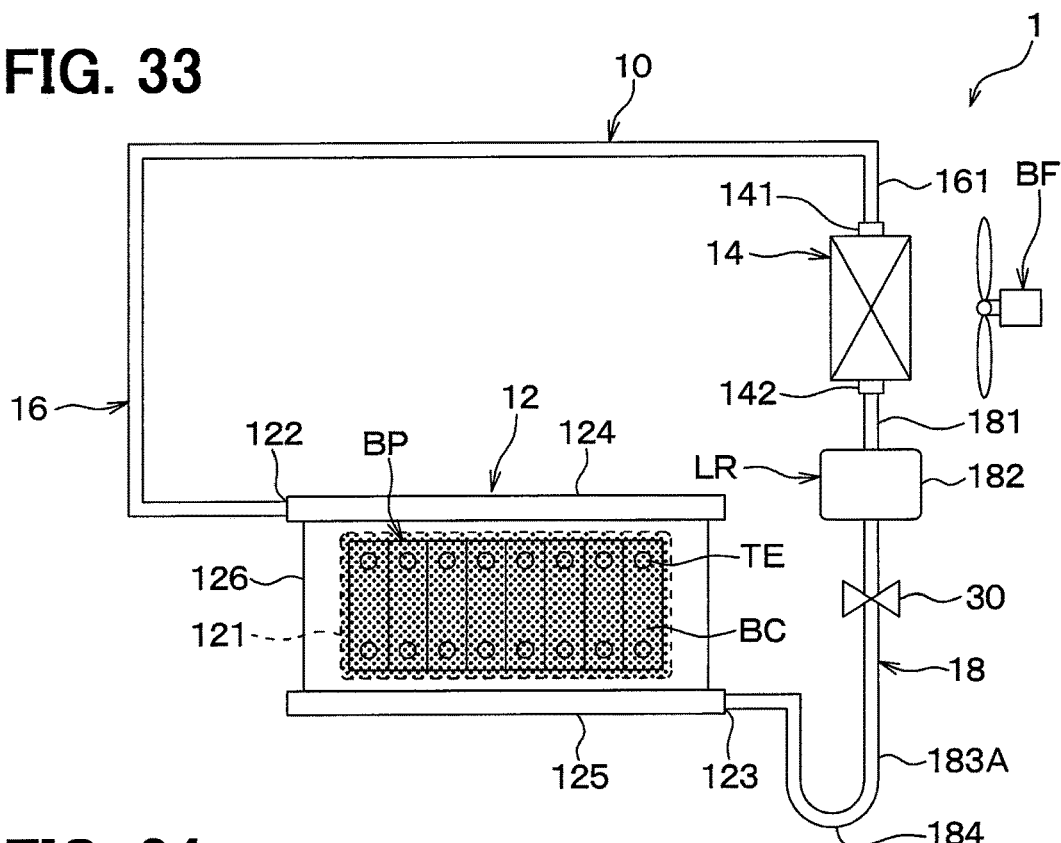
FIG. 33 is a schematic diagram of a device temperature regulator of a sixth embodiment.
Figure 34:
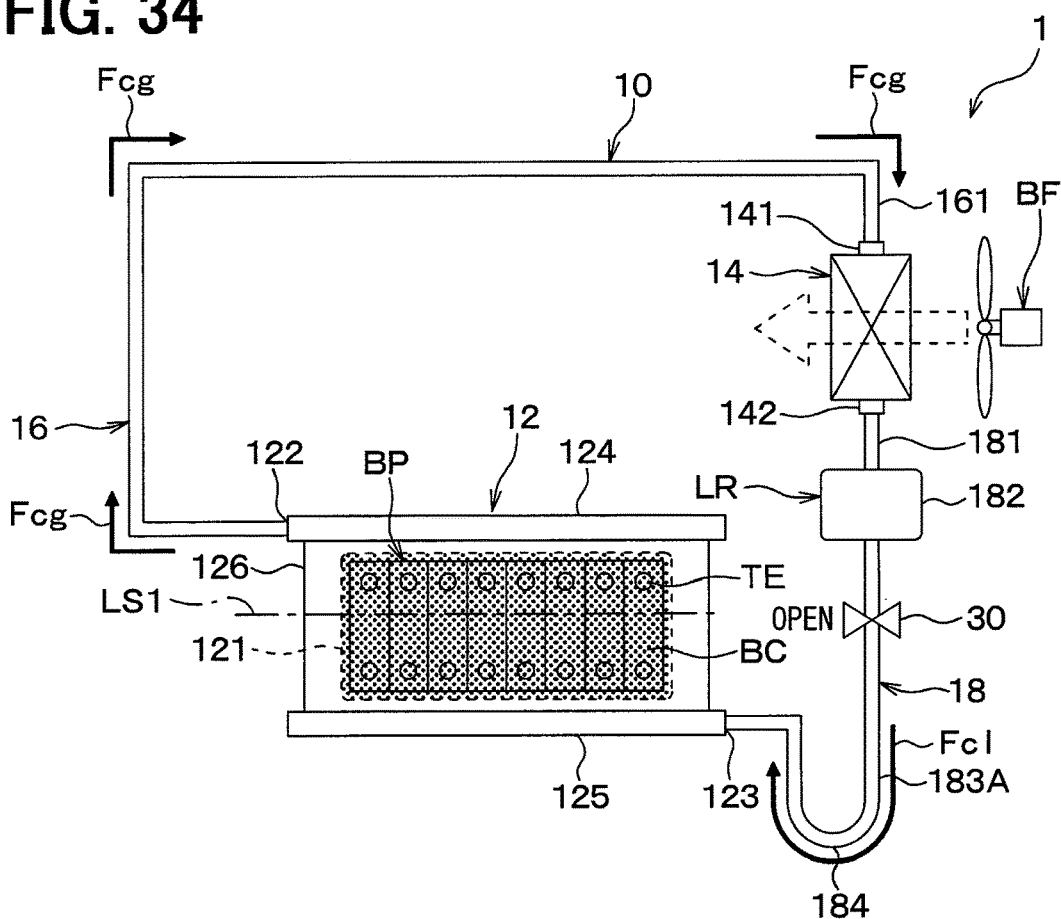
FIG. 34 is a diagram to illustrate an operation at the time of a cooling mode of the device temperature regulator of the sixth embodiment.

As shown in FIG. 33, the liquid passage part 18 is configured so as to include a lower-side liquid passage part 183A located on a lower side of a portion located uppermost of the device heat exchanger 12. The lower-side liquid passage part 183A is configured such that a lowermost part 184 located lowermost is lower than the liquid inlet part 123 of the device heat exchanger 12.

Specifically, the lower-side liquid passage part 183A of the present embodiment is configured so as to include a portion which is projected to a lower side of the liquid inlet part 123 of the device heat exchanger 12 and which is shaped like a letter U. As to the lower-side liquid passage part 183A, if the lowest part 184 is configured so as to be lower than the liquid inlet part 123 of the device heat exchanger 12, the lowest part 184 may be configured so as not to include the portion which is shaped like the letter U.

Next, an operation of the device temperature regulator 1 of the present embodiment will be described with reference to FIG. 34 and FIG. 35. In the device temperature regulator 1 of the present embodiment, as shown in FIG. 34, at the time of the cooling mode, the blower fan BF is operated in a state where the liquid passage opening/closing valve 30 is opened.

In this way, in the device temperature regulator 1, as shown in FIG. 30, the working fluid is circulated between the device heat exchanger 12 and the condenser 14 while the working fluid is changing the phase between the gas phase and the liquid phase and hence heat is transported from the device heat exchanger 12 to the condenser 14, and thereby the battery pack BP is cooled.

Here, at the time of the cooling mode, a portion of the gaseous working fluid evaporated in the device heat exchanger 12 flows out of the liquid inlet part 123 of the device heat exchanger 12 to the liquid passage part 18 in some cases. When the gaseous working fluid flowing out to the liquid passage part 18 flows into the condenser 14, the circulation of the working fluid in the device fluid circuit 10 is suppressed.

In contrast to this, in the present embodiment, a portion of the liquid passage part 18 is configured so as to be located on the lower side of the device heat exchanger 12 and hence the gaseous working fluid does not easily flow into the condenser 14 via the liquid passage part 18. In this way, the device temperature regulator 1 of the present embodiment can suitably circulate the working fluid in the device fluid circuit 10.

Further, when the condition for keeping the battery pack BP warm is satisfied, the device temperature regulator 1 of the present embodiment is shifted to the excessive cooling prevention mode. In the device temperature regulator 1 of the present embodiment, at the time of the excessive cooling prevention mode, the liquid passage part 18 is closed by the liquid passage opening/closing valve 30 in a state where the operation of the blower fan BF is stopped. In other words, in the device temperature regulator 1 of the present embodiment, at the time of the excessive cooling prevention mode, the supply of the liquid working fluid to the device heat exchanger 12 is stopped.

In the device temperature regulator 1, even if the supply of the liquid working fluid to the device heat exchanger 12 is stopped, when the temperature of the working fluid collecting in the condenser 14 is higher than the battery temperature Tb of the battery pack BP, the gaseous working fluid is condensed in the condenser 14.

Figure 35:
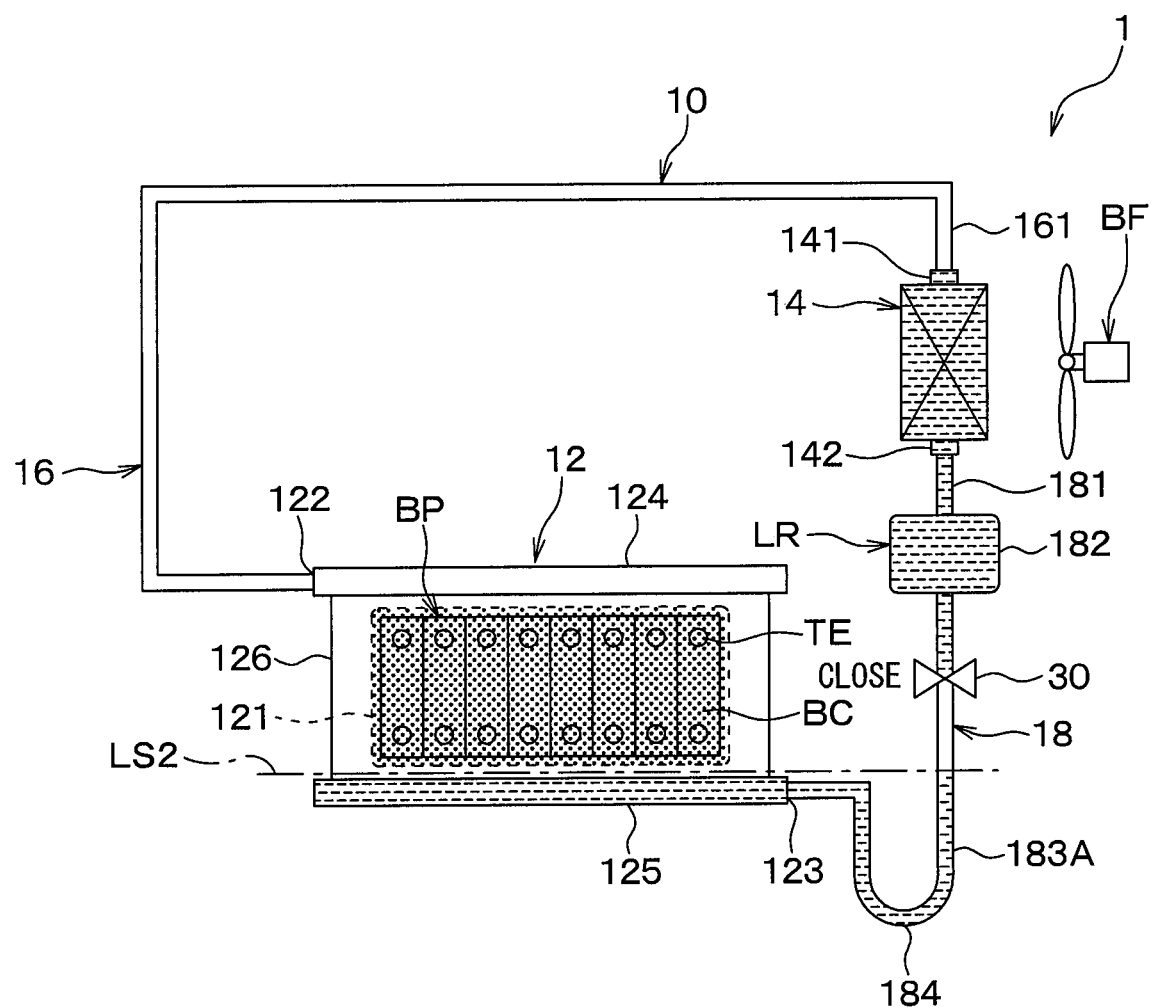
FIG. 35 is a diagram to illustrate an operation at the time of an excessive cooling prevention mode of the device temperature regulator of the sixth embodiment.

For this reason, in the device temperature regulator 1, as shown in FIG. 35, the liquid working fluid condensed in the condenser 14 is stored in the liquid reservoir LR configured of the internal space of the condenser 14 and the internal space of the middle liquid passage part 181 including the expansion part 182.

Here, the present embodiment is configured such that a portion of the liquid passage part 18 is configured so as to be located on the lower side of the device heat exchanger 12. For this reason, at the time of the excessive cooling prevention mode, the liquid working fluid collecting in the device heat exchanger 12 is stored also in a portion located on the lower side of the device heat exchanger 12 of the liquid passage part 18.

In this way, the liquid working fluid collecting in the device heat exchanger 12 is decreased and hence the liquid surface LS of the working fluid is caused to go down to the lower side of the device proximity part 121 in the device heat exchanger 12. In other words, in the device heat exchanger 12, the liquid surface LS is formed in a state where the gaseous working fluid is located on the lower side of a portion to exchange heat with the battery pack BP.

The device temperature regulator 1 of the present embodiment described above can produce the operations and effects produced by the configuration common to the fifth embodiment as is the case with the fifth embodiment. In particular, in the present embodiment, a portion of the liquid passage part 18 is configured so as to be located on the lower side of the device heat exchanger 12. In this way, at the time of the cooling mode, the working fluid can be suitably circulated in the device fluid circuit 10.

Further, when the condition for keeping the battery pack BP warm is satisfied, the liquid working fluid collecting in the device heat exchanger 12 is stored in the portion located on the lower side of the device heat exchanger 12 of the liquid passage part 18. In this way, the internal volume of the liquid reservoir LR, which is configured of the internal space of the condenser 14 and the internal space of the middle liquid passage part 181 including the expansion part 182, can be reduced.

Other Embodiments

Up to this point, typical embodiments of the present disclosure have been described, and the present disclosure is not limited to the embodiments described above but, for example, can be variously modified below.

In the respective embodiments described above, the examples in which the liquid passage opening/closing valve 30 is caused to function as the supply amount regulator have been described, but the present disclosure is not limited to this. If the supply amount regulator is configured so as to be able to reduce the supply amount of the liquid working fluid to the device heat exchanger 12 when the condition for eliminating the need for regulating the temperature regulation of the battery pack BP (that is, the condition for keeping the battery pack BP warm) is satisfied, the supply amount regulator may be configured of, for example, a flow rate regulation valve which does not have a fully closing function.

In the respective embodiments described above, the examples in which the liquid passage opening/closing valve 30 is configured of the electromagnetic valve have been described, but the liquid passage opening/closing valve 30 may be configured of, for example, a mechanical valve having a valve mechanism which is operated without being energized.

As described above, it is preferred that the internal volume of the liquid reservoir LR is larger than the internal volume of the device heat exchanger 12, but the present disclosure is not limited to this. If the liquid reservoir LR has a volume which prevents the liquid working fluid from overflowing when the liquid surface of the working fluid in the device heat exchanger 12 goes down to the lower side of the device proximity part 121, the volume of the liquid reservoir LR may be a volume smaller than the internal volume of the device heat exchanger 12.

In the first to the fourth embodiments described above, the examples in which the device heat exchanger 12 is arranged at the position opposed to the bottom surface portion of the battery pack BP have been described, but the present disclosure is not limited to this. The device temperature regulator 1 is configured, for example, such that the device heat exchanger 12 is arranged at a position opposed to a side surface portion of the battery pack BP. In this case, in the device heat exchanger 12, there is a possibility that as far as the working fluid collects in the device heat exchanger 12, the liquid surface LS of the working fluid will not go down to a lower side of the device proximity part 121. For this reason, in the configuration in which the device heat exchanger 12 is arranged at the position opposed to the side surface portion of the battery pack BP, at the time of the excessive cooling prevention mode, it is preferred that the sum total amount of the liquid working fluid collecting in the device heat exchanger 12 is transferred to the liquid reservoir LR.

In the respective embodiments described above, the examples in which the gas outlet part 122 and the liquid inlet part 123 of the device heat exchanger 12 are provided on the side surface portions opposed to each other have been described, but the present disclosure is not limited to this. The gas outlet part 122 and the liquid inlet part 123 may be provided, for example, on an upper surface part of the device heat exchanger 12.

Further, the gas outlet part 122 and the liquid inlet part 123 of the device heat exchanger 12 may be different from each other in a height in the vertical direction DRg. In this case, it is preferred that the gas outlet part 122 is provided at a position higher than the liquid inlet part 123.

In the respective embodiments described above, the examples in which the temperature of the single battery pack BP is regulated by the device temperature regulator 1 have been described, but the present disclosure is not limited to this. The device temperature regulator 1 can regulate the temperatures of a plurality of devices.

In the respective embodiments described above, the condition which is satisfied when the battery temperature Tb of the battery pack BP is lower than the predetermined allowable lower limit temperature Tbmin is employed as the condition for eliminating the need for regulating the temperature regulation of the battery pack BP, but the present disclosure is not limited to this. The condition for eliminating the need for regulating the temperature regulation of the battery pack BP (that is, the condition for keeping the battery pack BP warm) may be a condition which is satisfied when an ambient temperature around the battery pack BP becomes a specified temperature or less.

In the respective embodiments described above, the examples in which the device temperature regulator 1 of the present disclosure is applied to a device for regulating the battery temperature Tb of the battery pack BP mounted on the vehicle have been described, but the present disclosure is not limited to this. In other words, the device temperature regulator 1 of the present disclosure can be widely applied not only to the battery pack BP but also to a device for regulating a temperature of the other instrument.

In the embodiments described above, needless to say, elements configuring the embodiments are not necessarily essential except where the elements are specified to be especially essential and except where the elements are clearly essential in principle.

In the embodiments described above, in a case where numerical values such as a number, a numerical value, an amount, and a range of the constituent element of the embodiment are referred to, except where the numerical values are specified to be especially essential or except where the numerical values are clearly limited to the specified numbers in principle, the numerical values are not limited to the specified numerical values.

In the embodiments described above, when a shape and a position relation of the constituent element or the like are referred to, except where the shape and the position relation are specified to be especially essential or except where the shape and the position relation are limited to a specified shape and a specified position relation in principle, the shape and the position relation are not limited to the specified shape and the specified position relation.

According to a first aspect shown in a part or all of the embodiments described above, the device temperature regulator is provided with the supply amount regulator for increasing or decreasing the supply amount of the liquid working fluid to the device heat exchanger. Then, when the condition for keeping the temperature regulation target device warm is satisfied, the supply amount regulator decreases the supply amount of the liquid working fluid to the device heat exchanger such that the liquid working fluid forms the liquid surface in a state where the gaseous working fluid is located on the lower side of the portion to exchange heat with the temperature regulation target device of the device heat exchanger.

Accordingly, when the temperature keeping condition for keeping the temperature regulation target device is satisfied, the liquid surface is formed in the state where the gaseous working fluid is positioned at the lower side of the heat exchanging portion of the device heat exchanger, exchanging heat with the temperature regulation target device. The temperature regulation target device is proximate to a portion in which the gaseous working fluid collects in the device heat exchanger. For this reason, in the device temperature regulator of the present disclosure, when the temperature regulation of the temperature regulation target device becomes unnecessary, the heat absorption from the temperature regulation target device by the evaporation of the liquid working fluid in the device heat exchanger is suppressed. As a result, it can sufficiently suppress the temperature regulation target device from being excessively cooled.

Further, according to a second aspect, in the device temperature regulator, the supply amount regulator is configured of the liquid passage opening/closing valve for opening or closing the liquid passage part. Further, the device heat exchanger, the condenser, the gas passage part, and the liquid passage part configure the device fluid circuit of the circular circuit. Then, the liquid passage opening/closing valve is configured so as to close the liquid passage part such that when the condition for keeping the temperature regulation target device warm is satisfied, a portion of a part, which is located on the upper side of the liquid passage opening/closing valve in the liquid fluid circuit, functions as the liquid reservoir for storing the liquid working fluid.

According to this, when the condition for keeping the temperature regulation target device warm is satisfied, the liquid working fluid collecting in the device heat exchanger can be decreased by increasing the amount of the liquid working fluid stored in the liquid reservoir.

Further, according to a third aspect, in the condenser of the device temperature regulator, the gas inlet part connected to the gas passage part is arranged on the upper side of the liquid outlet part connected to the liquid passage part such that when the condition for keeping the temperature regulation target device warm is satisfied, the liquid working fluid can be stored. Then, the liquid reservoir is configured so as to include the condenser.

According to this, when the condition for keeping the temperature regulation target device warm is satisfied, the condenser can be caused to function as the liquid reservoir and hence the internal volume for storing the liquid working fluid can be sufficiently ensured without adding a part.

Further, according to a fourth aspect, the liquid passage part of the device temperature regulator is provided, on the upper side of the supply amount regulator, with the expansion part in which the passage cross-sectional area is expanded as compared with a portion on the lower side of the supply amount regulator. Then, the liquid reservoir is configured so as to include the expansion part.

In this way, if the liquid reservoir is configured so as to include the expansion part in which the passage cross-sectional area is expanded in the liquid passage part, the internal volume for storing the liquid working fluid can be sufficiently ensured by a small number of parts.

Further, according to a fifth aspect, the liquid passage part of the device temperature regulator is configured so as to include the middle liquid passage part located between the condenser and the supply amount regulator. The middle liquid passage part is configured such that a portion close to the condenser is located on the upper side of a portion close to the supply amount regulator so as to able to store the liquid working fluid when the condition for keeping the temperature regulation target device warm is satisfied. Then, the liquid reservoir is configured so as to include the middle liquid passage part.

According to this, when the condition for eliminating the need for regulating the temperature of the temperature regulation target device is satisfied, the middle liquid passage part can be caused to function as the liquid reservoir. Thus, the internal volume for storing the liquid working fluid can be sufficiently ensured.

Further, according to a sixth aspect, the gas passage part of the device temperature regulator is configured so as to include the upper-side gas passage part which extends to the upper side from the gas inlet part of the condenser. Further, the upper-side gas passage part can store the liquid working fluid when the condition for keeping the temperature regulation target device warm is satisfied. Then, the liquid reservoir is configured so as to include the upper-side gas passage part.

According to this, when the condition for keeping the temperature regulation target device warm is satisfied, the upper-side gas passage part can be caused to function as the liquid reservoir. Thus, the internal volume for storing the liquid working fluid can be sufficiently ensured.

According to a seventh aspect, the internal volume of the liquid reservoir of the device temperature regulator is a volume which prevents the liquid working fluid from overflowing even if the condition for keeping the temperature regulation target device warm is satisfied and the liquid surface of the working fluid in the device heat exchanger goes down to the lower side of the portion to exchanger heat with the temperature regulation target device of the device heat exchanger.

According to this, even if the liquid surface of the working fluid in the device heat exchanger goes down to the lower side of the portion to exchanger heat with the temperature regulation target device of the device heat exchanger, the liquid working fluid does not flow out to the device heat exchanger from the liquid reservoir. For this reason, the device temperature regulator can keep a state where the liquid surface of the working fluid in the device heat exchanger goes down to the lower side of the portion to exchange heat with the temperature regulation target device of the device heat exchanger and hence can sufficiently suppress the heat absorption from the temperature regulation target device by the evaporation of the working fluid of the device heat exchanger.

Further, according to an eighth aspect, in the device temperature regulator, the internal volume of the liquid reservoir is larger than the internal volume of the device heat exchanger. According to this, when the condition for keeping the temperature regulation target device warm is satisfied, the liquid working fluid collecting in the device heat exchanger can be stored in the liquid reservoir, so that the heat absorption from the temperature regulation target device by the evaporation of the working fluid of the device heat exchanger can be sufficiently suppressed.

Further, according to a ninth aspect, in the device temperature regulator, the gas passage part is configured so as to include a portion located on the lower side of the portion located uppermost in the device heat exchanger, that is, the lower-side gas passage part. Further, in the device temperature regulator, the liquid passage part is configured so as to include a portion located on the lower side of the portion located uppermost in the device heat exchanger, that is, the lower-side liquid passage part. Then, the internal volume of the liquid reservoir is larger than the sum total of the internal volume of the device heat exchanger, the internal volume of the lower-side gas passage part, and the internal volume of the lower-side liquid passage part.

According to this, when the condition for keeping the temperature regulation target device warm is satisfied, not only the liquid working fluid in the device heat exchanger but also the liquid working fluid which collects in the lower-side gas passage part and in the lower-side liquid passage part and which may flow into the device heat exchanger can be stored in the liquid reservoir. For this reason, in the device temperature regulator of the present disclosure, the heat absorption from the temperature regulation target device by the evaporation of the working fluid of the device heat exchanger can be sufficiently suppressed.

Further, according to a tenth aspect, in the device temperature regulator, when an amount of liquid when the sum total amount of the working fluid filled in the device fluid circuit is liquefied is assumed to be the sum total liquid, the internal volume of the liquid reservoir is a volume capable of storing the sum total liquid.

According to this, the internal volume of the liquid reservoir is larger than the volume when all of the working fluid filled in the device fluid circuit is liquefied, so that in a case where the temperature regulation of the temperature regulation target device becomes unnecessary, it is possible to prevent the liquid working fluid from remaining in the device heat exchanger.

Further, according to an eleventh aspect, in the device temperature regulator, the condition for keeping the temperature regulation target device warm is the condition satisfied when the temperature of the temperature regulation target device becomes lower than the allowable lower limit temperature of the temperature regulation target device. In this way, if the device temperature regulator is configured so as to decrease the supply amount of the liquid working fluid to the device heat exchanger such that when the temperature of the temperature regulation target device becomes lower than the allowable lower limit temperature, the amount of the liquid working fluid stored in the liquid reservoir is increased, it is possible to suppress the temperature regulation target device from being excessively cooled.

Further, according to a twelfth aspect, the device temperature regulator is provided with the heat radiation amount regulator for regulating the heat radiation amount of the working fluid in the condenser and the control part for controlling the supply amount regulator and the heat radiation amount regulator. The control part is configured so as to control the supply amount regulator such that the supply amount of the liquid working fluid to the device heat exchanger is decreased and then so as to control the heat radiation amount regulator such that the heat radiation amount of the working fluid in the condenser is increased.

According to this, when the supply amount of the liquid working fluid to the device heat exchanger is decreased, the heat radiation amount of the working fluid in the condenser is increased, so that the liquid surface of the working fluid in the device heat exchanger can be early caused to go down to the lower side of the portion to exchange heat with the temperature regulation target device of the device heat exchanger.

In this way, it is possible to suppress the heat adsorption from the temperature regulation target device by the evaporation of the working fluid in the device heat exchanger and to sufficiently suppress the temperature regulation target device from being excessively cooled.

Further, according to a thirteenth aspect, in the device temperature regulator, the temperature regulation target device is configured of the battery pack mounted on the vehicle. According to this, it is possible to suppress the battery temperature of the battery pack from being excessively cooled and hence to suppress the input characteristics from being impaired by an increase in the internal resistance of the battery pack which is caused by suppressing a chemical change in the battery pack.

What is claimed is:

1. A device temperature regulator capable of regulating a temperature of at least one temperature regulation target device, the device temperature regulator comprising:
    a device heat exchanger configured to absorb heat from the temperature regulation target device and to evaporate a liquid working fluid;
    a condenser that is disposed above the device heat exchanger to condense a gaseous working fluid evaporated in the device heat exchanger;
    a gas passage part configured to guide the gaseous working fluid evaporated in the device heat exchanger to the condenser;
    a liquid passage part configured to guide the liquid working fluid condensed in the condenser to the device heat exchanger; and
    a supply amount regulator configured to increase or decrease a supply amount of the liquid working fluid to the device heat exchanger, wherein the supply amount regulator is configured to decrease the supply amount of the liquid working fluid supplied to the device heat exchanger, such that a liquid surface is formed in a state where the gaseous working fluid is positioned at a lower side lower than a heat exchanging portion exchanging heat with the temperature regulation target device in the device heat exchanger, when a condition for keeping the temperature regulation target device at a temperature is satisfied.

2. The device temperature regulator according to claim 1, wherein
    the supply amount regulator is a liquid passage opening/closing valve configured to open or close the liquid passage part,
    the device heat exchanger, the condenser, the gas passage part, and the liquid passage part are configured to be included in a device fluid circuit as a circular circuit, and
    the liquid passage opening/closing valve is configured to close the liquid passage part such that a part located on an upper side of the liquid passage opening/closing valve in the device fluid circuit functions as a liquid reservoir in which the liquid working fluid is stored, when a temperature keeping condition for keeping the temperature regulation target device at a temperature is satisfied.

3. The device temperature regulator according to claim 2, wherein
    the condenser has a liquid outlet connected to the liquid passage part, and a gas inlet connected to the gas passage part and located on an upper side of the liquid outlet to store the liquid working fluid in the condenser when the temperature keeping condition of the temperature regulation target device is satisfied, and
    the liquid reservoir is configured to include the condenser.

4. The device temperature regulator according to claim 2, wherein
    the liquid passage part is provided with an expansion part at an upper side of the supply amount regulator, the expansion part having a passage cross-sectional area enlarged as compared with a portion at a lower side of the supply amount regulator, and
    the liquid reservoir is configured to include the expansion part.

5. The device temperature regulator according to claim 2, wherein
    the liquid passage part includes a middle liquid passage located between the condenser and the supply amount regulator,
    the middle liquid passage is configured, such that a portion of the middle liquid passage, close to the condenser, is located on an upper side of a portion the middle liquid passage, close to the supply amount regulator, so as to store the liquid working fluid when the temperature keeping condition of the temperature regulation target device is satisfied, and
    wherein the liquid reservoir is configured to include the middle liquid passage part.

6. The device temperature regulator according to claim 2, wherein
    the gas passage part is configured to include an upper-side gas passage extending to an upper side from the gas inlet of the condenser,
    the upper-side gas passage part is configured to be capable of storing the liquid working fluid when the temperature keeping condition of the temperature regulation target device is satisfied, and
    the liquid reservoir is configured to include the upper-side gas passage part.

7. The device temperature regulator according to claim 2, wherein
    the liquid reservoir is configured to have an internal volume which prevents the liquid working fluid from overflowing, when the temperature keeping condition of the temperature regulation target device is satisfied, and when a liquid surface of the working fluid in the device heat exchanger goes down to a lower side of the heat exchanging portion exchanging heat with the temperature regulation target device in the device heat exchanger.

8. The device temperature regulator according to claim 2, wherein
    the internal volume of the liquid reservoir is larger than an internal volume of the device heat exchanger.

9. The device temperature regulator according to claim 2, wherein
    when a portion of the gas passage part, located lower than an uppermost position of the device heat exchanger, is assumed as a lower-side gas passage part and when a portion of the liquid passage part, located lower than the uppermost of the device heat exchanger is assumed as a lower-side liquid passage part, an internal volume of the liquid reservoir is larger than the sum total of an internal volume of the device heat exchanger, an internal volume of the lower-side gas passage part, and an internal volume of the lower-side liquid passage part.

10. The device temperature regulator according to claim 2, wherein
when a liquid amount in a case where all of the working fluid filled in the device fluid circuit is liquefied is assumed as a total liquid amount, an internal volume of the liquid reservoir is a volume capable of storing the total liquid amount.

11. The device temperature regulator according to claim 1, wherein
the temperature keeping condition of the temperature regulation target device is a condition satisfied when a temperature of the temperature regulation target device becomes lower than a predetermined allowable lower-limit temperature of the temperature regulation target device.

12. The device temperature regulator according to claim 1, further comprising:
a heat radiation amount regulator configured to regulate a heat radiation amount of the working fluid in the condenser; and
a controller configured to control the supply amount regulator and the heat radiation amount regulator,
wherein the controller controls the supply amount regulator such that a supply amount of the liquid working fluid to the device heat exchanger is decreased and then controls the heat radiation amount regulator such that a heat radiation amount of the working fluid in the condenser is increased.

13. The device temperature regulator according to claim 1, wherein
the temperature regulation target device is configured of a battery pack mounted on a vehicle.

14. A device temperature regulator for regulating a temperature of at least one temperature regulation target device, the device temperature regulator comprising:
a fluid circuit in which a working fluid circulates;
a heat exchanger disposed in the fluid circuit and having a heat exchanging portion configured to exchange heat with the temperature regulation target device and to evaporate a liquid working fluid;
a condenser disposed in the fluid circuit at a position above the heat exchanger to condense a gaseous working fluid evaporated in the heat exchanger;
a gas passage provided in the fluid circuit to guide the gaseous working fluid evaporated in the heat exchanger to the condenser;
a liquid passage provided in the fluid circuit to guide the liquid working fluid condensed in the condenser to the heat exchanger; and
a flow regulator configured to increase or decrease a supply amount of the liquid working fluid from the condenser to the device heat exchanger, wherein
the flow regulator is configured to decrease the supply amount of the liquid working fluid supplied to the device heat exchanger, such that a gaseous working fluid layer is positioned in the heat exchanger at a position lower than the heat exchanging portion of the heat exchanger, in a predetermined temperature condition of the device temperature regulator.

15. The device temperature regulator according to claim 14, wherein
the flow regulator is a liquid passage opening/closing valve configured to open or close the liquid passage, and
the liquid passage opening/closing valve is configured to close the liquid passage in the predetermined temperature condition of the device temperature regulator.

16. The device temperature regulator according to claim 15, further comprising
a liquid reservoir in which the liquid working fluid is stored, the liquid reservoir being located in the liquid passage at a downstream side of the condenser,
wherein the liquid passage opening/closing valve is located in the liquid passage between the liquid reservoir and the an inlet of the heat exchanger.

17. The device temperature regulator according to claim 14, further comprising
a liquid reservoir disposed in the condenser to store the liquid working fluid.

* * * * *